(12) United States Patent
Tsuchimura et al.

(10) Patent No.: US 9,400,430 B2
(45) Date of Patent: Jul. 26, 2016

(54) ACTINIC-RAY- OR RADIATION-SENSITIVE RESIN COMPOSITION, ACTINIC-RAY- OR RADIATION-SENSITIVE FILM, MASK BLANK AND METHOD OF FORMING PATTERN

(71) Applicant: FUJIFILM Corporation, Minato-ku, Tokyo (JP)

(72) Inventors: Tomotaka Tsuchimura, Shizuoka (JP); Hiroo Takizawa, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/274,009

(22) Filed: May 9, 2014

(65) Prior Publication Data

US 2014/0242502 A1 Aug. 28, 2014

Related U.S. Application Data

(63) Continuation of application No. PCT/JP2012/079585, filed on Nov. 8, 2012.

(30) Foreign Application Priority Data

Nov. 10, 2011 (JP) ................................. 2011-246742
May 30, 2012 (JP) ................................. 2012-123573

(51) Int. Cl.
| | | |
|---|---|---|
| G03F 7/038 | (2006.01) | |
| G03F 7/20 | (2006.01) | |
| C08F 12/22 | (2006.01) | |
| C08F 12/26 | (2006.01) | |
| C08F 212/14 | (2006.01) | |
| C08F 212/32 | (2006.01) | |
| G03F 1/24 | (2012.01) | |
| G03F 7/004 | (2006.01) | |

(52) U.S. Cl.
CPC .............. *G03F 7/2002* (2013.01); *C08F 12/22* (2013.01); *C08F 12/26* (2013.01); *C08F 212/14* (2013.01); *C08F 212/32* (2013.01); *G03F 1/24* (2013.01); *G03F 7/004* (2013.01); *G03F 7/0382* (2013.01)

(58) Field of Classification Search
CPC ....... G03F 7/004; G03F 7/039; G03F 7/0392; G03F 7/0397; G03F 7/20; G03F 7/2002; G03F 7/2037
See application file for complete search history.

(56) References Cited

U.S. PATENT DOCUMENTS

| 5,780,206 | A | | 7/1998 | Urano et al. | |
|---|---|---|---|---|---|
| 5,852,128 | A | * | 12/1998 | Padmanaban et al. | 525/328.8 |
| 5,876,900 | A | * | 3/1999 | Watanabe et al. | 430/288.1 |
| 6,114,082 | A | * | 9/2000 | Hakey et al. | 430/270.1 |
| 6,153,349 | A | | 11/2000 | Ichikawa et al. | |
| 6,165,680 | A | * | 12/2000 | Choi | 430/270.1 |
| 6,258,507 | B1 | | 7/2001 | Ochiai et al. | |
| 7,501,223 | B2 | | 3/2009 | Takeda et al. | |
| 8,603,724 | B2 | | 12/2013 | Tanaka et al. | |
| 2002/0010273 | A1 | * | 1/2002 | Matsumura et al. | 525/100 |
| 2002/0058210 | A1 | | 5/2002 | Noguchi et al. | |
| 2007/0041698 | A1 | | 2/2007 | Maeda et al. | |
| 2008/0090179 | A1 | | 4/2008 | Takeda et al. | |
| 2010/0009286 | A1 | * | 1/2010 | Takeda et al. | 430/270.1 |
| 2010/0266951 | A1 | | 10/2010 | Hiroi et al. | |
| 2011/0003247 | A1 | | 1/2011 | Ohashi et al. | |
| 2011/0143266 | A1 | | 6/2011 | Tanaka et al. | |
| 2011/0189609 | A1 | * | 8/2011 | Kawabata et al. | 430/270.1 |
| 2012/0006788 | A1 | | 1/2012 | Fujimori et al. | |
| 2014/0051025 | A1 | | 2/2014 | Tanaka et al. | |

FOREIGN PATENT DOCUMENTS

| EP | 2 412 733 A1 | 2/2012 |
|---|---|---|
| JP | 1-293338 A | 11/1989 |
| JP | 7-295220 A | 11/1995 |
| JP | 11-322896 A | 11/1999 |
| JP | 2000-29220 A | 1/2000 |
| JP | 3546687 B2 | 7/2004 |
| JP | 2005-99558 A | 4/2005 |
| JP | 2007-52120 A | 3/2007 |
| JP | 2008-95009 A | 4/2008 |
| JP | 2008-162101 A | 7/2008 |
| JP | 2008-273844 A | 11/2008 |
| JP | 2009-86354 A | 4/2009 |
| JP | 2010-229210 A | 10/2010 |
| JP | 2011-123225 A | 6/2011 |
| JP | 2011-173868 A | 9/2011 |
| JP | 2012-46731 A | 3/2012 |
| KR | 100249254 | 6/2000 |
| TW | 201111914 A1 | 4/2011 |
| TW | 201127795 A1 | 8/2011 |
| WO | 2009/075265 A1 | 6/2009 |
| WO | WO 2010/150917 | * 12/2010 |

OTHER PUBLICATIONS

English Translation of International Preliminary Report on Patentability issued in PCT/JP2012/079585 dated May 22, 2014.

(Continued)

*Primary Examiner* — Anca Eoff

(74) *Attorney, Agent, or Firm* — Sughrue Mion, PLLC

(57) ABSTRACT

According to one embodiment, an actinic-ray- or radiation-sensitive resin composition includes a compound (A) that contains a structure (P) containing at least one phenolic hydroxyl group and a structure (Q) containing at least one phenolic hydroxyl group whose hydrogen atom is replaced by a group (S) with a cyclic structure containing an acid crosslinking group, characterized in that the group (S) with a cyclic structure containing an acid crosslinking group is a group with a polycyclic structure or a group with a cyclic structure containing a hydroxymethyl group and/or an alkoxymethyl group.

23 Claims, 5 Drawing Sheets

(56) References Cited

OTHER PUBLICATIONS

Haruyuki Okamura et al., "Photo-cross-linking and de-cross-linking of modified polystyrenes having degradable linkages", Reactive & Functional Polymers, 2011, pp. 480-488, vol. 71, Issue 4.

International Search Report for PCT/JP2012/079585 dated Jan. 29, 2013.

Office Action dated Sep. 7, 2015 from the Taiwanese Intellectual Property Office in counterpart Taiwanese Application No. 101141666.

Office Action dated Aug. 6, 2015 from the Korean Patent Office issued in corresponding Korean Application No. 10-2014-7013963.

Office Action dated May 15, 2015 from the Taiwanese Intellectual Property Office in counterpart Taiwanese Application No. 101141666.

* cited by examiner

ACTINIC-RAY- OR RADIATION-SENSITIVE RESIN COMPOSITION, ACTINIC-RAY- OR RADIATION-SENSITIVE FILM, MASK BLANK AND METHOD OF FORMING PATTERN

CROSS-REFERENCE TO RELATED APPLICATIONS

This application is a Continuation Application of PCT Application No. PCT/JP2012/079585), filed Nov. 8, 2012) and based upon and claims the benefit of priority from prior Japanese Patent Applications No. 2011-246742, filed Nov. 10, 2011; and No. 2012-123573, filed May 30, 2012, the entire contents of all of which are incorporated herein by reference.

BACKGROUND OF THE INVENTION

1. Field of the Invention

The present invention relates to an actinic-ray- or radiation-sensitive resin composition that can find appropriate application in an ultramicrolithography process for the manufacturing of a super-LSI, a high-capacity microchip, etc. and other photofabrication processes, from which a high-definition pattern can be formed with the use of electron beams or extreme ultraviolet, and relates to a method of forming a pattern in which the composition is used. More particularly, the present invention relates to an actinic-ray- or radiation-sensitive resin composition that can find appropriate application in a process in which use is made of a substrate with a specified foundation film and relates to an actinic-ray- or radiation-sensitive film therefrom, a mask blank and a method of forming a pattern.

2. Description of the Related Art

In the microfabrication using a resist composition, the formation of a nanopattern is required in accordance with the realization of high integration for integrated circuits. In accordance with this requirement, the trend of exposure wavelength toward a short wavelength, for example, from g-rays to i-rays and further to an excimer laser light is seen. Now, for example, the development of lithography technology using electron beams is progressing. With respect to the resins exposed to an excimer laser light, such as a KrF excimer laser light, patent references 1 to 4 disclose a resin with a structure resulting from replacement of the hydrogen atom of a phenolic hydroxyl group with a group containing an aliphatic hydrocarbon residue, a resin with a structure resulting from replacement of the hydrogen atom with a group containing an aryl group, a resin with a structure resulting from replacement of the hydrogen atom with an alkyl group and a resin with a structure resulting from replacement of the hydrogen atom with a linear alkyl group in which an oxirane group is introduced, respectively. For the formation of a nanopattern, the thickness of the resist film must be reduced. However, the reduction of the film thickness leads to a poor dry etching resistance.

In the electron beam lithography, in recent years, the influence of electron scattering (forward scattering) in a resist film is lessened by increasing the acceleration voltage of electron beams (EB). However, this lowers the electron energy trapping ratio in the resist film, thereby rendering the sensitivity poor, and increases the influence of the scattering of electrons reflected by the resist substrate (backward scattering). In particular, when it is intended to form an isolated pattern of large exposure area, the influence of backward scattering is grave, thereby deteriorating the resolution of the isolated pattern.

In particular, in the patterning of a photomask blank for use in semiconductor exposure, as a light shielding film containing a heavy atom is present in a resist underlayer, the influence of backward scattering attributed thereto is highly conspicuous. Therefore, when an isolated pattern is formed on a photomask blank, the possibility of resolution deterioration is especially high.

The use of a resin with an aromatic skeleton such as naphthalene (for example, patent references 5 and 6) and the use of a resin containing an oxirane group (for example, patent reference 7) are being studied as means for solving these problems. However, the resolution of an isolated pattern remains unsolved. Further, in the technology disclosed in patent reference 7, an unsatisfactory dry etching resistance has been proved. In patent reference 8, a resin containing a group capable of solubility regulation is used as one means for improving the resolution of an isolated pattern. However, the resolution of an isolated pattern has not reached a satisfactory level.

Moreover, the microfabrication using a resist composition is not only directly used in the manufacturing of integrated circuits but also, in recent years, finds application in the production of so-called imprint mold structures, etc. (see, for example, patent reference 9 and non-patent reference 1). Therefore, it is an important task to simultaneously satisfy high sensitivity, high resolution (for example, high resolving power, excellent pattern shape and minute line edge roughness (LER)) and favorable dry etching resistance, and it is now needed to achieve this task.

CITATION LIST

Patent Literature

Patent reference 1: Jpn. Pat. Appin. KOKAI Publication No. (hereinafter referred to as JP-A-) 2000-29220,
Patent reference 2: Japanese Patent 3546687,
Patent reference 3: JP-A-H7-295220,
Patent reference 4: JP-A-H1-293338,
Patent reference 5: JP-A-2008-95009,
Patent reference 6: JP-A-2009-86354,
Patent reference 7: JP-A-2011-123225,
Patent reference 8: JP-A-2005-99558, and
Patent reference 9: JP-A-2008-162101.

Non-Patent Literature

Non-patent reference 1: "Fundamentals of nanoimprint and its technology development/application deployment—technology of nanoimprint substrate and its latest technology deployment" edited by Yoshihiko Hirai, published by Frontier Publishing (issued in June, 2006).

BRIEF SUMMARY OF THE INVENTION

It is an object of the present invention to provide an actinic-ray- or radiation-sensitive resin composition for pattern formation that simultaneously satisfies high sensitivity, high resolution (for example, high resolving power, excellent pattern shape and minute line edge roughness (LER)) and favorable dry etching resistance. It is other objects of the present invention to provide an actinic-ray- or radiation-sensitive film from the composition, a mask blank with the film and a method of forming a pattern.

It is an especial object of the present invention to provide an actinic-ray- or radiation-sensitive resin composition that exhibits a high resolving power in the formation of an isolated nanopattern through exposure using electron beams or extreme ultraviolet.

Some aspects according to the present invention are as follows.

[1] An actinic-ray- or radiation-sensitive resin composition comprising a compound (A) that contains a structure (P) containing at least one phenolic hydroxyl group and a structure (Q) containing at least one phenolic hydroxyl group whose hydrogen atom is replaced by a group (S) with a cyclic structure containing an acid crosslinking group, characterized in that the group (S) with a cyclic structure containing an acid crosslinking group is a group with a polycyclic structure or a group with a cyclic structure containing a hydroxymethyl group and/or an alkoxymethyl group.

[2] The composition according to item [1], to be exposed to electron beams or extreme ultraviolet and used to form a negative pattern.

[3] The composition according to item [1] or [2], characterized in that the cyclic structure containing an acid crosslinking group introduced in the group (S) is a cyclic structure containing a hydroxymethyl group and/or an alkoxymethyl group, expressed by general formula (0) below,

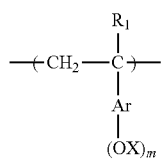

(0)

wherein n is an integer of 1 or greater, and Z represents a hydrogen atom or an alkyl group, provided that when n is 2 or greater, two or more Z's may be identical to or different from each other.

[4] The composition according to any of items [1] to [3], characterized in that the compound (A) is a polymeric compound containing any of repeating units (Q) of general formula (1) below as the structure (Q),

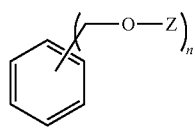

(1)

in which $R_1$ represents a hydrogen atom or a methyl group;

X represents a group with a polycyclic structure containing an acid crosslinking group, or a group with a cyclic structure containing a hydroxymethyl group and/or an alkoxymethyl group;

Ar represents an aromatic ring; and m is an integer of 1 to 5, provided that when m is 2 or greater, two or more X's may be identical to or different from each other.

[5] The composition according to item [4], characterized in that the repeating units (Q) of general formula (1) are repeating units of general formula (2) below, and the structure (P) is any of repeating units (P) of general formula (I) below,

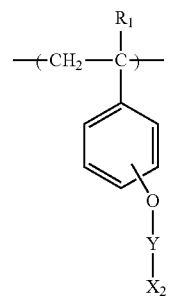

(2)

in which $R_1$ represents a hydrogen atom or a methyl group;

Y represents a single bond or a bivalent connecting group; and $X_2$ represents a group with a polycyclic structure containing an acid crosslinking group, or a group with a cyclic structure containing a hydroxymethyl group and/or an alkoxymethyl group,

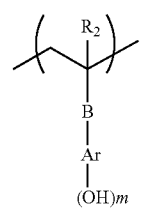

(I)

in which $R_2$ represents a hydrogen atom, an optionally substituted methyl group or a halogen atom;

B represents a single bond or a bivalent organic group;

Ar represents an aromatic ring group; and m is an integer of 1 or greater.

[6] The composition according to item [5], characterized in that in general formula (2), Y is a carbonyl group or an alkylene group.

[7] The composition according to item [4], characterized in that repeating units (Q) of general formula (1) are repeating units of general formula (3) below, and the structure (P) is any of repeating units (P) of general formula (I) below,

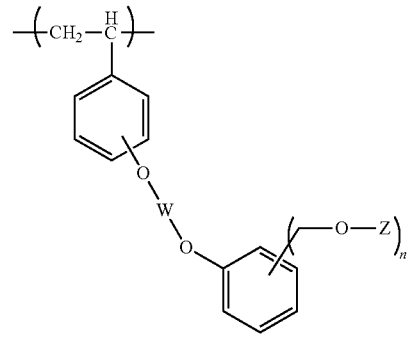

(3)

wherein n is an integer of 1 or greater, Z represents a hydrogen atom or an alkyl group provided that when n is 2 or greater, two or more Z's may be identical to or different from each other, and W represents a bivalent connecting group,

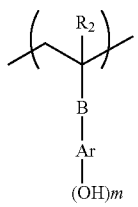
(I)

in which

R$_2$ represents a hydrogen atom, an optionally substituted methyl group or a halogen atom;

B represents a single bond or a bivalent organic group;

Ar represents an aromatic ring group; and m is an integer of 1 or greater.

[8] The composition according to any of items [1] to [7], further comprising a compound (B) that when exposed to actinic rays or radiation, generates an acid.

[9] The composition according to item [8], characterized in that the compound (B) is an onium compound.

[10] The composition according to item [8] or [9], characterized in that the acid generated by the compound (B) upon exposure to actinic rays or radiation has a volume of 130 Å$^3$ or greater.

[11] The composition according to any of items [4] to [10], characterized in that the polymeric compound (A) exhibits a polydispersity index of 1.0 to 1.20.

[12] The composition according to any of items [1] to [11], further comprising a compound (C) containing a total of two or more hydroxymethyl groups and/or alkoxymethyl groups in its molecule.

[13] An actinic-ray- or radiation-sensitive film formed from the composition according to any of items [1] to [12].

[14] A mask blank comprising the actinic-ray- or radiation-sensitive film according to item [13].

[15] A method of forming a resist pattern, comprising exposing the actinic-ray- or radiation-sensitive film according to item [13] to light and developing the exposed film.

[16] A method of forming a resist pattern, comprising exposing the mask blank comprising an actinic-ray- or radiation-sensitive film according to item [14] to light and developing the exposed mask blank.

[17] The method according to item [15] or [16], characterized in that the exposure is performed using electron beams or extreme ultraviolet.

[18] A polymeric compound comprising two types of repeating units shown below.

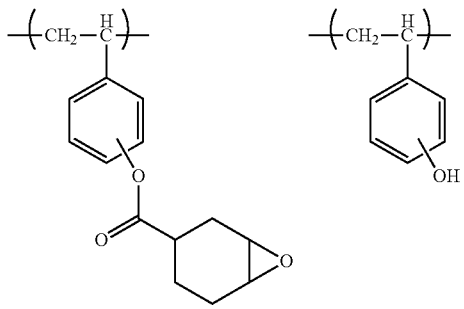

[19] A polymeric compound comprising two types of repeating units shown below.

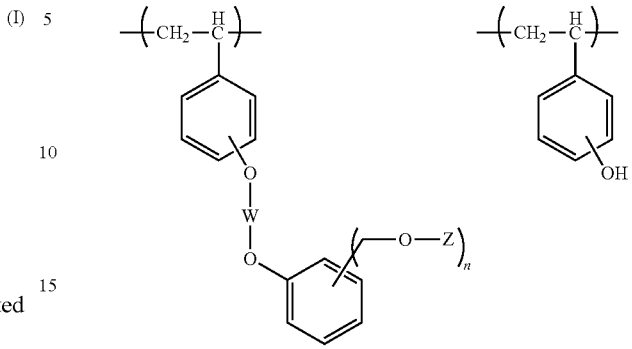

wherein n is an integer of 1 or greater, Z represents a hydrogen atom or an alkyl group provided that when n is 2 or greater, two or more Z's may be identical to or different from each other, and W represents a bivalent connecting group.

The present invention makes it feasible to provide an actinic-ray- or radiation-sensitive resin composition for pattern formation that simultaneously satisfies high sensitivity, high resolution (for example, high resolving power, excellent pattern shape and minute line edge roughness (LER)) and favorable dry etching resistance and to provide an actinic-ray- or radiation-sensitive film from the composition, a mask blank with the film and a method of forming a pattern.

DETAILED DESCRIPTION OF THE INVENTION

Figure 1:
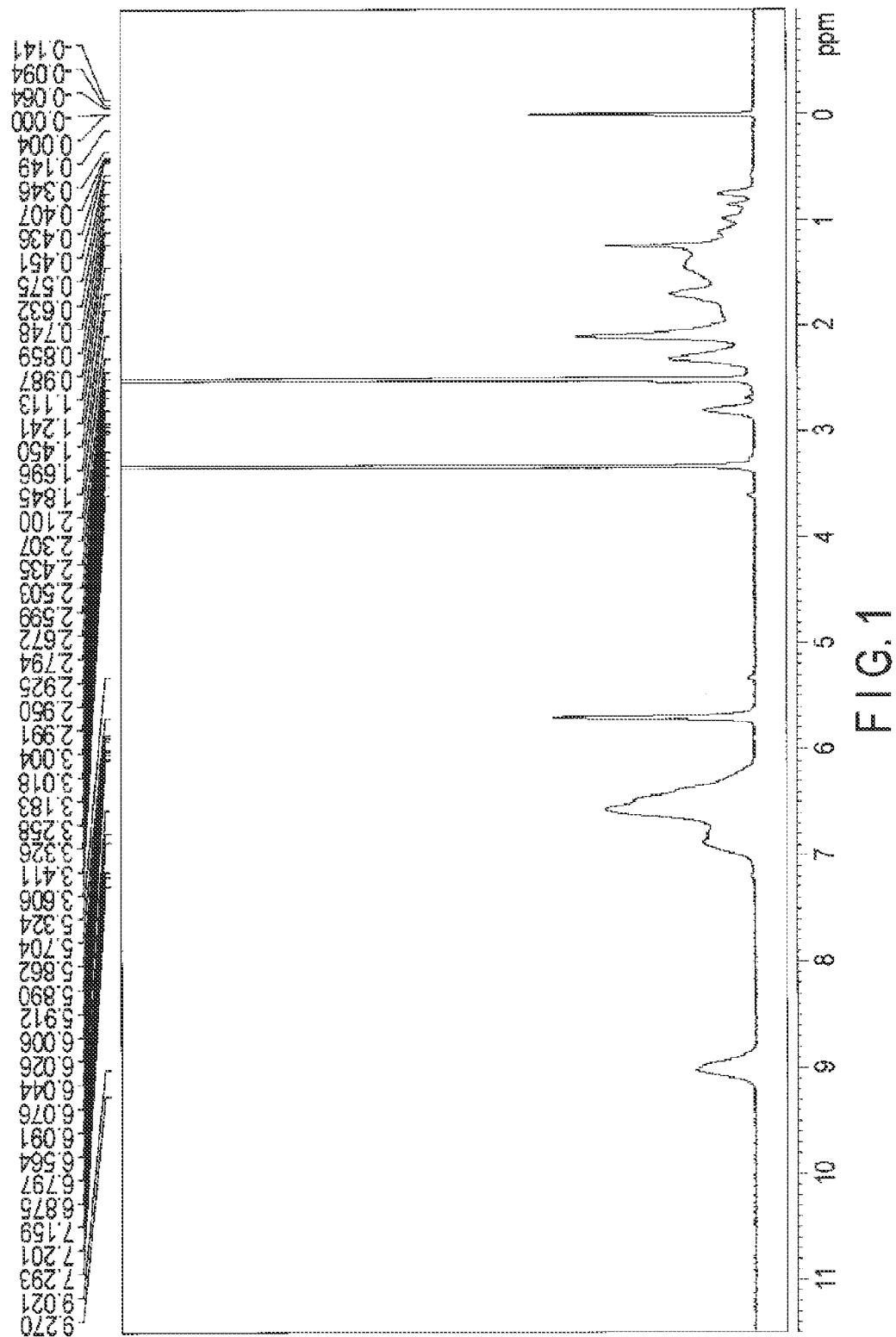
FIG. 1 is a chart showing a $^1$H-NMR spectrum of polymeric compound (X1) obtained in Synthetic Example 1.

Now, the embodiments of the present invention will be described in detail.

With respect to the expression of group (atomic group) used in this specification, the expression even when there is no mention of "substituted and unsubstituted" encompasses groups not only having no substituent but also having substituents. For example, the expression "alkyl groups" encompasses not only alkyls having no substituent (unsubstituted alkyls) but also alkyls having substituents (substituted alkyls).

In the present invention, the term "actinic rays" or "radiation" means, for example, brightline spectra from a mercury lamp, far ultraviolet represented by an excimer laser, extreme ultraviolet (EUV light), X-rays, electron beams (EB) and the like. Further, in the present invention, the term "light" means actinic rays or radiation. The term "exposure to light" used in this specification, unless otherwise specified, means not only irradiation with light, such as light from a mercury lamp, far ultraviolet represented by an excimer laser, X-rays or EUV light, but also lithography using particle beams, such as electron beams and ion beams.

The actinic-ray- or radiation-sensitive resin composition of the present invention is a composition comprising the compound (A) to be described in detail below as its essential component. When the compound (A) is not a polymeric compound comprising a repeating unit containing a photoacid generating group capable of generating an acid upon exposure to actinic rays or radiation to be described below, the composition of the present invention further comprises a compound (B) that when exposed to actinic rays or radiation, generates an acid as its essential component.

The composition of the present invention may be used in so-called negative pattern formation, and may also be used in positive pattern formation. The composition of the present invention in its one form is a composition appropriately used as one exposed to electron beams or extreme ultraviolet.

[Compound (A)]

The composition of the present invention comprises a compound (A) that contains a structure (P) containing at least one phenolic hydroxyl group and a structure (Q) containing at least one phenolic hydroxyl group whose hydrogen atom is replaced by a group (S) with a cyclic structure containing an acid crosslinking group. The group (S) with a cyclic structure containing an acid crosslinking group is a group with a polycyclic structure or a group with a cyclic structure containing a hydroxymethyl group and/or an alkoxymethyl group.

The compound (A) is not particularly limited as long as at least one structure (P) and at least one structure (Q) are introduced therein. The compound (A) may be a relatively low-molecular compound, such as a molecular resist, and may also be a polymeric compound. As the molecular resist, use can be made of, for example, low-molecular-weight cyclic polyphenol compounds described in JP-A-2009-173623, JP-A-2009-173625 and Journal of Synthetic Organic Chemistry, Japan, 492-507, Vol. 70, No. 5 (2012). The molecular weight of low-molecular compound in its one form is preferably up to 2000, more preferably in the range of 500 to 1500.

From the viewpoint of reactivity and sensitivity, it is preferred for the compound (A) to be a polymeric compound.

The incorporation of the compound (A) increases the glass transition temperature (Tg) of the composition of the present invention, so that a very hard actinic-ray- or radiation-sensitive film can be formed, thereby permitting the control of acid diffusion and dry etching resistance. Accordingly, the acid diffusion in areas exposed to actinic rays or radiation, such as electron beams or extreme ultraviolet, can be effectively inhibited, thereby ensuring excellent resolving power, pattern shape and LER in nanopatterns.

In the compound (A), an aromatic ring, such as a benzene ring, and a group with a cyclic structure containing an acid crosslinking group are connected to each other through an oxygen atom attributed to a phenolic hydroxyl group. This structure contributes to not only a high dry etching resistance but also, when the compound (A) is a polymeric compound, an increase of the glass transition temperature (Tg) of the polymeric compound (A). It is presumed that by virtue of the effect of a combination of these, a high resolving power, especially in the formation of an isolated nanopattern through exposure to electron beams or extreme ultraviolet, can be realized.

The effect of an increase of the glass transition temperature (Tg) by the compound (A) according to the present invention is more conspicuous in the use of the compound (A) in a negative resist composition for negative patterning than in a positive resist composition for positive patterning. Therefore, it is preferred for the actinic-ray- or radiation-sensitive resin composition of the present invention to be a negative composition.

Moreover in the compound (A), as described below, a phenolic hydroxyl group and an acid crosslinking group form a new bond in the presence of an acid to thereby realize an enhanced hardenability, so that the sensitivity and dry etching resistance can be enhanced.

In the present invention, the "phenolic hydroxyl group" refers to a hydroxyl group directly bonded to an aromatic ring. The aromatic ring is monocyclic or polycyclic. As the aromatic ring, there can be mentioned, for example, a benzene ring, a naphthalene ring or the like.

The "acid crosslinking group" refers to a group capable of forming a new bond through an addition reaction or substitution reaction from a highly reactive nucleophilic group, such as an alcohol or phenol moiety, to an atom with low electron density (mainly carbon) occurring in the presence of an acid. As such, there can be mentioned, for example, a hydroxymethyl group, an alkoxymethyl group, a vinyl ether group, a group with a cyclic structure, or the like. As the group with a cyclic structure, there can be mentioned an oxirane group, an oxetane group, a thioxirane group, a thioxetane group or the like. The compound (A) is not particularly limited as long as one or more of these acid crosslinking groups are contained in each molecule. The contained acid crosslinking group in its one form is preferably an oxirane group, an oxetane group, a hydroxymethyl group or an alkoxymethyl group, most preferably an alkoxymethyl group. The alkoxy group in the alkoxymethyl group is, for example, an alkoxy group having 1 to 10 carbon atoms (e.g., a methoxy group, an ethoxy group, a propoxy group, a butoxy group, a hexyloxy group, a cyclohexyloxy group or the like).

The "cyclic structure" in the group (S) with a cyclic structure containing an acid crosslinking group may be an aromatic or nonaromatic ring, or a heteroring. Further, the "cyclic structure" may be monocyclic or polycyclic. The "polycyclic structure" may be a condensed ring, or a bridged ring, or a spiro ring. The "polycyclic structure" may be in the form of two or more monocycles connected to each other through a single bond.

When the acid crosslinking group has a cyclic structure as in, for example, an oxirane group or the like, the cyclic structure containing an acid crosslinking group forms a polycyclic structure through condensation of the acid crosslinking group having a cyclic structure with the cyclic (mono- or polycyclic) structure or through connection thereof via a spiro bond or a single bond.

A substituent may further be introduced in the "cyclic structure" in the group (S) with a cyclic structure containing an acid crosslinking group. As the substituent, there can be mentioned, for example, an alkyl group, an aryl group, an alkoxy group, a hydroxyl group, a halogen atom, a combination of these, or the like.

In one mode of the present invention, it is preferred for the polycyclic structure that can be introduced in the structure (Q) to be a condensed ring or a bridged ring. A cyclohexane ring is preferably contained as part of the polycyclic structure. In particular, from the viewpoint of reactivity, it is preferred to introduce a cyclohexene oxide structure (structure resulting from condensation of a cyclohexane ring with an oxirane ring).

The following structures are shown as the cyclic structure and the polycyclic structure containing a crosslinking group.

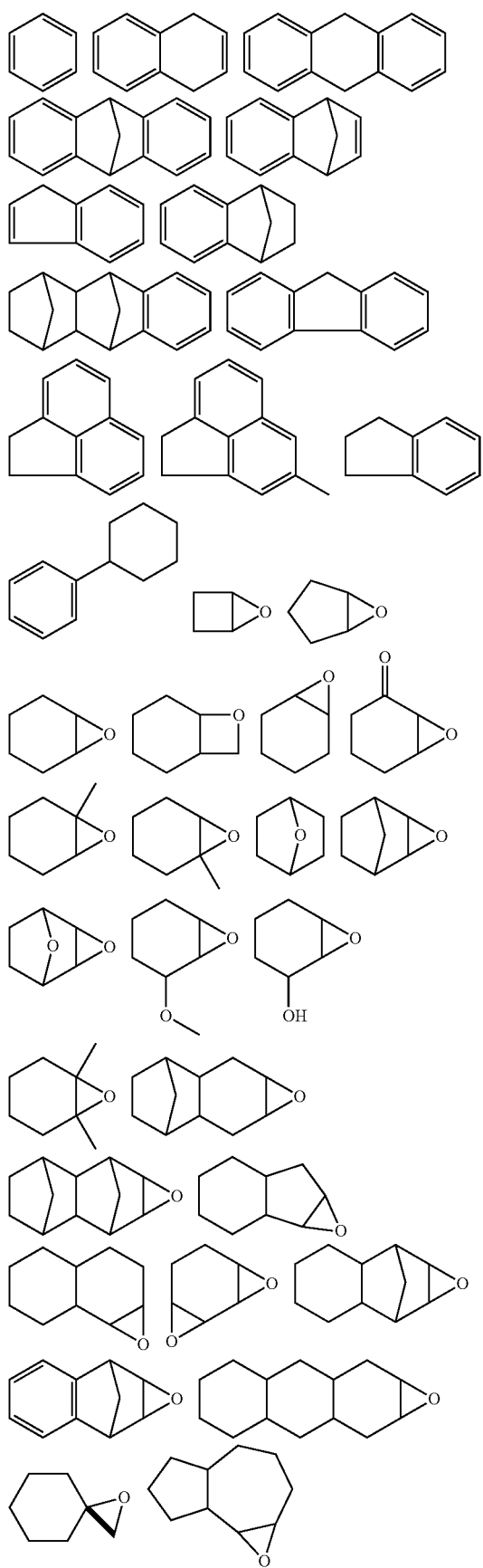

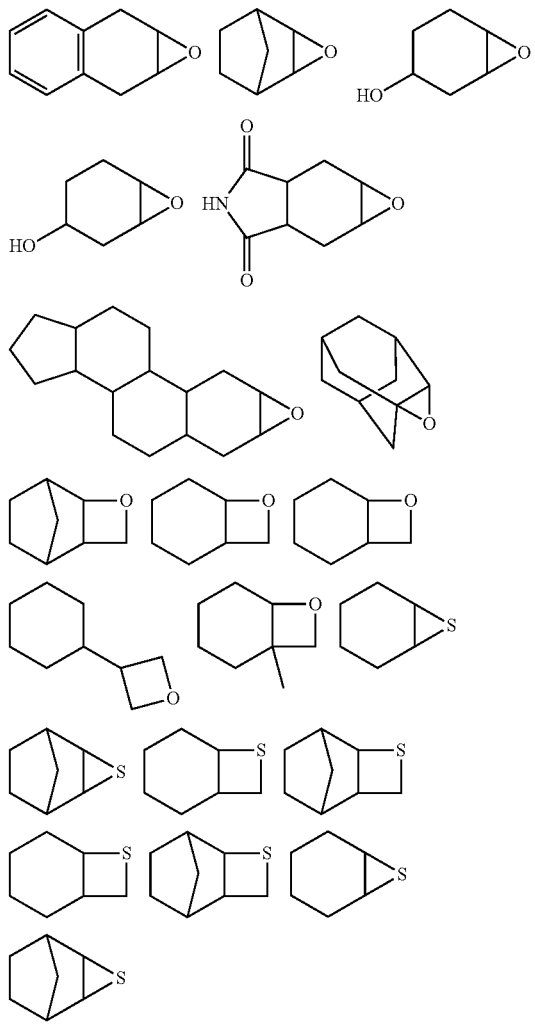

The cyclic structure containing a hydroxymethyl group or an alkoxymethyl group is preferably a cyclic structure containing two or more hydroxymethyl or alkoxymethyl groups, more preferably one expressed by general formula (0).

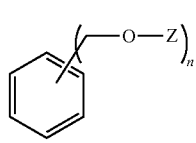

In the formula, n is an integer of 1 or greater. Z represents a hydrogen atom or an alkyl group. When n is 2 or greater, two or more Z's may be identical to or different from each other.

Preferably, n is 2 to 4. Most preferably, n is 2 or 3.

As the cyclic structure containing a hydroxymethyl group or an alkoxymethyl group, there can be mentioned the following structures.

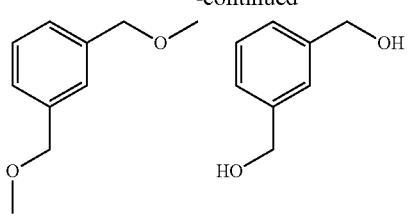
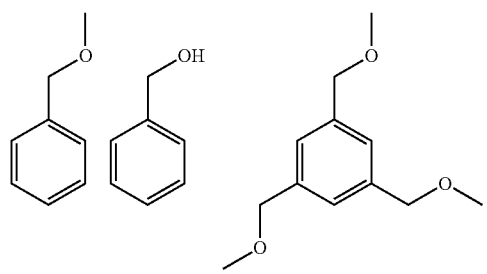
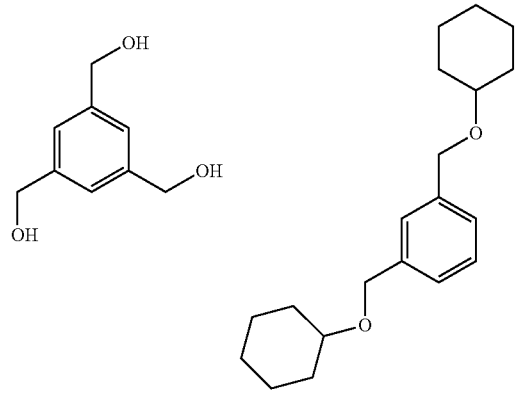
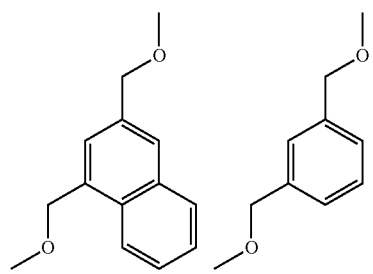
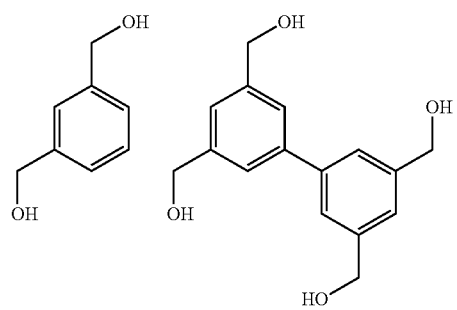
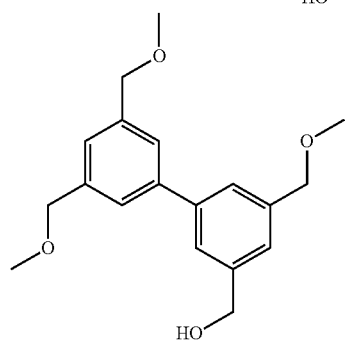
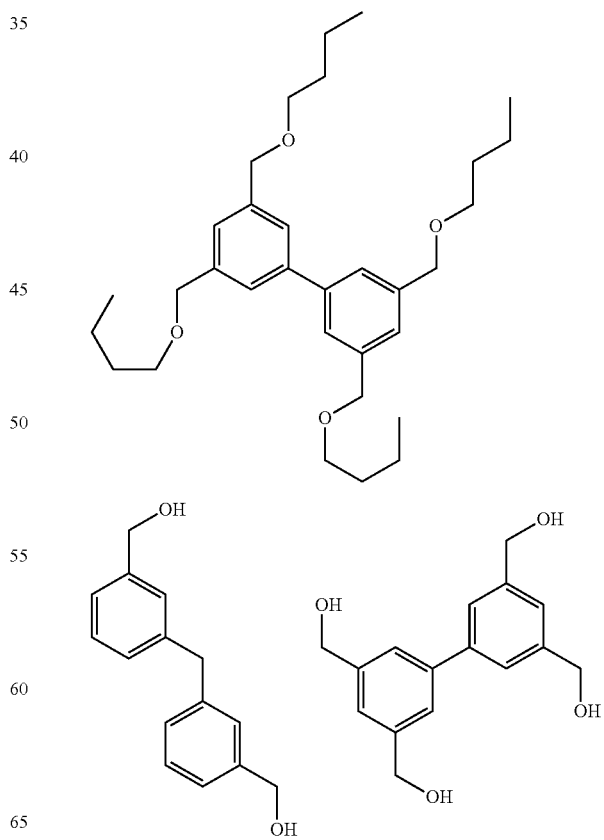
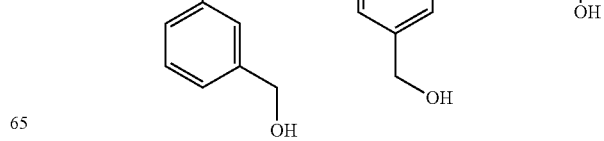

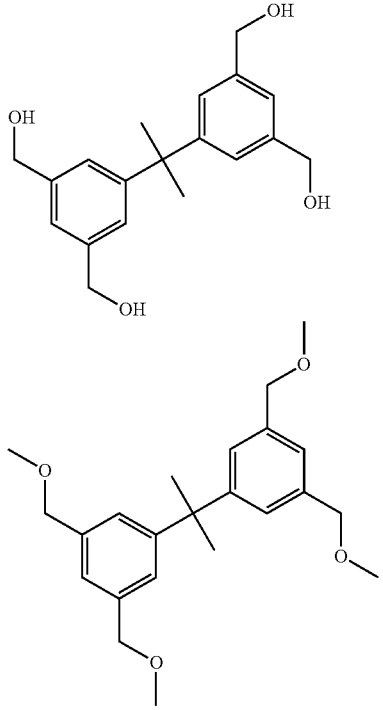

When the compound (A) is a polymeric compound, it is preferred for the structure (Q) containing a phenolic hydroxyl group whose hydrogen atom is replaced by a group (S) with a cyclic structure containing an acid crosslinking group to be, for example, any of repeating units (Q) of general formula (1) below.

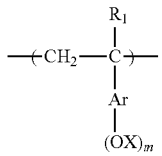

In the formula, $R_1$ represents a hydrogen atom or a methyl group;

X represents a group with a polycyclic structure containing an acid crosslinking group, or a group comprising a group with a cyclic structure containing a hydroxymethyl group and/or an alkoxymethyl group;

Ar represents an aromatic ring; and m is an integer of 1 to 5, provided that when m is 2 or greater, two or more X's may be identical to or different from each other.

With respect to the groups represented by X, the acid crosslinking group is as described above. Particular examples and preferred examples thereof are also the same.

The "cyclic structure" and "polycyclic structure" are as described above. Particular examples of the cyclic structures containing an acid crosslinking group are also as set forth above.

The aromatic ring represented by Ar is, for example, one having 6 to 18 carbon atoms, preferably a benzene ring or a naphthalene ring. A benzene ring is most preferred.

A substituent other than the group of —OX may further be introduced in this aromatic ring. As the substituent, there can be mentioned, for example, an alkyl group, an alkoxy group, a hydroxyl group or the like.

In the formula, m is preferably 1 or 2, more preferably 1.

The repeating unit (Q) has more preferably a structure expressed by, for example, general formula (2) below.

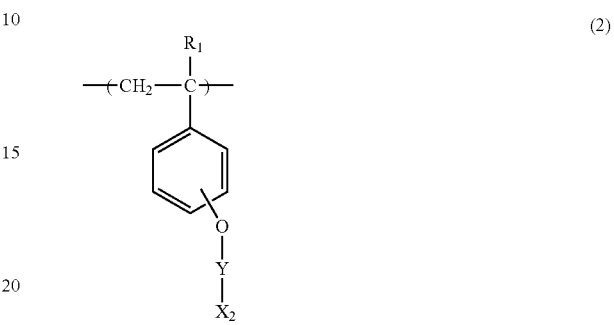

In the formula,

Y represents a single bond or a bivalent connecting group.

$X_2$ represents a group with a polycyclic structure containing an acid crosslinking group, or a group with a cyclic structure containing a hydroxymethyl group and/or an alkoxymethyl group It is preferred for Y to be a bivalent connecting group. The bivalent connecting group represented by Y is preferably a carbonyl group, a thiocarbonyl group, an alkylene group (preferably 1 to 10 carbon atoms, more preferably 1 to 5 carbon atoms), a sulfonyl group, —COCH$_2$—, —NH— or a bivalent connecting group comprised of a combination of these (preferably, in total, 1 to 20 carbon atoms, more preferably 1 to 10 carbon atoms). The bivalent connecting group is more preferably a carbonyl group, an alkylene group, a sulfonyl group, —CONH— or —CSNH—, most preferably a carbonyl group or an alkylene group.

The acid crosslinking group in the group represented by $X_2$ is as described above. Particular examples and preferred examples thereof are also the same. Further, the "cyclic structure" and "polycyclic structure" are as described above. Particular examples of the cyclic structures containing an acid crosslinking group represented by $X_2$ are also as set forth above.

The repeating unit (Q) has more preferably a structure expressed by, for example, general formula (3) below.

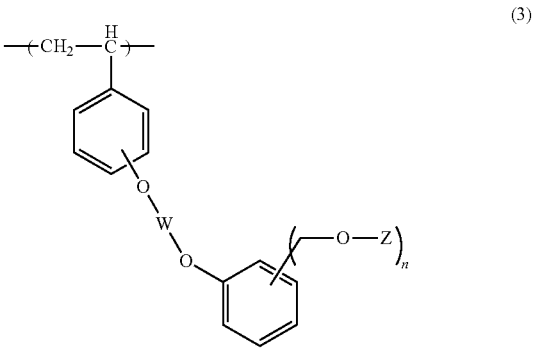

In the formula, n is an integer of 1 or greater. Z represents a hydrogen atom or an alkyl group. When n is 2 or greater, two or more Z's may be identical to or different from each other. W represents a bivalent connecting group.

The bivalent connecting group represented by W is preferably a carbonyl group, a thiocarbonyl group, an alkylene group (preferably 1 to 10 carbon atoms, more preferably 1 to 5 carbon atoms), a sulfonyl group, —COCH$_2$—, —NH—, —O—, —S—, or a bivalent connecting group comprised of a combination of these (preferably, in total, 1 to 20 carbon atoms, more preferably 1 to 10 carbon atoms). The bivalent connecting group is more preferably a carbonyl group, an alkylene group, a sulfonyl group, —O—, or a bivalent connecting group comprised of a combination of these (preferably, in total, 1 to 20 carbon atoms, more preferably 1 to 10 carbon atoms), most preferably a carbonyl group, an alkylene group, —O—, or a bivalent connecting group comprised of a combination of these (preferably, in total, 1 to 20 carbon atoms, more preferably 1 to 10 carbon atoms).

As the alkyl group represented by Z, there can be mentioned a methyl group, an ethyl group, a propyl group, a butyl group, a hexyl group, a decyl group, a cyclohexyl group, a 2-ethylhexyl group, an adamantyl group or the like.

Preferably, n is 2 or 3.

From the viewpoint of crosslinking efficiency and developability, it is preferred for the content of repeating unit (Q) to be in the range of 5 to 50 mol %, based on all the repeating units of the polymeric compound (A). The content is more preferably in the range of 10 to 40 mol %.

The following structures are particular examples of the repeating units of general formula (1).

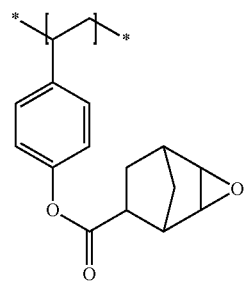

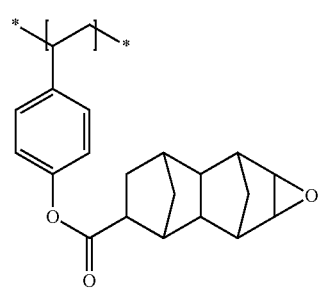

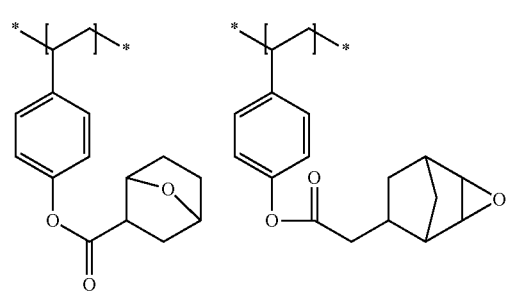

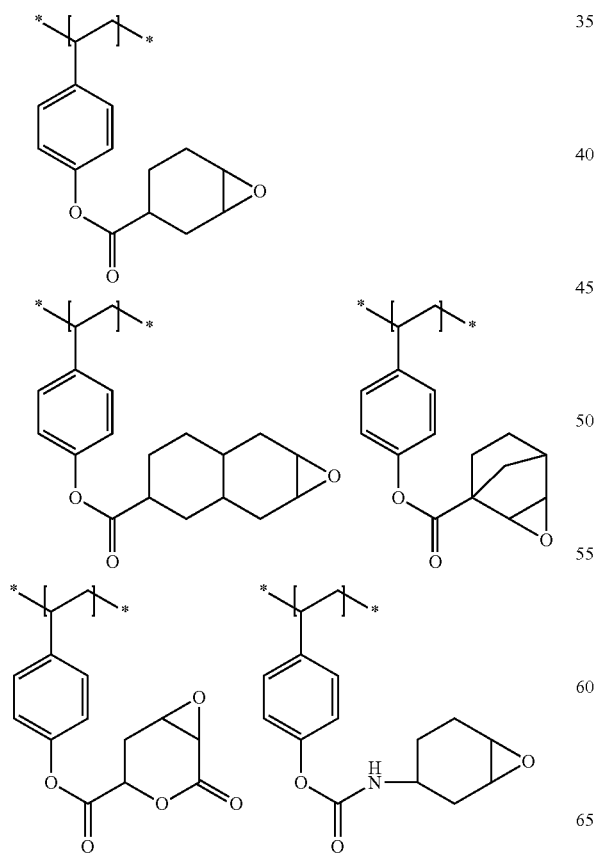

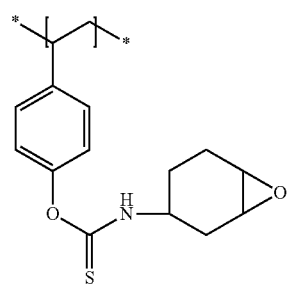

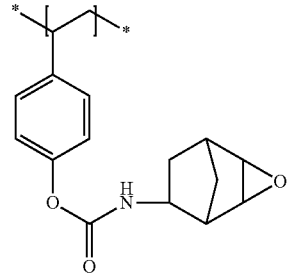

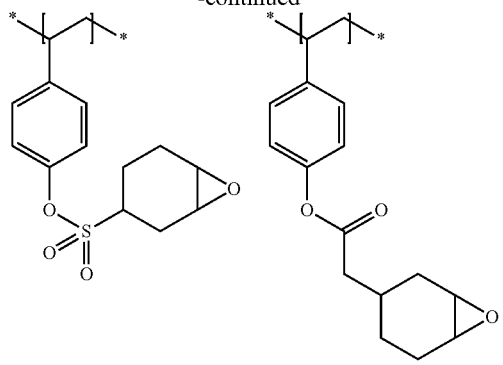
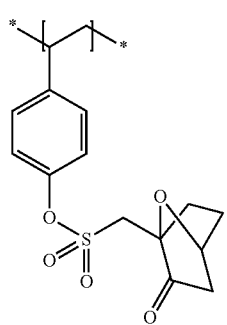
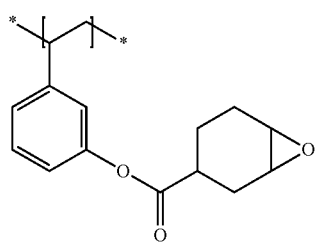
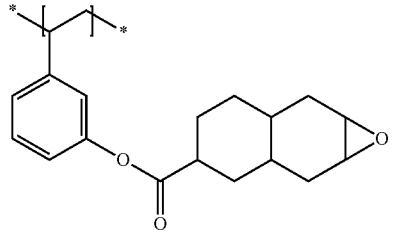
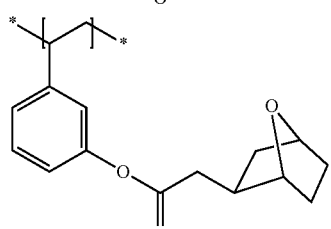
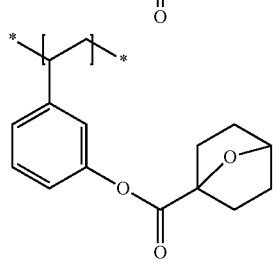
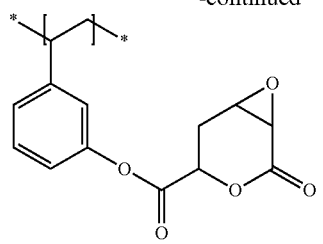
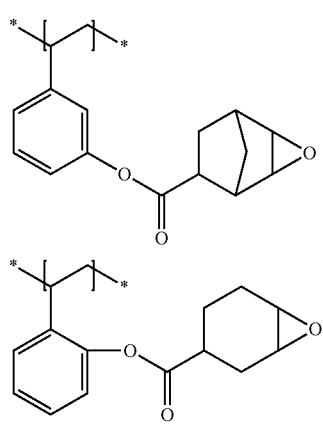
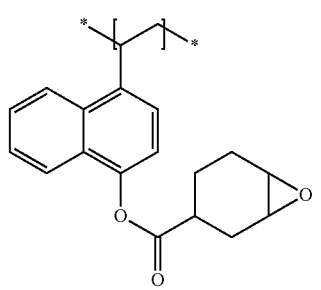
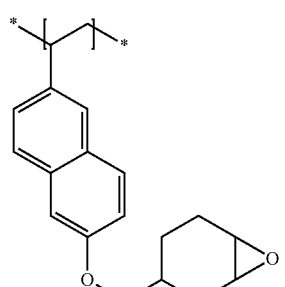
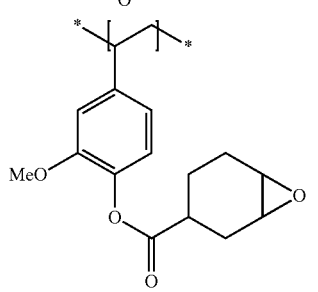

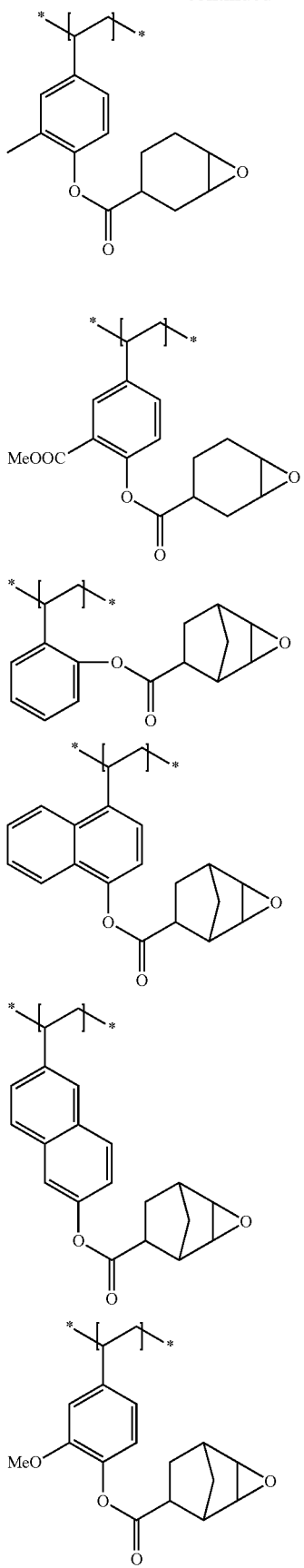
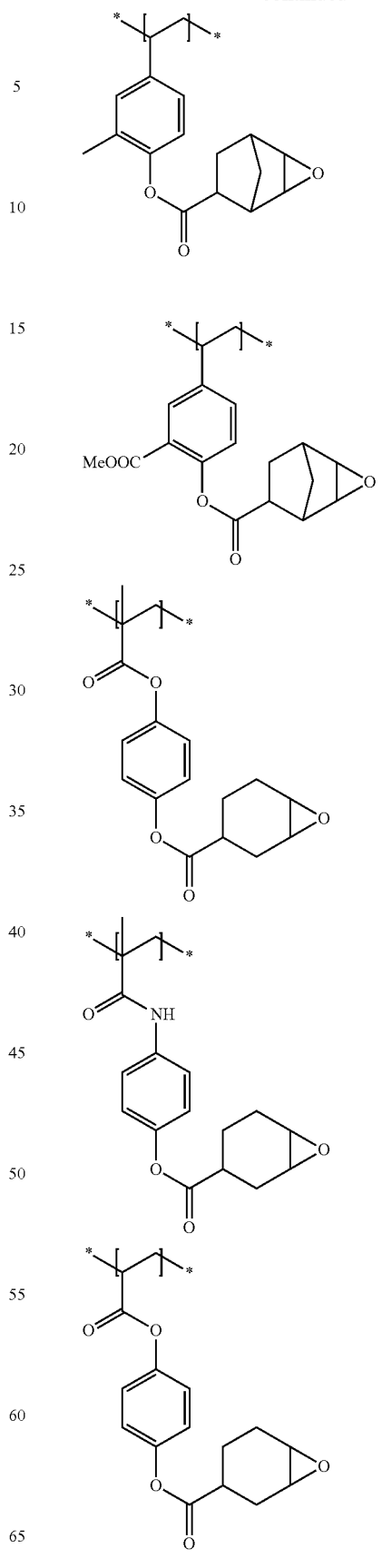

21
-continued
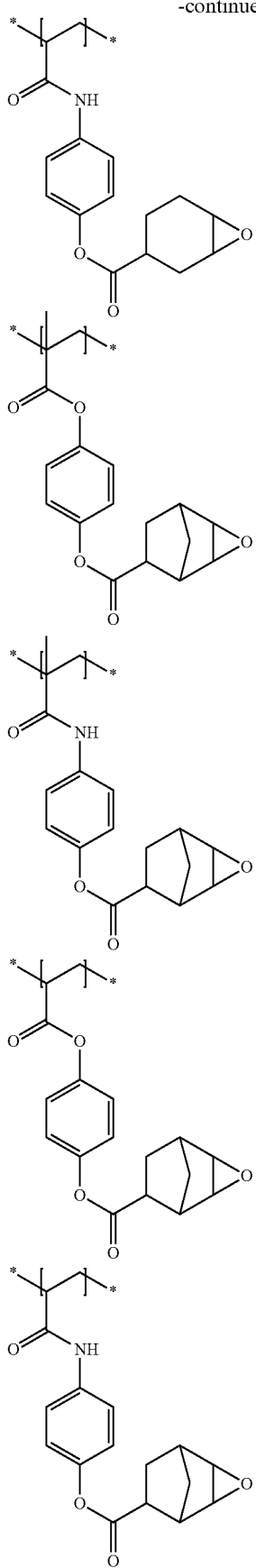
22
-continued
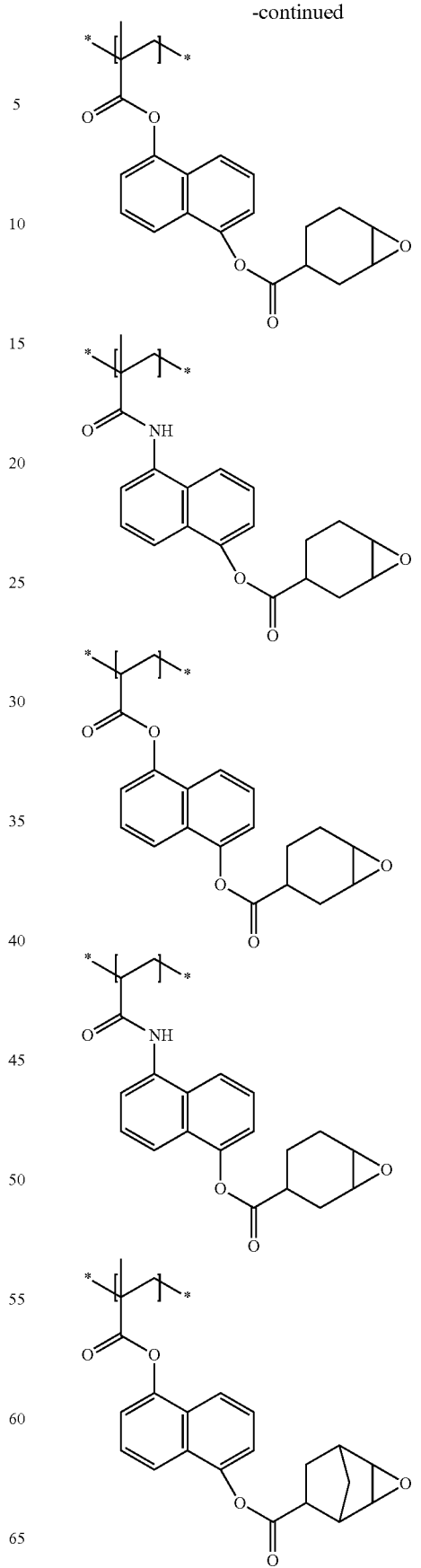

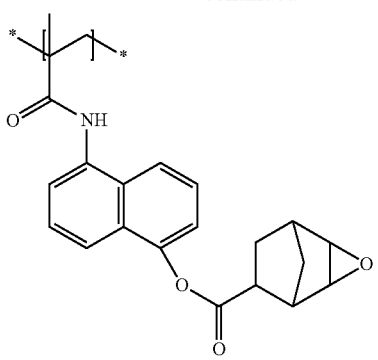
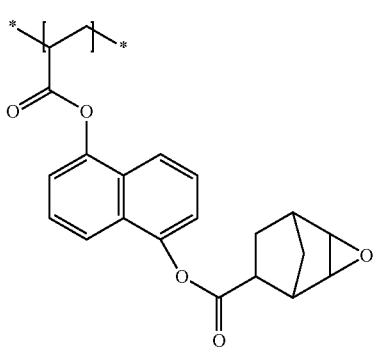
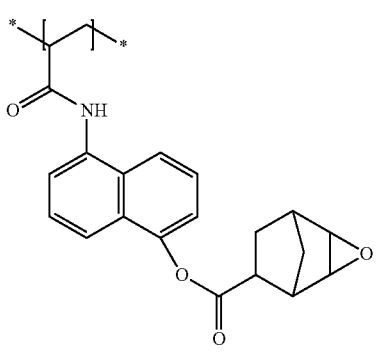
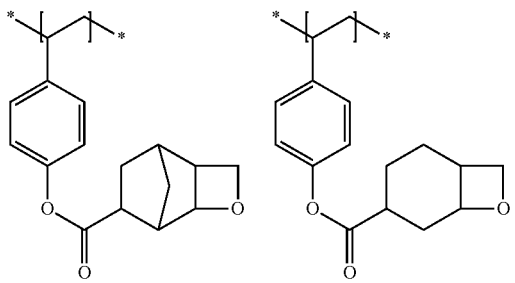
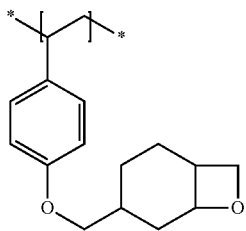
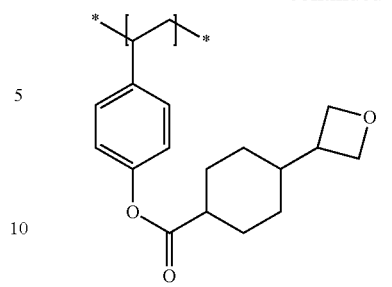
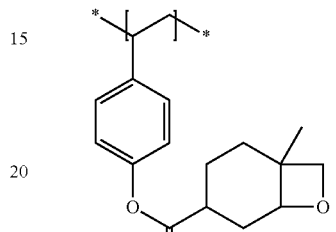
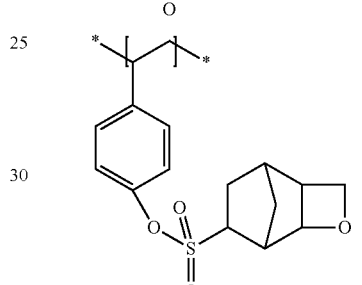
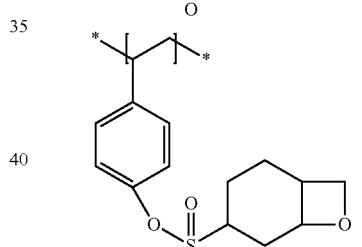
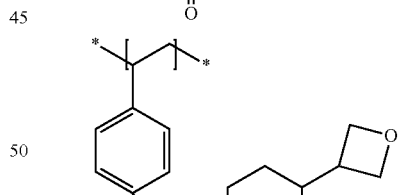
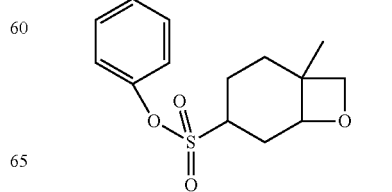

25
-continued
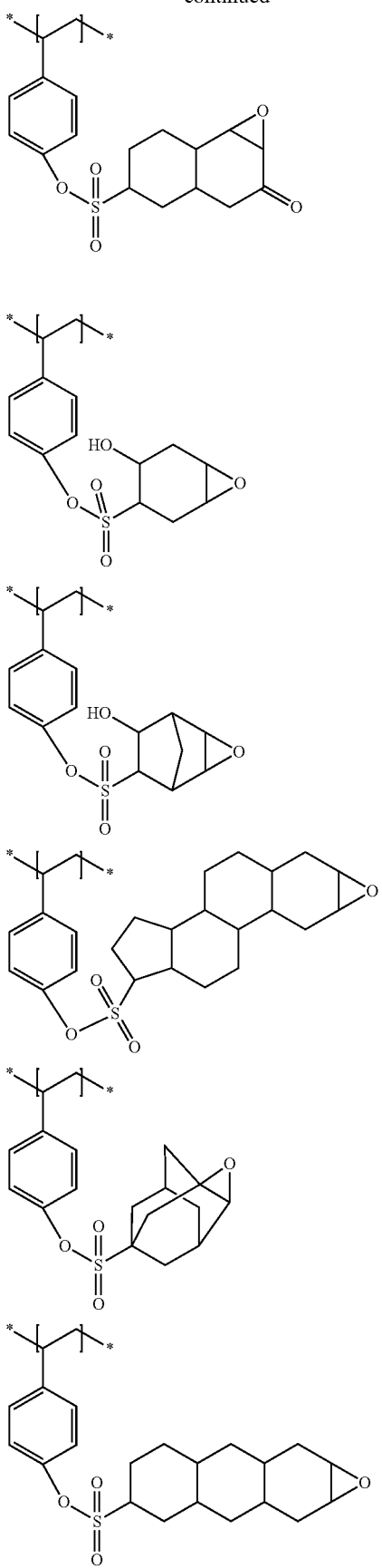
26
-continued
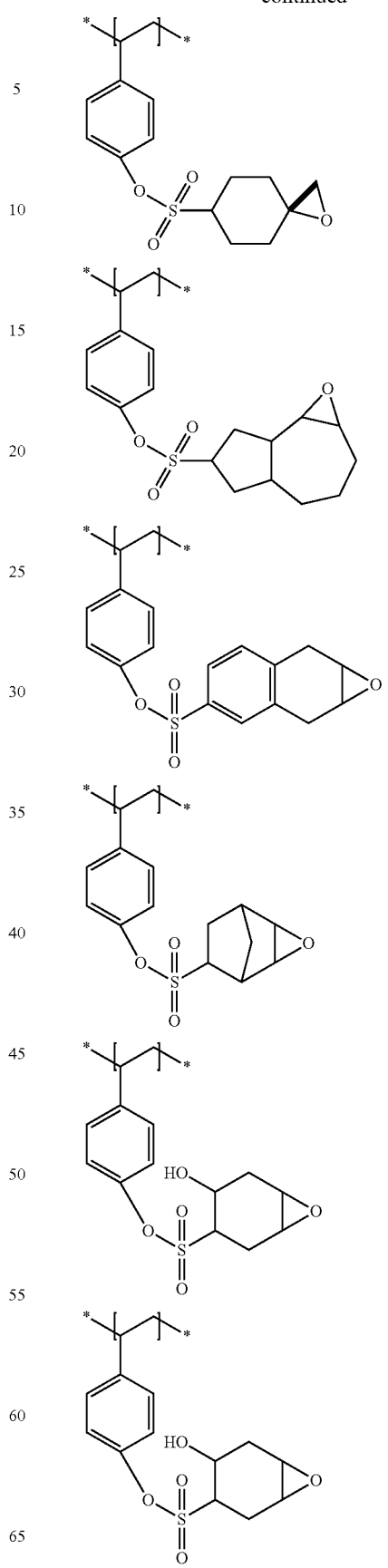

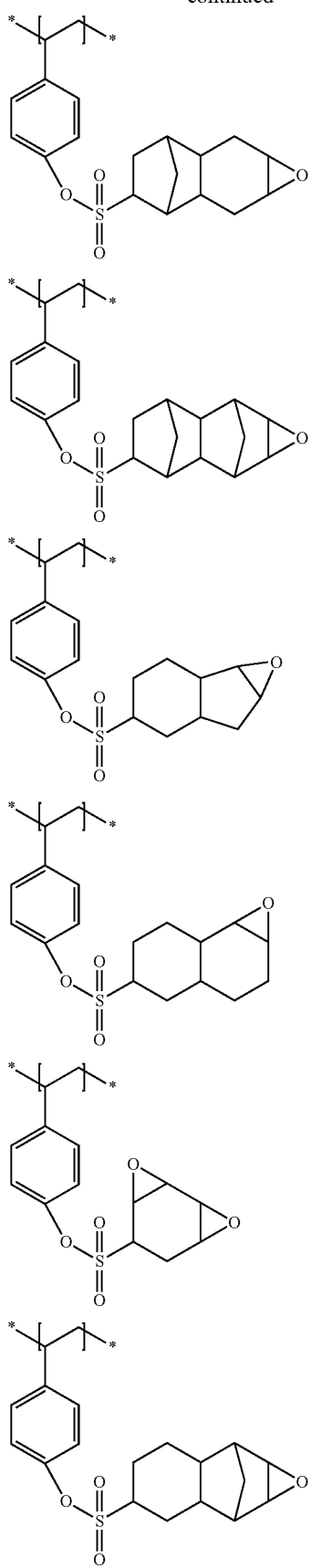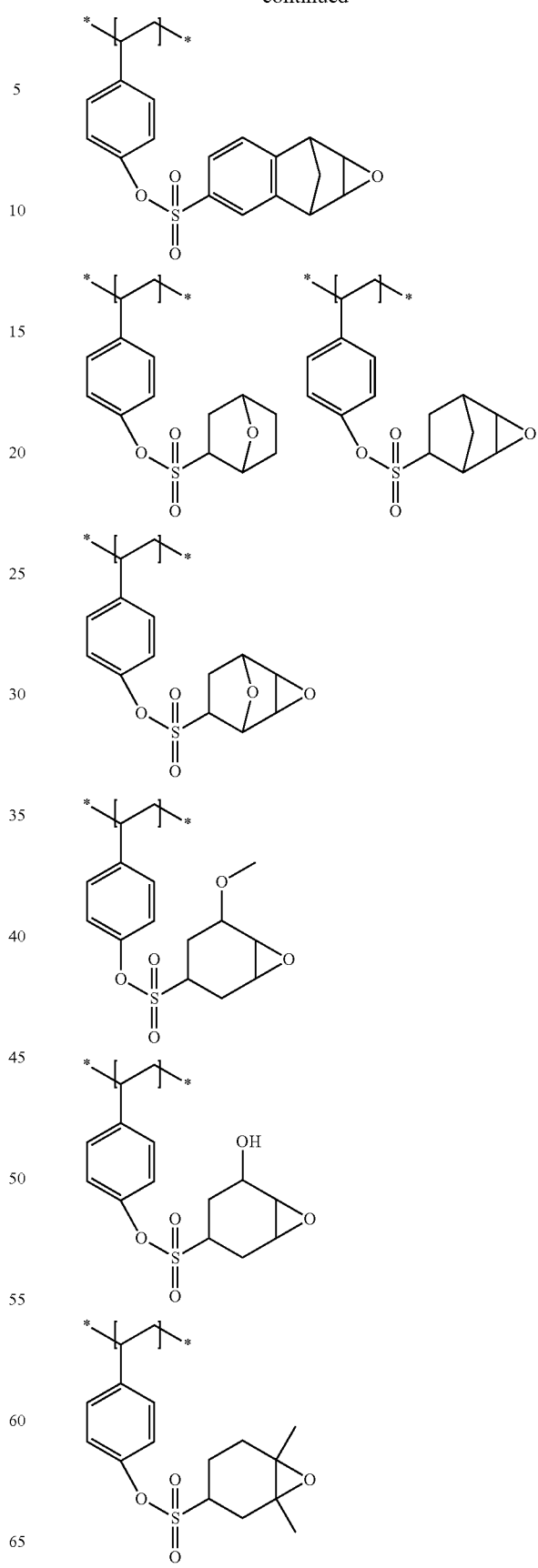

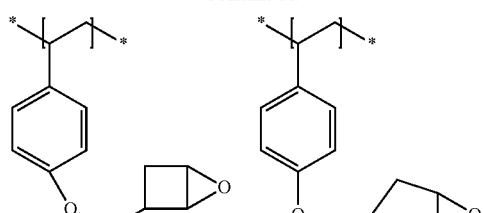
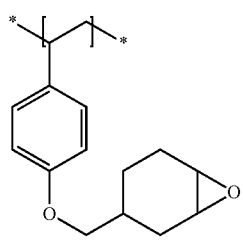
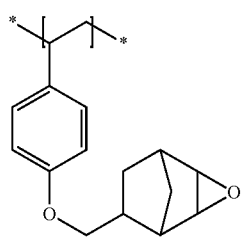
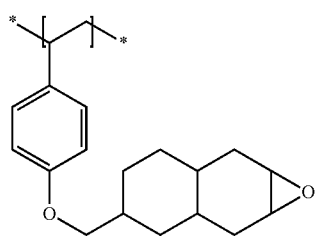
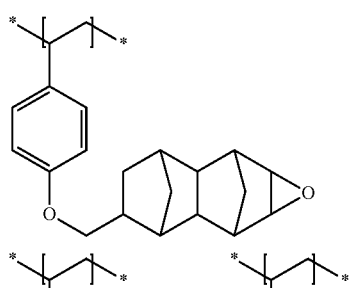
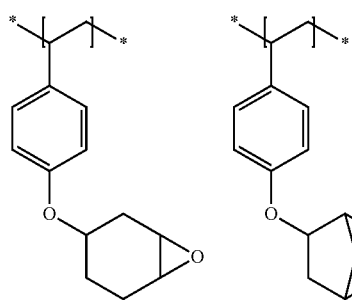
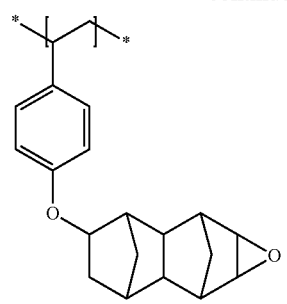
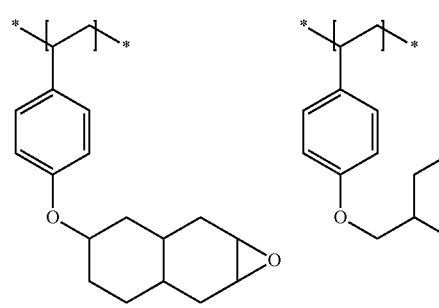
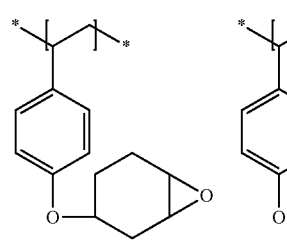
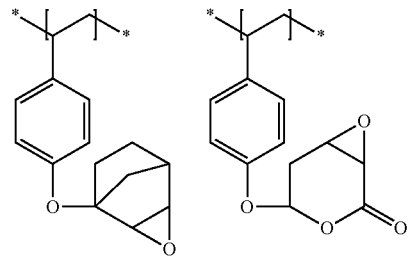
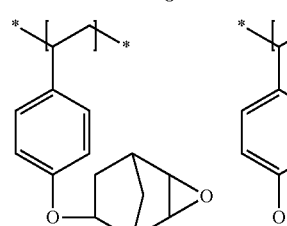
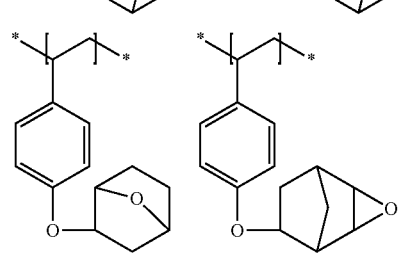

-continued
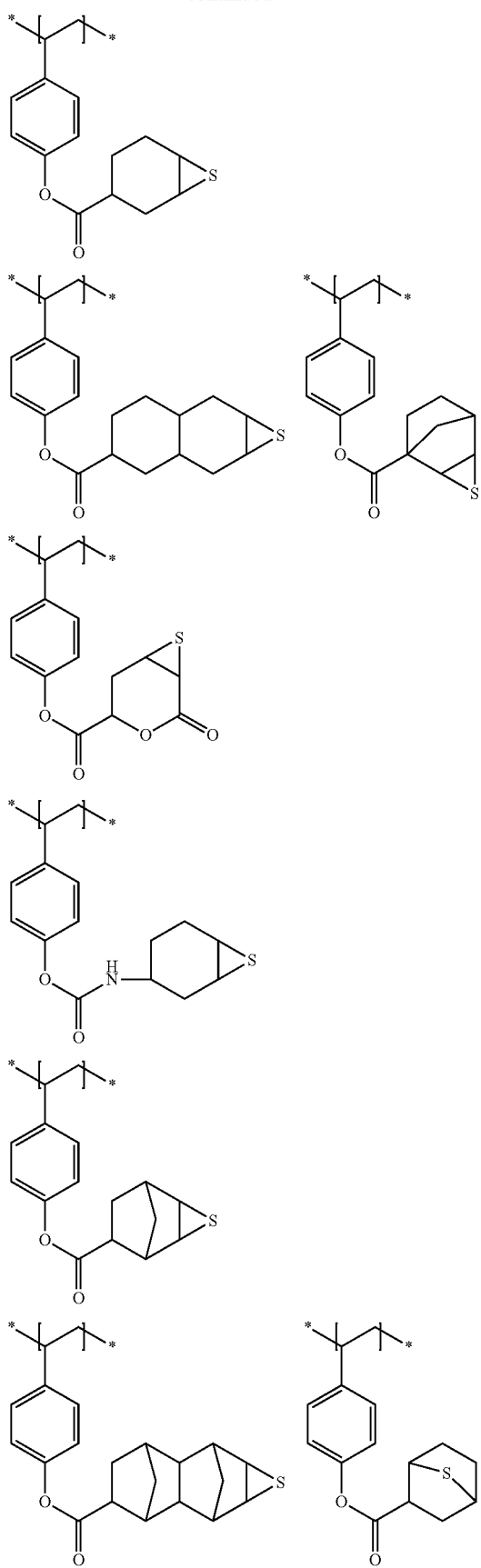
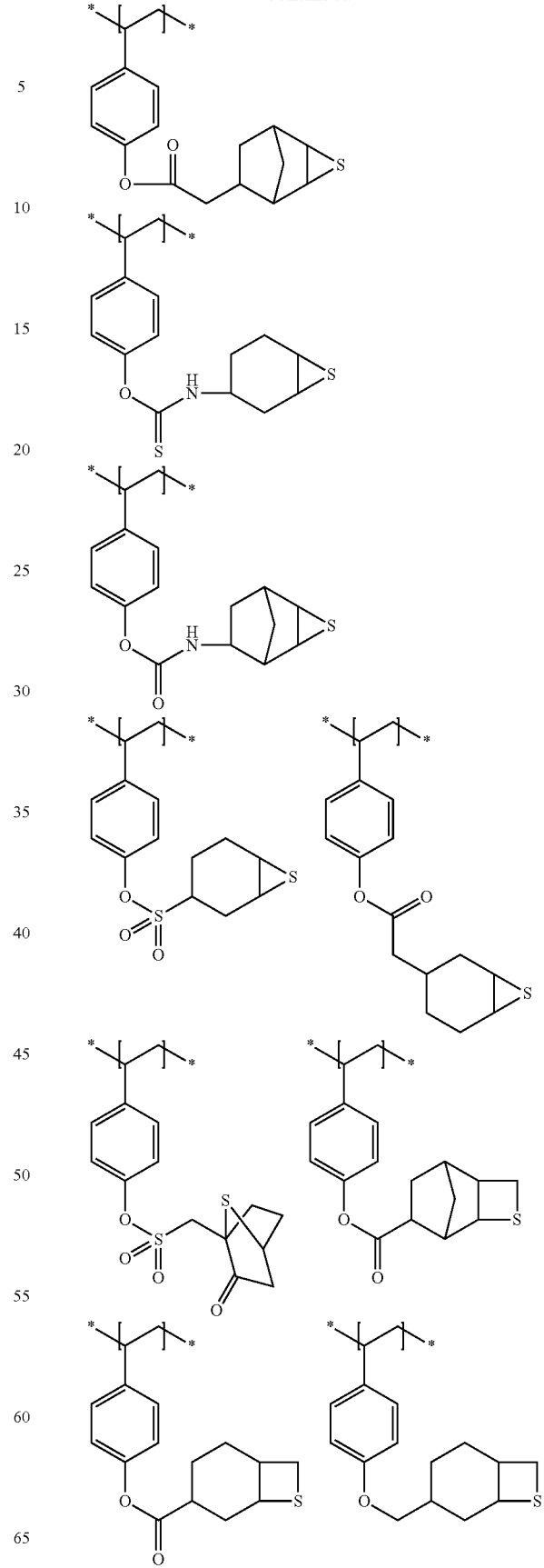

33
-continued
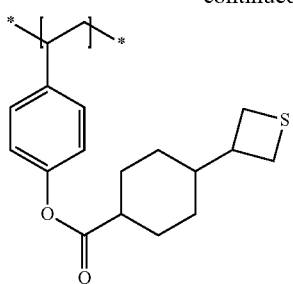
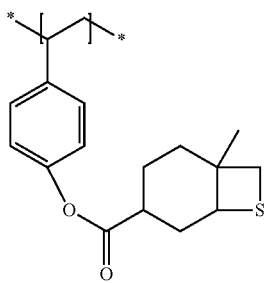
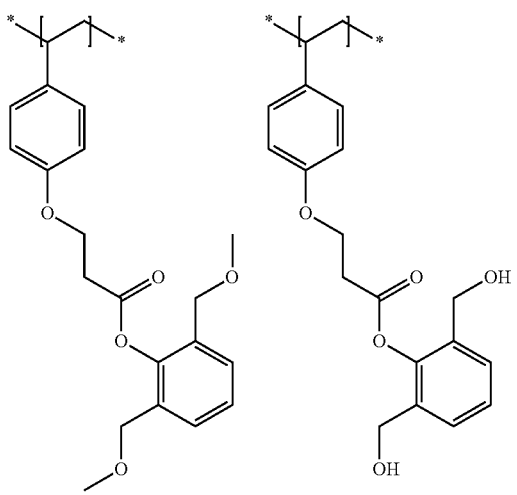
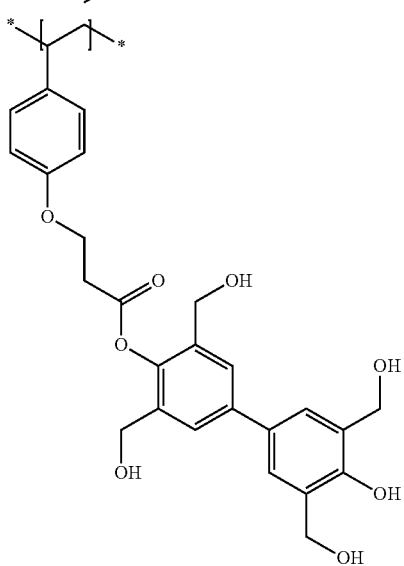
34
-continued
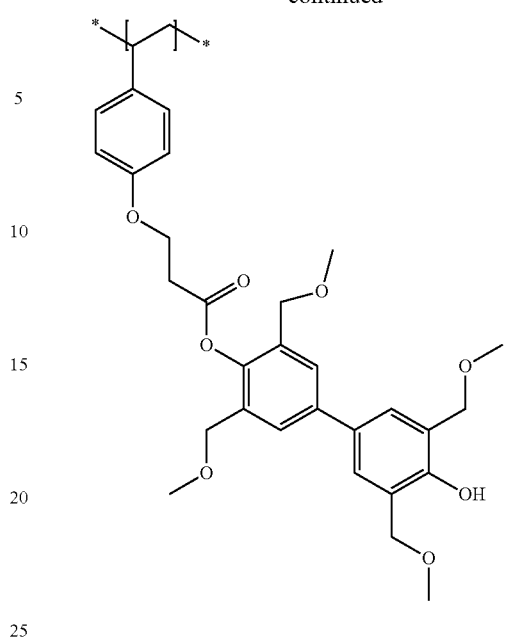
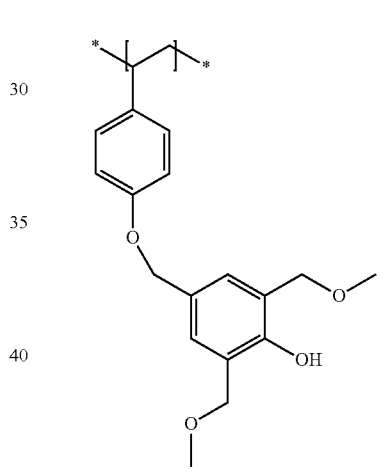
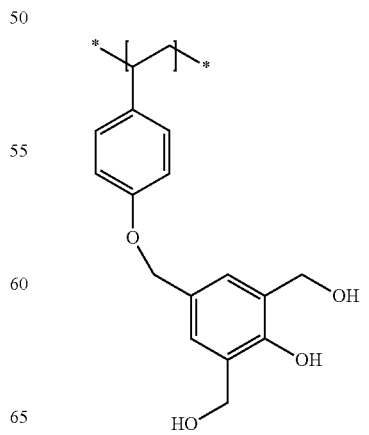

35
-continued
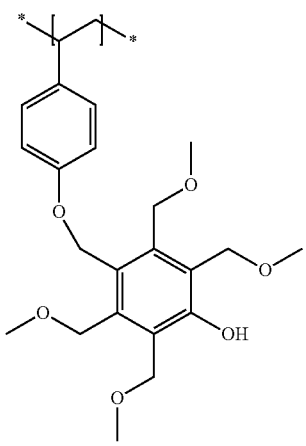
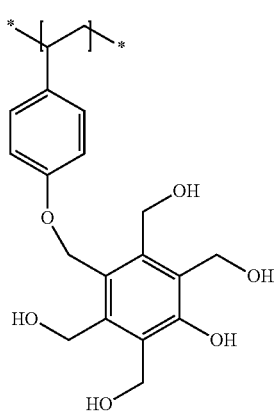
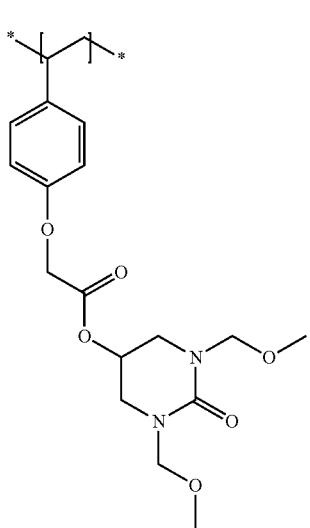
36
-continued
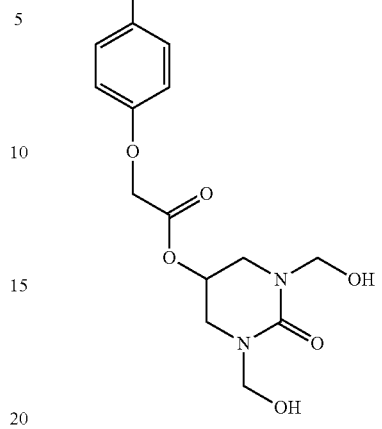
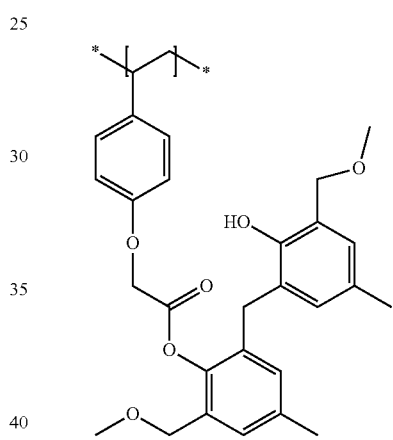
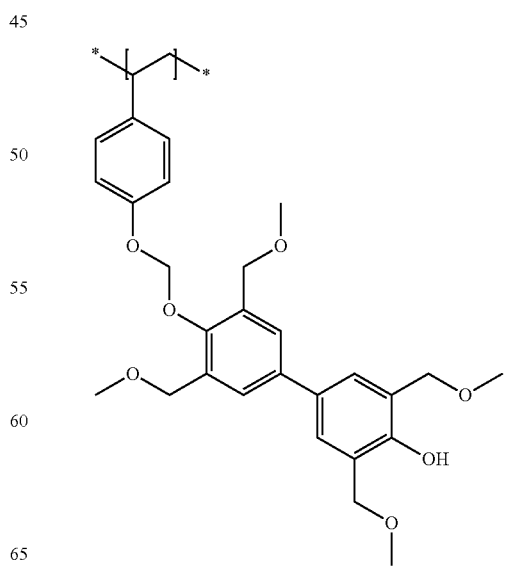

-continued

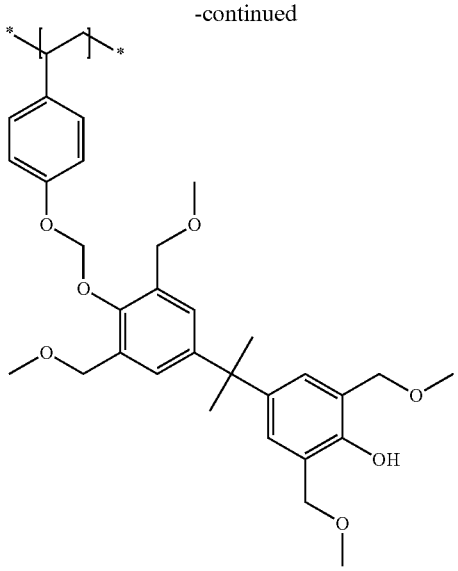

When the compound (A) is a polymeric compound, it is preferred for the structure (P) containing a phenolic hydroxyl group to be, in its one form, any of repeating units (P) of general formula (I) below.

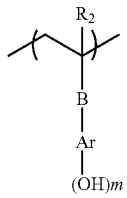

(I)

In the formula, $R_2$ represents a hydrogen atom, an optionally substituted methyl group or a halogen atom;

Ar represents an aromatic ring group;

m is an integer of 1 or greater; and

B represents a single bond or a bivalent organic group.

The bivalent organic group represented by B is preferably a carbonyl group, an alkylene group, a sulfonyl group, —O—, —NH—, or a group comprised of a combination of these.

B is most preferably a single bond or a carbonyloxy group.

As the optionally substituted methyl group represented by $R_2$, there can be mentioned a trifluoromethyl group, a hydroxymethyl group or the like.

$R_2$ is preferably a hydrogen atom.

The aromatic ring in the aromatic ring group represented by Ar is a monocyclic or polycyclic aromatic ring. As such, there can be mentioned an optionally substituted aromatic hydrocarbon ring having 6 to 18 carbon atoms, such as a benzene ring, a naphthalene ring, an anthracene ring, a fluorene ring or a phenanthrene ring, or an aromatic ring heterocycle containing a heteroring, such as a thiophene ring, a furan ring, a pyrrole ring, a benzothiophene ring, a benzofuran ring, a benzopyrrole ring, a triazine ring, an imidazole ring, a benzimidazole ring, a triazole ring, a thiadiazole ring or a triazole ring. Of these, a benzene ring and a naphthalene ring are preferred from the viewpoint of resolution. A benzene ring is most preferred.

In the formula, m is preferably an integer of 1 to 5, most preferably 1. When m is 1 and Ar is a benzene ring, the position of —OH substitution may be any of the para-, meta- and ortho-positions to the site of bonding to the principal chain of the polymer in the benzene ring. However, the para-position is preferred from the viewpoint of alkali developability.

A substituent other than the above —OH group may be introduced in the aromatic ring in the aromatic ring group represented by Ar. As the substituent, there can be mentioned, for example, an alkyl group, a halogen atom, a hydroxyl group, an alkoxy group, a carboxyl group, an alkoxycarbonyl group, an alkylcarbonyl group, an alkylcarbonyloxy group, an alkylsulfonyloxy group or an arylcarbonyl group.

The repeating unit (P) in its one form is more preferably expressed by general formula (II) below.

(II)

In the formula, $R_2$, Ar and m are as defined above in general formula (I).

The repeating unit (P) in its one form has further more preferably a structure expressed by general formula (III) below.

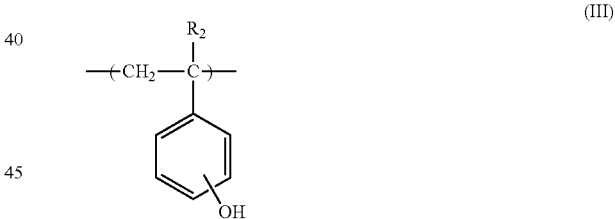

(III)

In the formula, $R_2$ represents a hydrogen atom or a methyl group.

The content of repeating unit (P), based on all the repeating units of the polymeric compound (A), is preferably in the range of 10 to 90 mol %, more preferably 30 to 90 mol % and further more preferably 40 to 90 mol %. Especially when the resist film is thin (for example, when the thickness of the resist film is in the range of 10 to 150 nm), this content ensures secure lowering of the rate of dissolution of exposed areas in an alkali developer in the resist film formed using the polymeric compound (A) according to the present invention (namely, the dissolution rate of the resist film formed using the polymeric compound (A) can be securely regulated to an optimum level). As a result, an enhancement of sensitivity can be securely attained.

Nonlimiting particular examples of the repeating units of general formula (I) are shown below.

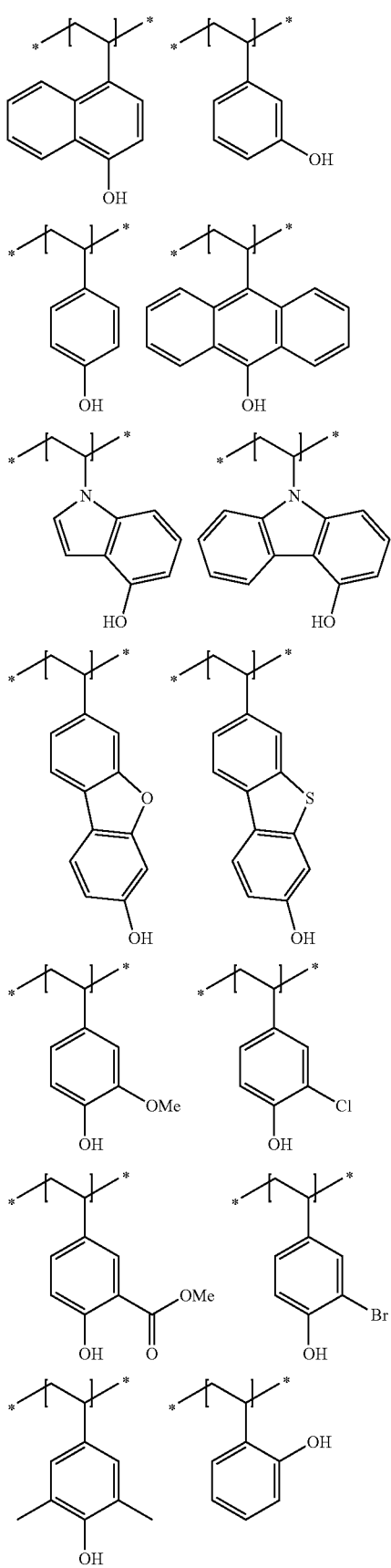
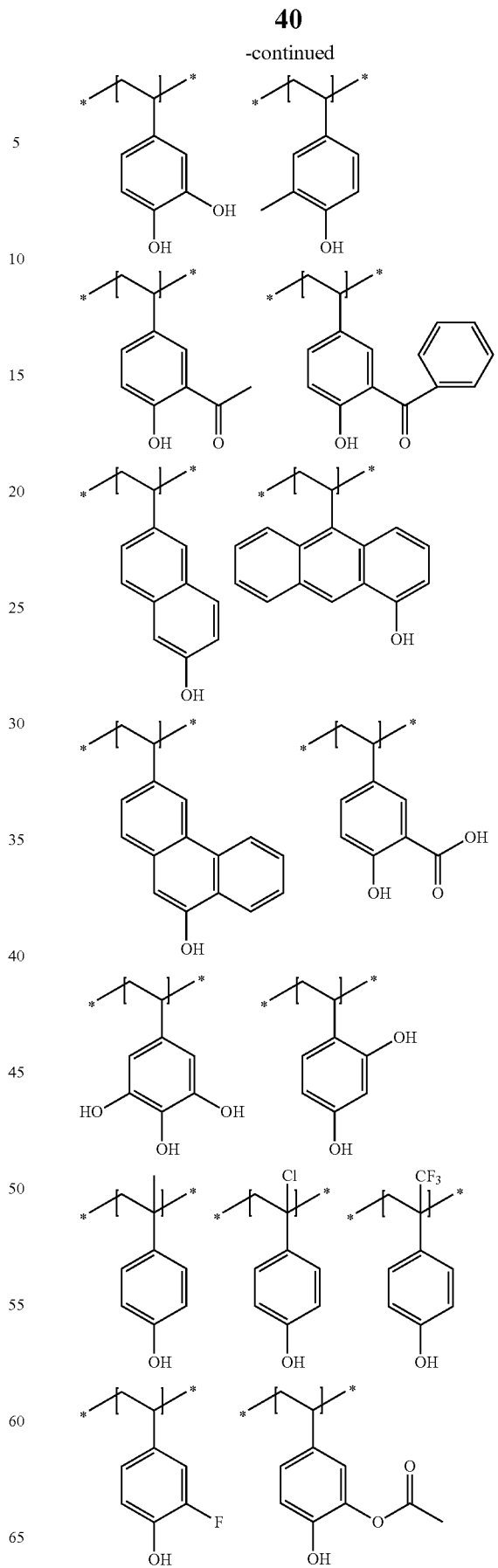

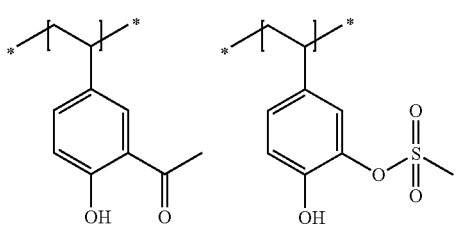
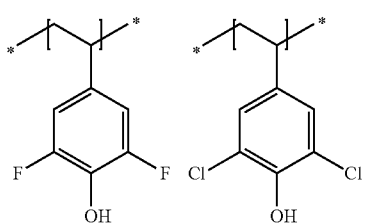
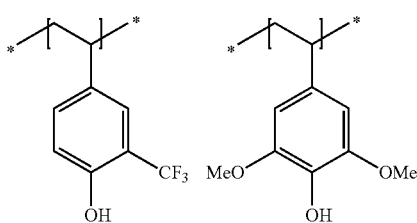
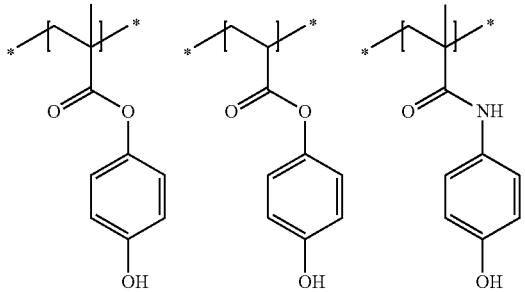
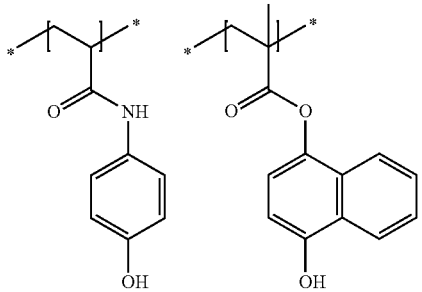
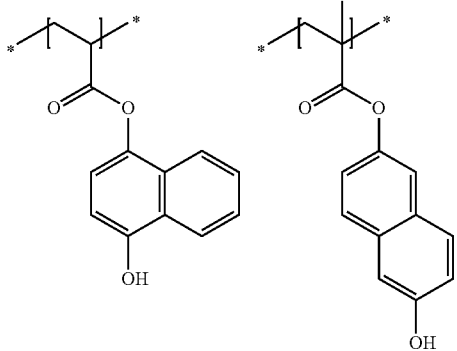
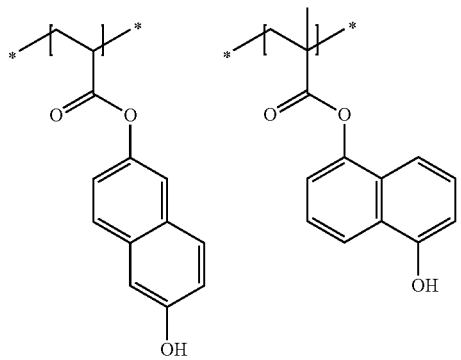
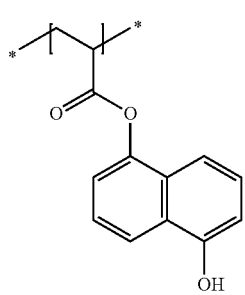
In one mode of the present invention, it is preferred for the compound (A) to be a polymeric compound comprising two repeating units shown below.
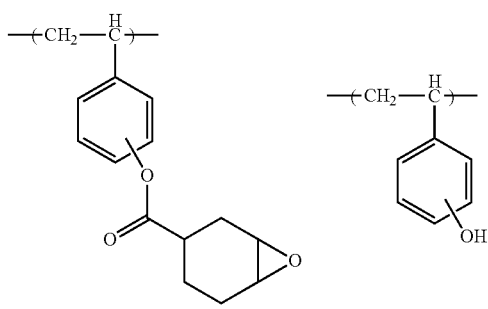
In another mode of the present invention, it is preferred for the compound (A) to be a polymeric compound comprising two repeating units shown below.
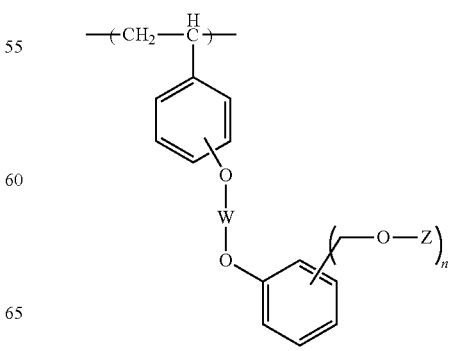

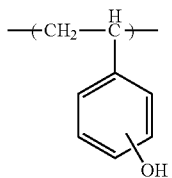

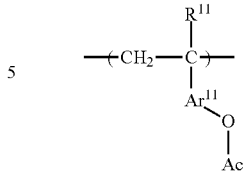

In the formulae, W, Z and n are as defined above in general formula (3).

The polymeric compound (A) may comprise repeating units other than the repeating units (P) and repeating units (Q).

For example, when the composition of the present invention is used in the formation of a so-called positive pattern, it is necessary for the compound (A) to further comprise a repeating unit (hereinafter may be referred to as a "repeating unit containing an acid-decomposable group") which contains a group that when acted on by an acid, is decomposed to thereby produce an alkali-soluble group.

As the alkali-soluble group, there can be mentioned a phenolic hydroxyl group, a carboxyl group, a fluoroalcohol group, a sulfonic acid group, a sulfonamido group, a sulfonylimido group, an (alkylsulfonyl)(alkylcarbonyl)methylene group, an (alkylsulfonyl)(alkylcarbonyl)imido group, a bis (alkylcarbonyl)methylene group, a bis(alkylcarbonyl)imido group, a bis(alkylsulfonyl)methylene group, a bis(alkylsulfonyl)imido group, a tris(alkylcarbonyl)methylene group, a tris (alkylsulfonyl)methylene group or the like.

The alkali-soluble group is preferably a phenolic hydroxyl group, a carboxyl group, a fluoroalcohol group (preferably a hexafluoroisopropanol group) or a sulfonic acid group.

The acid-decomposable group is preferably a group resulting from replacement of the hydrogen atom of each of these alkali-soluble groups with a group leaving under the action of an acid.

As the group leaving under the action of an acid, there can be mentioned, for example, —C($R_{36}$)($R_{37}$)($R_{38}$), —C($R_{36}$) ($R_{37}$)(O$R_{39}$), —C($R_{01}$)($R_{02}$)(O$R_{39}$) or the like.

In the formulae, each of $R_{36}$ to $R_{39}$ independently represents an alkyl group, a cycloalkyl group, a monovalent aromatic ring group, a group comprised of an alkylene group combined with a monovalent aromatic ring group, or an alkenyl group. $R_{36}$ and $R_{37}$ may be bonded to each other to thereby form a ring.

Each of $R_{01}$ and $R_{02}$ independently represents a hydrogen atom, an alkyl group, a cycloalkyl group, a monovalent aromatic ring group, a group comprised of an alkylene group combined with a monovalent aromatic ring group, or an alkenyl group.

As the repeating unit containing an acid-decomposable group, the repeating units of general formula (4) below are preferred since high reactivity, less sensitivity change in postbake and less process change during production can be realized. The repeating units of general formula (4) are those each containing in its side chain an acetal group or ketal group being a group that in a positive composition, is decomposed under the action of an acid to become an alkali-soluble group.

In the formula, $R^{11}$ represents a hydrogen atom or a methyl group. $Ar^{11}$ represents an arylene group. Ac represents a group leaving under the action of an acid. —OAc represents an acetal group or ketal group that is decomposed under the action of an acid to thereby produce an alkali-soluble group.

Preferred forms of the repeating units of general formula (4) are described in detail below.

In general formula (4), as mentioned above, $R^{11}$ represents a hydrogen atom or a methyl group. A hydrogen atom is especially preferred.

In general formula (4), as mentioned above, $Ar^{11}$ represents an arylene group in which a substituent may be introduced. The arylene group represented by $Ar^{11}$ is preferably an optionally substituted arylene group having 6 to 18 carbon atoms; more preferably an optionally substituted phenylene group or naphthylene group; and most preferably an optionally substituted phenylene group. As the substituent optionally introduced in $Ar^{11}$, there can be mentioned, for example, an alkyl group, a halogen atom, a hydroxyl group, an alkoxy group, a carboxyl group, an alkoxycarbonyl group or the like.

In the repeating units of general formula (4), when $Ar^{11}$ is a phenylene group, the position of bonding of —OAc to the benzene ring of $Ar^{11}$ may be any of the para-, meta- and ortho-positions to the site of bonding of the benzene ring to the principal chain of the polymer. However, the para- or meta-position is preferred.

As mentioned above, in general formula (4), Ac represents a group leaving under the action of an acid. —OAc represents an acetal group or ketal group that is decomposed under the action of an acid to thereby produce an alkali-soluble group. Ac in its one form is preferably any of the groups of general formula (5) below.

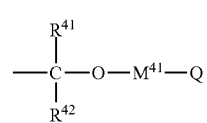

In general formula (5), each of $R^{41}$ and $R^{42}$ independently represents a hydrogen atom, an alkyl group, a cycloalkyl group, an aryl group or an aralkyl group.

$M^{41}$ represents a single bond or a bivalent connecting group.

Q represents an alkyl group, an alicyclic group optionally containing a heteroatom or an aromatic ring group optionally containing a heteroatom.

At least two of $R^{41}$, $R^{42}$, $M^{41}$ and Q may be bonded to each other to thereby form a ring. It is preferred for the formed ring to be a 5- or 6-membered ring.

The alkyl group represented by each of $R^{41}$ and $R^{42}$ is, for example, an alkyl group having 1 to 8 carbon atoms. As preferred examples thereof, there can be mentioned a methyl group, an ethyl group, a propyl group, an isopropyl group, an n-butyl group, a sec-butyl group, a tert-butyl group, a hexyl group and an octyl group.

The cycloalkyl group represented by each of $R^{41}$ and $R^{42}$ is, for example, a cycloalkyl group having 3 to 15 carbon atoms. As preferred examples thereof, there can be mentioned a cyclohexyl group, a norbornyl group and an adamantyl group.

The aryl group represented by each of $R^{41}$ and $R^{42}$ is, for example, an aryl group having 6 to 15 carbon atoms. As preferred examples thereof, there can be mentioned a phenyl group, a tolyl group, a naphthyl group and an anthryl group.

The aralkyl group represented by each of $R^{41}$ and $R^{42}$ is, for example, an aralkyl group having 7 to 20 carbon atoms. As preferred examples thereof, there can be mentioned a benzyl group and a phenethyl group.

It is especially preferred for each of $R^{41}$ and $R^{42}$ to be a hydrogen atom, a methyl group, a phenyl group or a benzyl group. Preferably, at least either $R^{41}$ or $R^{42}$ is a hydrogen atom (namely, —OAc is an acetal group that is decomposed under the action of an acid to thereby produce an alkali-soluble group).

The bivalent connecting group represented by $M^{41}$ is preferably, for example, an alkylene group (preferably one having 1 to 8 carbon atoms, e.g., a methylene group, an ethylene group, a propylene group, a butylene group, a hexylene group or an octylene group), a cycloalkylene group (preferably one having 3 to 15 carbon atoms, e.g., a cyclopentylene group or a cyclohexylene group), —S—, —O—, —CO—, —CS—, —SO₂—, —N(R₀)— or a combination of two or more of these having up to 20 carbon atoms in total. $R_0$ represents a hydrogen atom or an alkyl group (for example, an alkyl group having 1 to 8 carbon atoms; in particular, a methyl group, an ethyl group, a propyl group, an n-butyl group, a sec-butyl group, a hexyl group, an octyl group or the like).

$M^{41}$ is preferably a single bond, an alkylene group, or a bivalent connecting group comprised of an alkylene group combined with at least one of —O—, —CO—, —CS— and —N(R₀)—; more preferably a single bond, an alkylene group, or a bivalent connecting group comprised of an alkylene group combined with —O—. $R_0$ is as defined above.

The alkyl group represented by Q is the same as those set forth above as being represented by $R^{41}$ and $R^{42}$.

As examples of the alicyclic groups and aromatic ring groups represented by Q, there can be mentioned those set forth above with respect to the cycloalkyl groups and aryl groups represented by $R^{41}$ and $R^{42}$. Each thereof preferably has 3 to 15 carbon atoms. In the present invention, a group (for example, a biphenyl group or a terphenyl group) comprised of a plurality of aromatic rings connected to each other through a single bond is also included in the aromatic ring groups represented by Q.

As the alicyclic group containing a heteroatom and aromatic ring group containing a heteroatom, there can be mentioned, for example, thiirane, cyclothiorane, thiophene, furan, pyrrole, benzothiophene, benzofuran, benzopyrrole, triazine, imidazole, benzimidazole, triazole, thiadiazole, triazole and pyrrolidone. In the present invention, a group (for example, a viologen group) comprised of a plurality of "aromatic rings containing a heteroatom" connected to each other through a single bond is also included in the aromatic ring groups containing a heteroatom represented by Q.

Substituents may be introduced in the alicyclic group optionally containing a heteroatom and aromatic ring group optionally containing a heteroatom represented by Q. As the substituents, there can be mentioned, for example, an alkyl group, a cycloalkyl group, a cyano group, a halogen atom, a hydroxyl group, an alkoxy group, a carboxyl group and an alkoxycarbonyl group.

It is especially preferred for (-$M^{41}$-Q) to be a methyl group, an aryloxyethyl group, a cyclohexylethyl group or an arylethyl group.

As an instance in which a ring is formed by the mutual bonding of at least two of $R^{41}$, $R^{42}$, $M^{41}$ and Q, there can be mentioned, for example, one in which either $M^{41}$ or Q is bonded to $R^{41}$ to thereby form a propylene group or a butylene group, followed by formation of a 5-membered or 6-membered ring containing an oxygen atom.

When Nc denoting the sum of carbons of $R^{41}$, $R^{42}$, $M^{41}$ and Q is large, the polymeric compound (A) exhibits a large change of alkali dissolution rate between before and after the leaving of groups of general formula (5), thereby favorably realizing an enhancement of dissolution contrast. Nc is preferably in the range of 4 to 30, more preferably 7 to 25 and most preferably 7 to 20. It is preferred for Nc to be up to 30 from the viewpoint that lowering of the glass transition temperature of the polymeric compound (A) can be suppressed to thereby inhibit not only deterioration of the exposure latitude (EL) of the resist but also remaining of any residue resulting from the leaving of groups of general formula (5) on the resist pattern as a defect.

From the viewpoint of dry etching resistance, it is preferred for at least one of $R^{41}$, $R^{42}$, $M^{41}$ and Q to contain an alicycle or an aromatic ring. This alicycle or aromatic ring is, for example, the same as any of those of the alicyclic groups or aromatic ring groups represented by Q as set forth above.

It is also preferred for the repeating unit containing an acid-decomposable group to be any of repeating units of general formula (6) below. The repeating units of general formula (6) are those that in a positive composition, are each decomposed under the action of an acid to thereby produce a carboxyl group being an alkali-soluble group in its side chain.

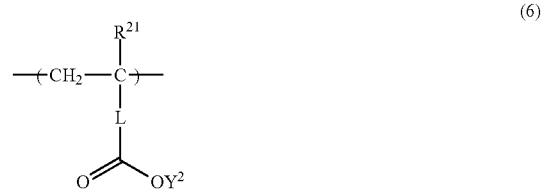

(6)

In the formula, $R^{21}$ represents a hydrogen atom or a methyl group. L represents a single bond or a bivalent connecting group. $Y^2$ represents a group leaving under the action of an acid.

Preferred forms of the repeating units of general formula (6) will be described below.

In general formula (6), $R^{21}$ represents a hydrogen atom or a methyl group as mentioned above, most preferably a hydrogen atom.

As the bivalent connecting group represented by L, there can be mentioned, for example, an alkylene group, a cycloalkylene group, an arylene group, —O—, —SO₂—, —CO—, —N($R_N$)—, a combination of two or more of these or the like. Herein, $R_N$ represents an aryl group, an alkyl group or a cycloalkyl group.

The alkylene group represented by L is preferably one having 1 to 10 carbon atoms. For example, there can be mentioned a methylene group, an ethylene group, a propylene group, a butylene group, a hexylene group, an octylene group or the like.

The cycloalkylene group represented by L is preferably one having 5 to 10 carbon atoms. For example, there can be mentioned a cyclopentylene group, a cyclohexylene group or the like.

The arylene group represented by L is preferably one having 4 to 20 carbon atoms. For example, there can be mentioned a phenylene group, a naphthylene group or the like.

The aryl group represented by $R_N$ preferably has 4 to 20 carbon atoms, more preferably 6 to 14 carbon atoms. As the aryl group, there can be mentioned, for example, a phenyl group or a naphthyl group.

The alkyl group represented by $R_N$ preferably has 1 to 8 carbon atoms. As the alkyl group, there can be mentioned, for example, a methyl group, an ethyl group, a propyl group, a butyl group, a hexyl group or an octyl group.

The cycloalkyl group represented by $R_N$ preferably has 5 to 8 carbon atoms. As the cycloalkyl group, there can be mentioned, for example, a cyclopentyl group or a cyclohexyl group.

Substituents may further be introduced in the connecting groups represented by L. As particular examples of such substituents, there can be mentioned those set forth above as being further introducible in the aryl group represented by $Ar^{11}$.

As mentioned above, $Y^2$ represents a group leaving under the action of an acid. $Y^2$ in its one form is preferably any of the groups of the following general formula.

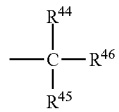

In the formula, each of $R^{44}$, $R^{45}$ and $R^{46}$ independently represents an alkyl group or a cycloalkyl group. Any two of $R^{44}$, $R^{45}$ and $R^{46}$ may be bonded to each other to thereby form a cycloalkyl group.

Each of the alkyl groups represented by $R^{44}$, $R^{45}$ and $R^{46}$ is preferably a linear or branched one having 1 to 4 carbon atoms.

Each of the cycloalkyl groups represented by $R^{44}$, $R^{45}$ and $R^{46}$ is preferably a monocycloalkyl group having 3 to 8 carbon atoms or a polycycloalkyl group having 7 to 20 carbon atoms.

The cycloalkyl group formed by the mutual bonding of any two of $R^{44}$, $R^{45}$ and $R^{46}$ is preferably a monocycloalkyl group having 3 to 8 carbon atoms or a polycycloalkyl group having 7 to 20 carbon atoms. A monocycloalkyl group having 5 or 6 carbon atoms is especially preferred.

A form in which $R^{46}$ is a methyl group or an ethyl group and in which $R^{44}$ and $R^{45}$ are bonded to each other to thereby form the above cycloalkyl group is more preferred.

$Y^2$ in its other form is preferably any of the groups of the following general formula.

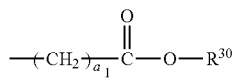

In the formula, $a_1$ is an integer of 1 to 6.

$R^{30}$ represents a tertiary alkyl group having 4 to 20 carbon atoms, preferably 4 to 15 carbon atoms; a trialkylsilyl group in which each of the alkyl groups has 1 to 6 carbon atoms; an oxoalkyl group having 4 to 20 carbon atoms; or any of the above-mentioned groups of $-C(R^{44})(R^{45})(R^{46})$.

As the tertiary alkyl group represented by $R^{30}$, there can be mentioned, for example, a tert-butyl group, a tert-amyl group, a 1,1-diethylpropyl group, a 1-ethylcyclopentyl group, a 1-butylcyclopentyl group, a 1-ethylcyclohexyl group, a 1-butylcyclohexyl group, a 1-ethyl-2-cyclopentenyl group, a 1-ethyl-2-cyclohexenyl group, a 2-methyl-2-adamantyl group or the like.

As the trialkylsilyl group, there can be mentioned, for example, a trimethylsilyl group, a triethylsilyl group, a dimethyl-tert-butylsilyl group or the like.

As the oxoalkyl group, there can be mentioned, for example, a 3-oxocyclohexyl group, a 4-methyl-2-oxooxan-4-yl group, a 5-methyl-2-oxo-oxolan-5-yl group or the like.

Nonlimiting particular examples of the repeating units containing acid-decomposable groups are shown below.

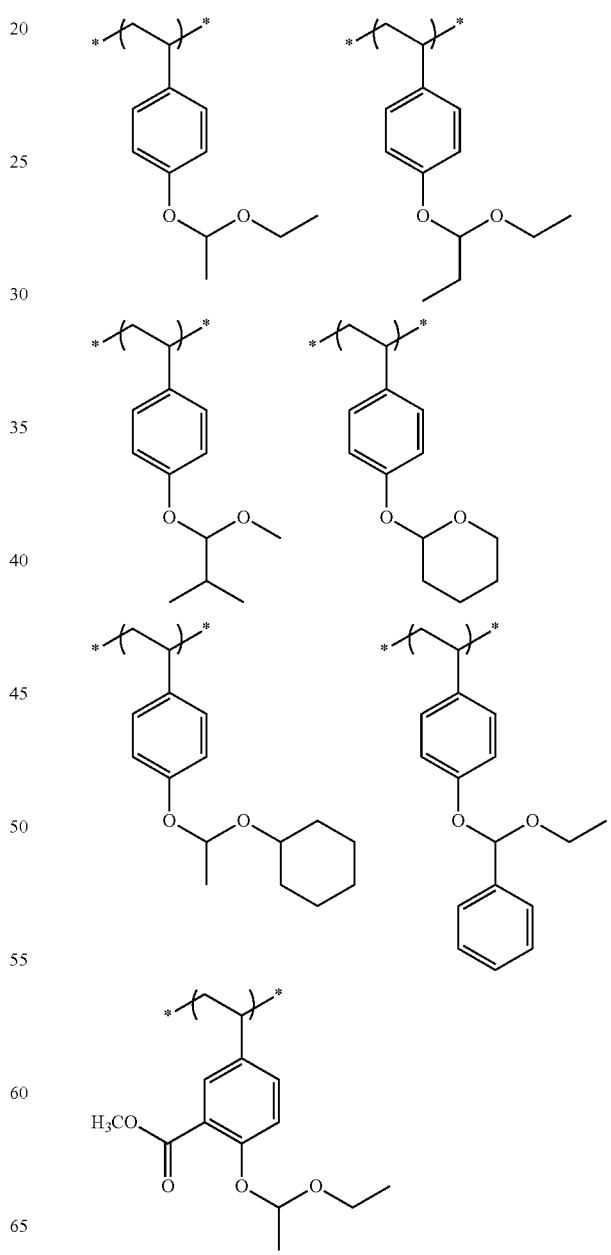

49
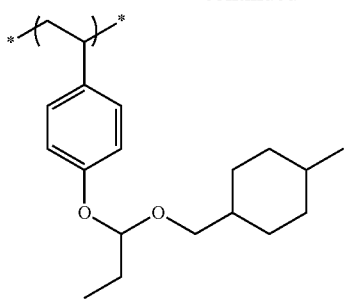
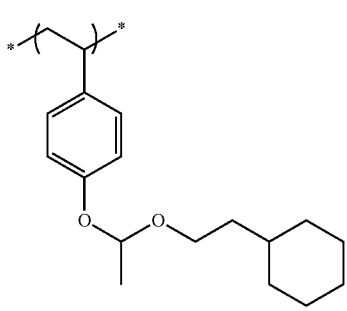
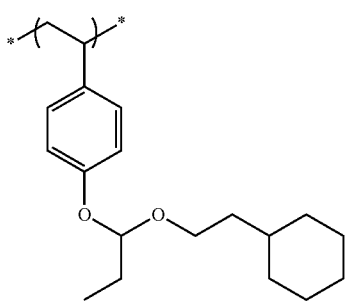
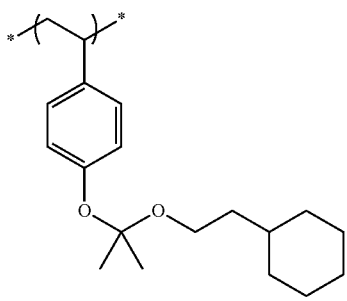
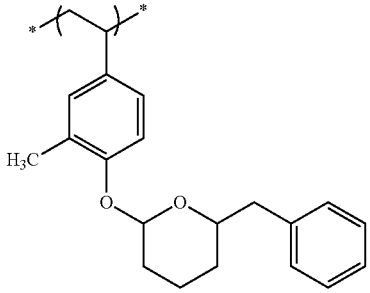
50
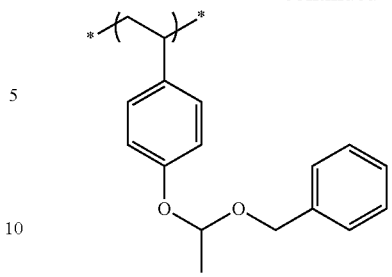
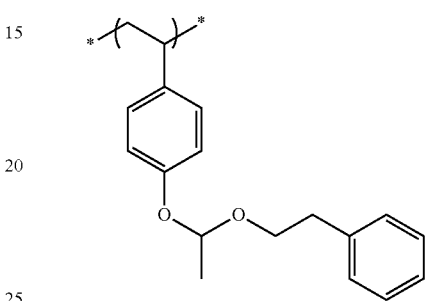
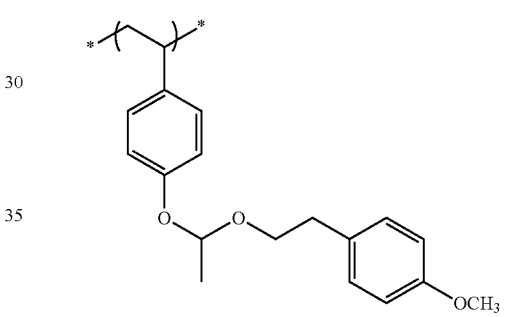
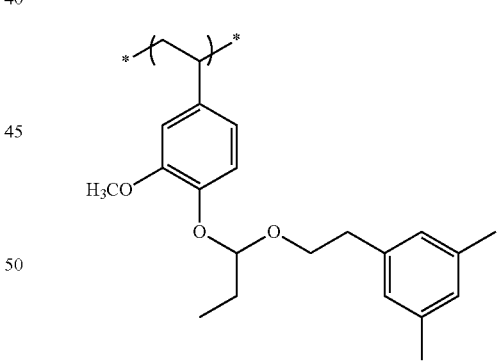
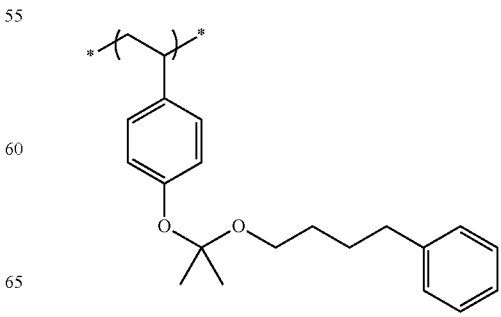

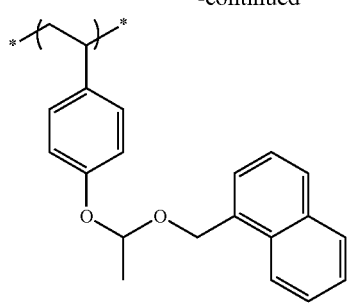
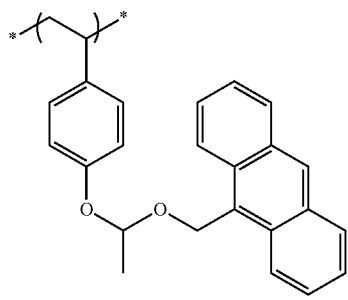
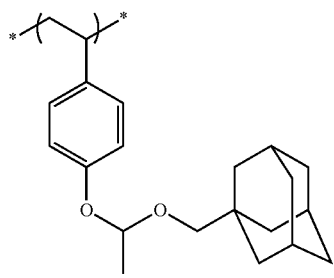
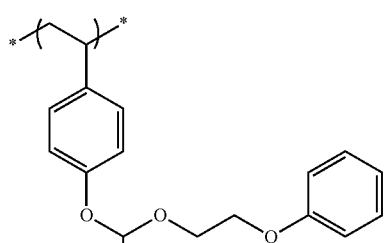
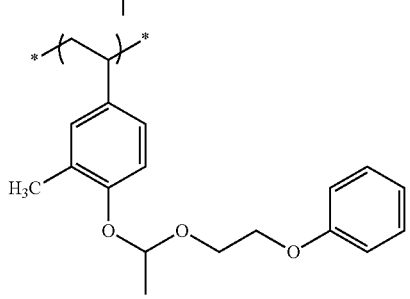
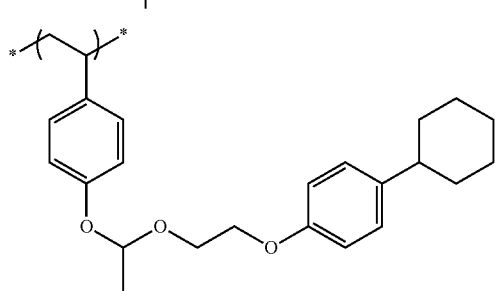
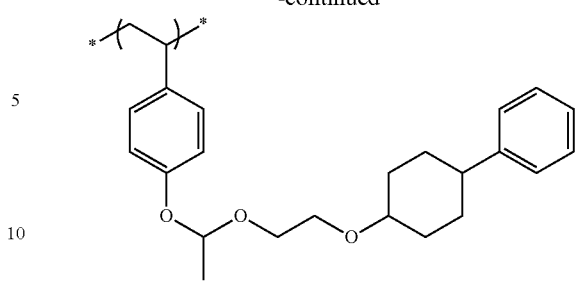
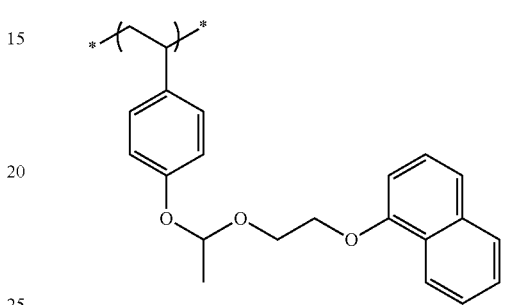
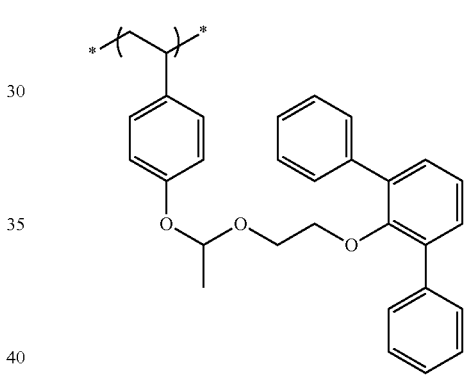
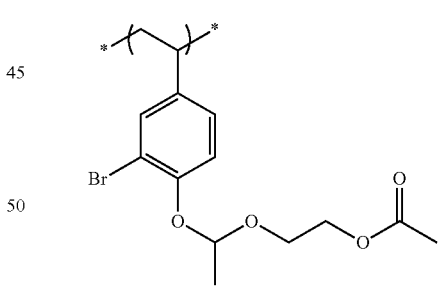
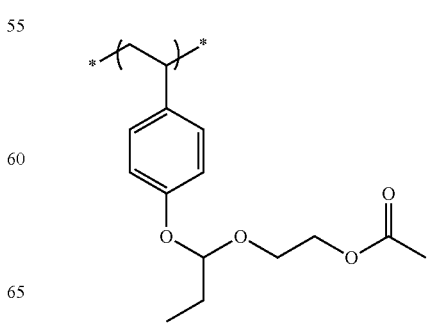

53
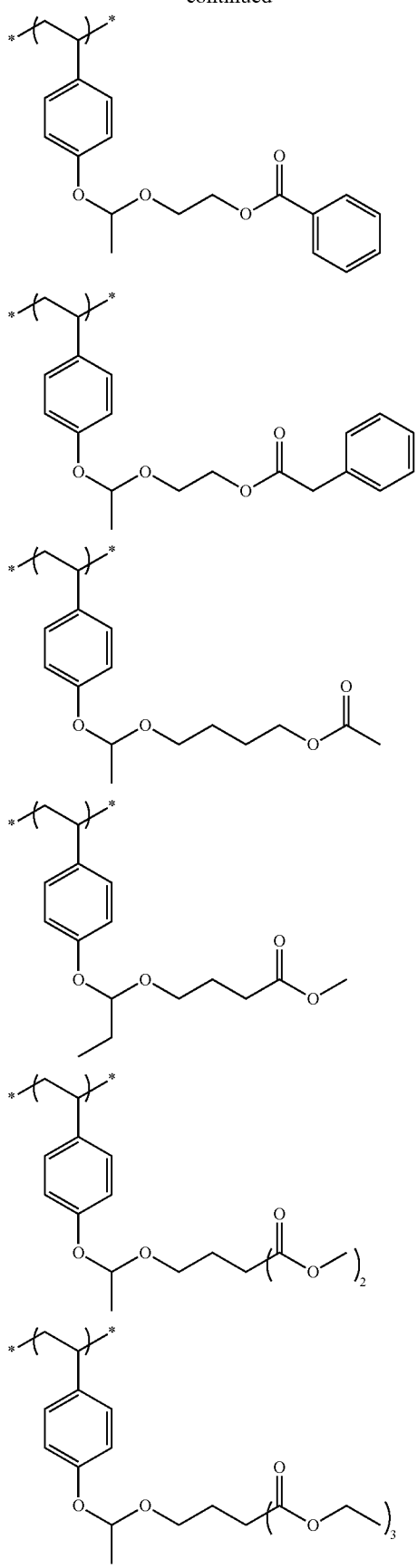
54
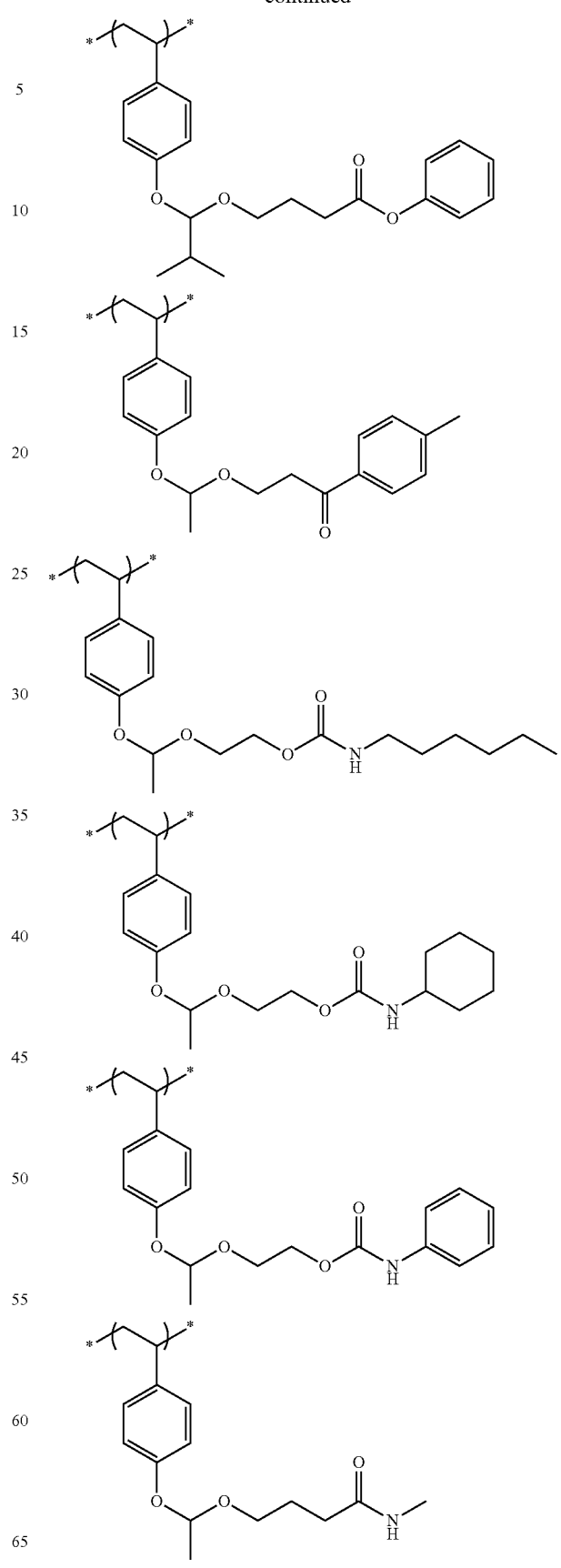

55
-continued
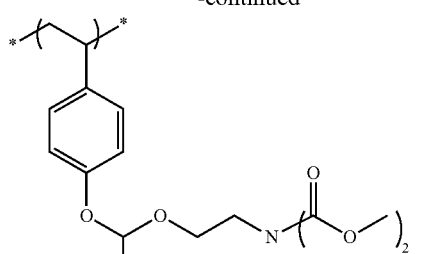
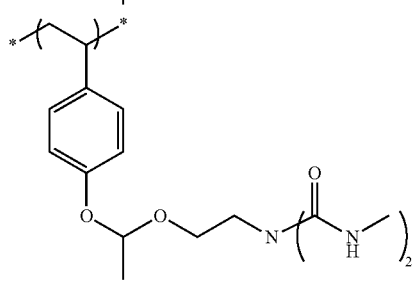
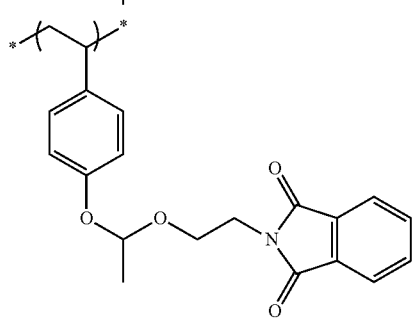
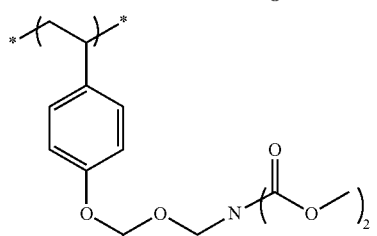
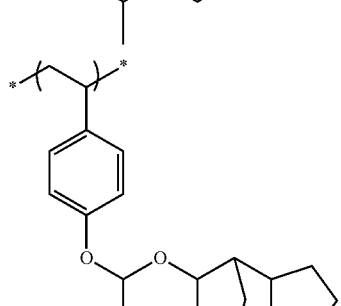
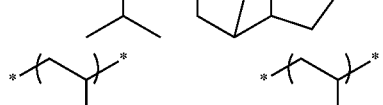
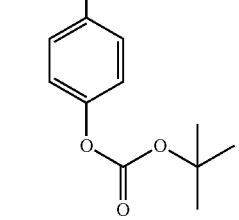
56
-continued
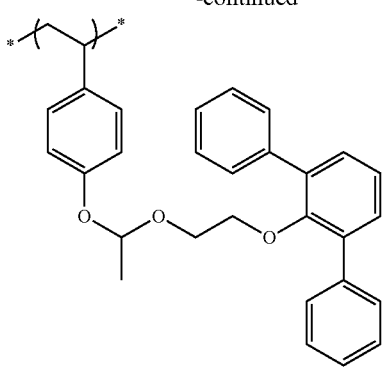
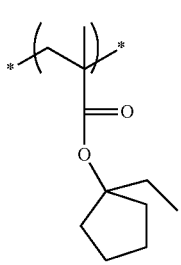
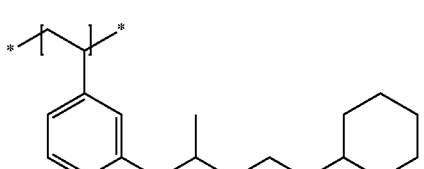
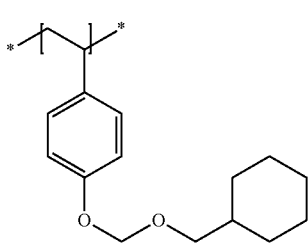
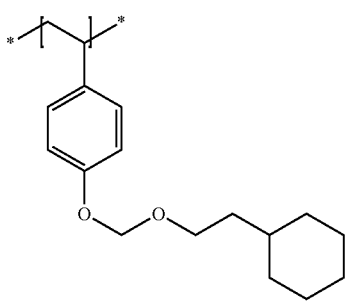
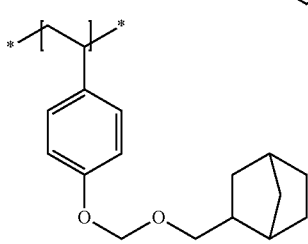

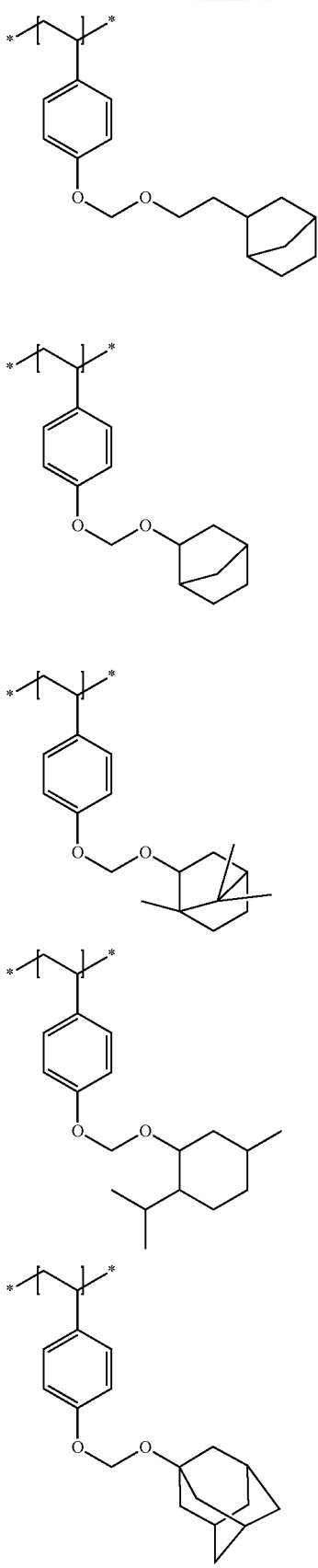
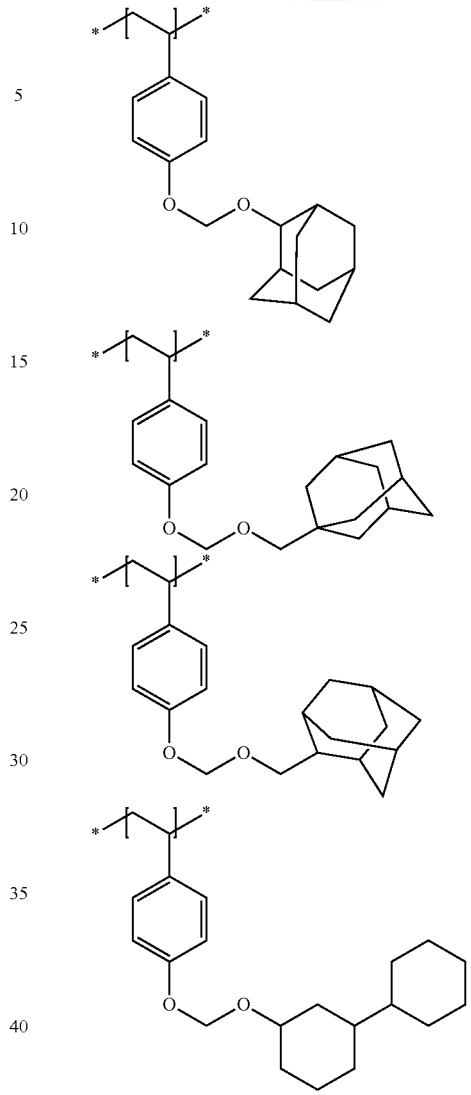

When the composition of the present invention is used in the formation of a positive pattern, the content of repeating unit containing an acid-decomposable group in the compound (A), based on all the repeating units of the compound (A), is preferably in the range of 5 to 70 mol %, more preferably 10 to 60 mol % and most preferably 15 to 50 mol %.

The compound (A) for use in the present invention in its one form may further comprise the following repeating units (hereinafter also referred to as "other repeating units") as units other than the foregoing repeating units.

As examples of polymerizable monomers for the formation of other repeating units, there can be mentioned styrene, an alkyl-substituted styrene, an alkoxy-substituted styrene, an O-alkylated styrene, an O-acylated styrene, a hydrogenated hydroxystyrene, maleic anhydride, an acrylic acid derivative (acrylic acid, an acrylic ester or the like), a methacrylic acid derivative (methacrylic acid, a methacrylic ester or the like), an N-substituted maleimide, acrylonitrile, methacrylonitrile, vinylnaphthalene, vinylanthracene, an optionally substituted indene and the like.

It is optional for the polymeric compound (A) to contain these other repeating units. When these other repeating units are contained, the content thereof in the polymeric compound (A), based on all the repeating units constituting the polymeric compound (A), is generally in the range of 1 to 20 mol %, preferably 2 to 10 mol %.

Moreover, the polymeric compound (A) in its other form preferably further comprises, as repeating units other than the foregoing repeating units, a repeating unit containing a group that is decomposed by the action of an alkali developer to thereby increase its solubility into the alkali developer and a repeating unit containing a photoacid generating group capable of generating an acid when exposed to actinic rays or radiation.

As the repeating unit containing a group that is decomposed by the action of an alkali developer to thereby increase its solubility into the alkali developer, there can be mentioned, for example, a repeating unit with a lactone structure or a phenyl ester structure, or the like. The repeating unit is preferably a repeating unit with a 5 to 7-membered ring lactone structure, more preferably a repeating unit with a structure resulting from the condensation of a 5 to 7-membered ring lactone structure with another cyclic structure effected in a fashion to form a bicyclo structure or spiro structure. Particular examples of the repeating units each containing a group that is decomposed by the action of an alkali developer to thereby increase its solubility into the alkali developer are shown below. In the formulae, Rx represents H, $CH_3$, $CH_2OH$ or $CF_3$.

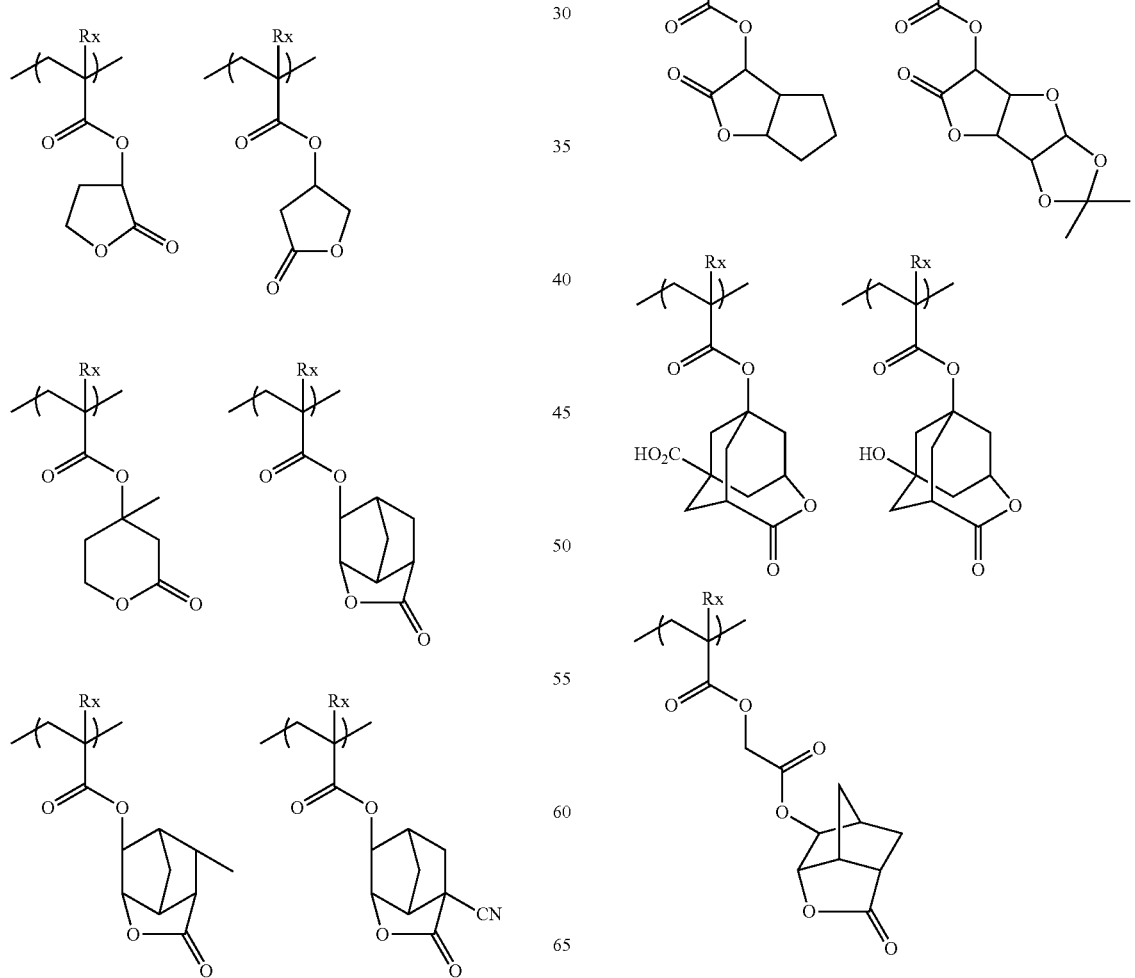

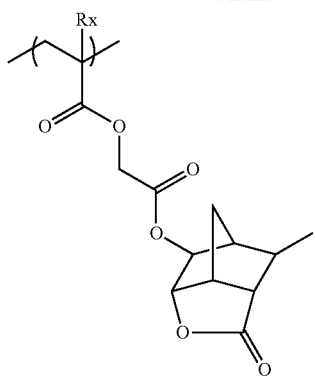
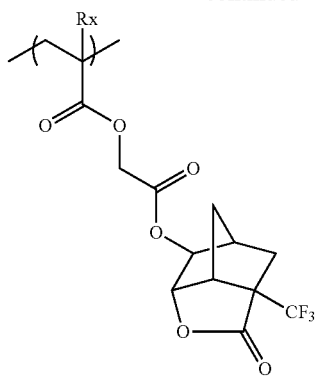
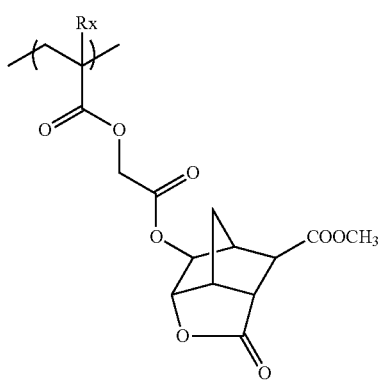
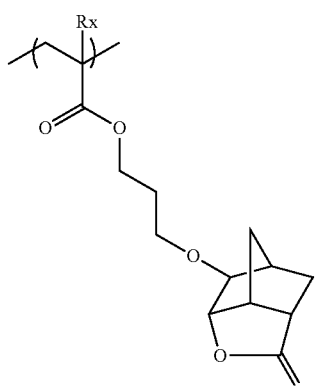
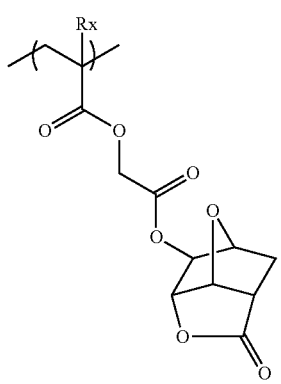
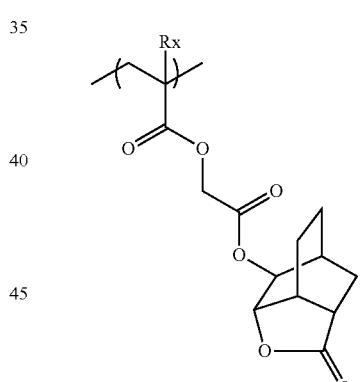
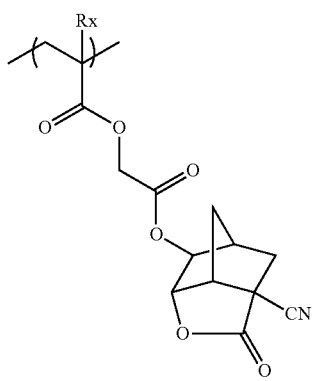
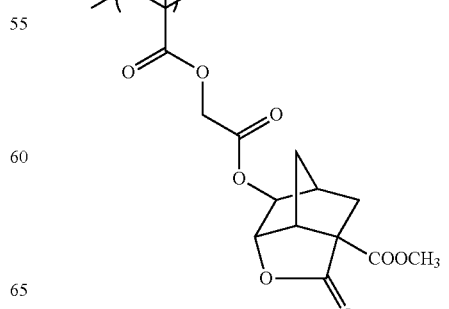

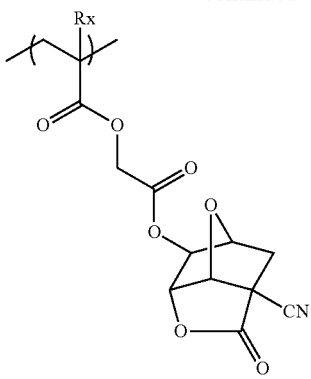

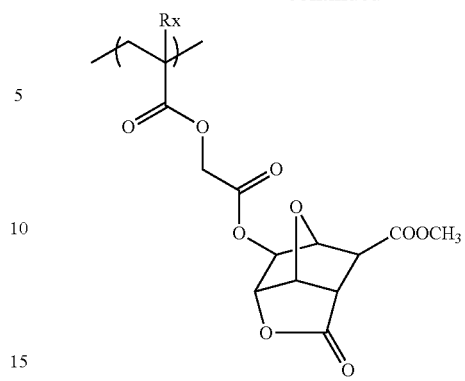

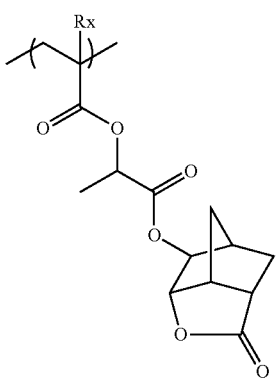

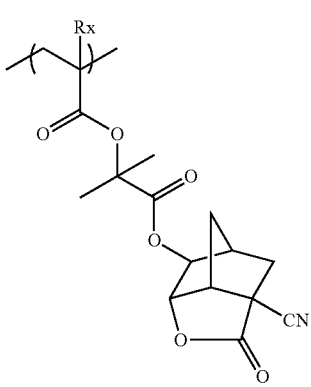

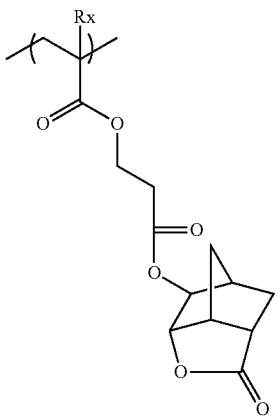

It is optional for the compound (A) to contain a repeating unit containing a group that is decomposed by the action of an alkali developer to thereby increase its solubility into the alkali developer. When the repeating unit is contained, the content thereof, based on all the repeating units of the compound (A), is preferably in the range of 5 to 50 mol %, more preferably 10 to 40 mol %, and further more preferably 15 to 30 mol %.

In the present invention, a repeating unit containing a photoacid generating group is preferably further contained as a repeating unit other than the foregoing repeating units. As such a repeating unit, there can be mentioned, for example, any of the repeating units described in section [0028] of JP-A-H9-325497 and repeating units described in sections [0038] to [0041] of JP-A-2009-93137. In this instance, it can be considered that the repeating unit containing a photoacid generating group corresponds to the compound (B) capable of generating an acid upon exposure to actinic rays or radiation to be described hereinafter.

Particular examples of the monomers corresponding to repeating units each containing a photoacid generating group are shown below as the structures of acids generated upon exposure to light.

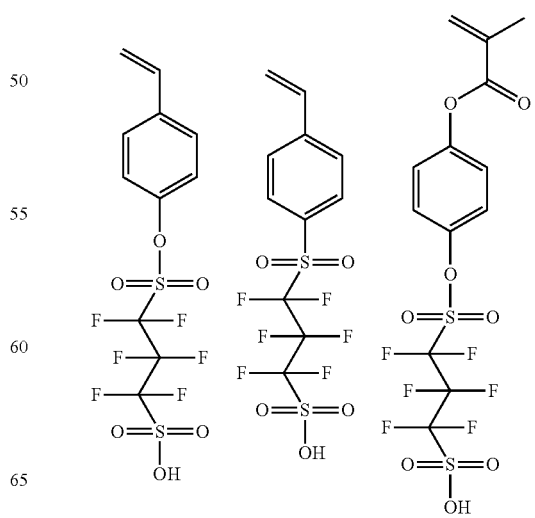

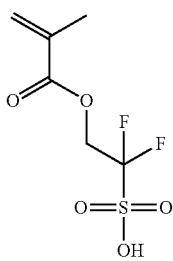

When the polymeric compound (A) comprises a repeating unit containing a photoacid generating group, the content of the repeating unit, based on all the repeating units of the polymeric compound (A), is preferably in the range of 1 to 40 mol %, more preferably 5 to 35 mol % and further more preferably 5 to 30 mol %.

The polymeric compound (A) can be synthesized from a monomer containing a polycyclic structure group including an acid crosslinking group in accordance with the generally known radical polymerization method or living radical polymerization method (for example, iniferter method).

The polymeric compound (A) is preferably synthesized by a method in which a polymer is synthesized by polymerizing a unit having a group including an acid crosslinking group in accordance with a radical polymerization method, living radical polymerization method or living anion polymerization method and in which the resultant polymer is modified by a polymer reaction.

In particular, the polymeric compound (A) containing an oxirane or oxetane ring as an acid crosslinking group is preferably synthesized by a method in which a polymer is synthesized by polymerizing a unit with a polycyclic structure containing an alkene in accordance with a radical polymerization method, living radical polymerization method or living anion polymerization method and in which the resultant polymer is modified by a polymer reaction and thereafter oxidized with an oxidizer agent (for example, aqueous hydrogen peroxide solution, mCPBA, etc.).

The weight average molecular weight of the polymeric compound (A) is preferably in the range of 1000 to 200,000, more preferably 2000 to 50,000 and further more preferably 2000 to 10,000.

The polydispersity index (molecular weight distribution, Mw/Mn) of the polymeric compound (A) is preferably 1.7 or below. From the viewpoint of sensitivity and resolution enhancements, the polydispersity index is more preferably in the range of 1.0 to 1.35, most preferably 1.0 to 1.20. The polydispersity index (molecular weight distribution) of obtained polymeric compound (A) preferably becomes uniform by employing a living polymerization, such as a living anion polymerization. The weight average molecular weight and polydispersity index of the polymeric compound (A) are defined as polystyrene-equivalent values determined by GPC.

The content of compound (A) in the composition of the present invention, based on the total solids of the composition, is preferably in the range of 30 to 95 mass %, more preferably 40 to 90 mass % and most preferably 50 to 85 mass %.

Particular examples of the polymeric compounds (A) are shown below.

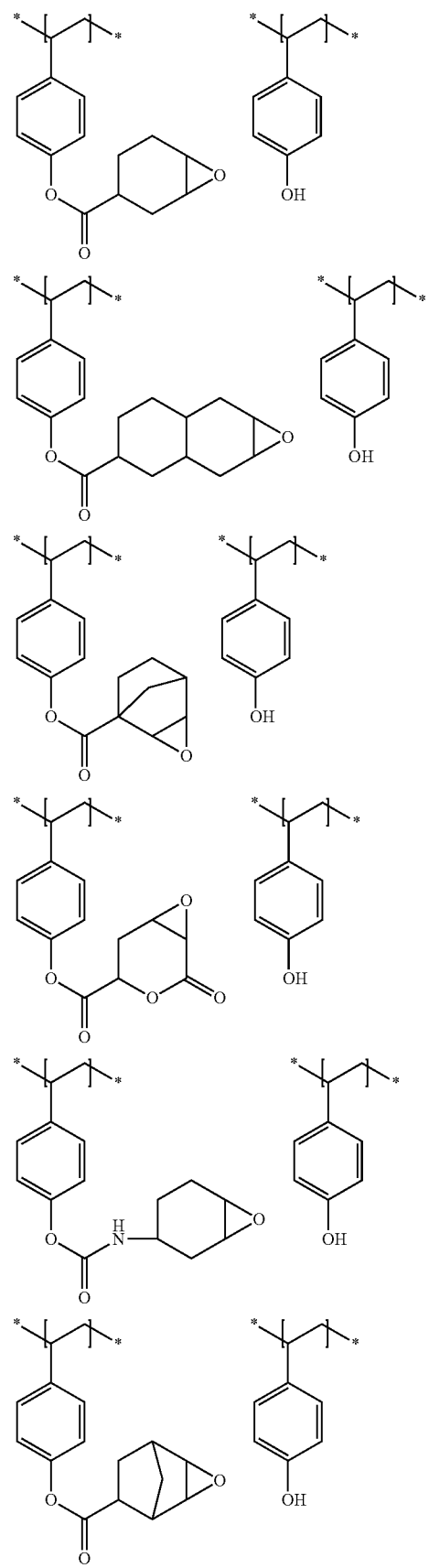

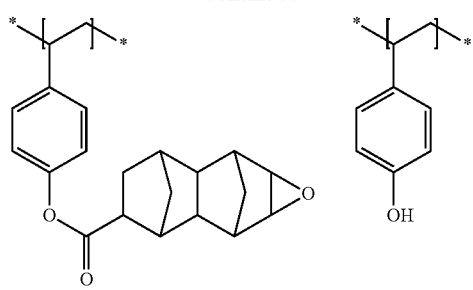
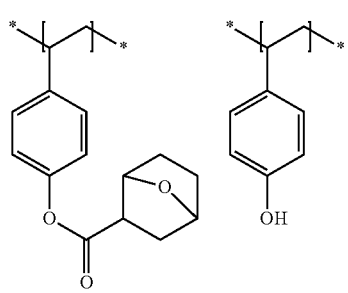
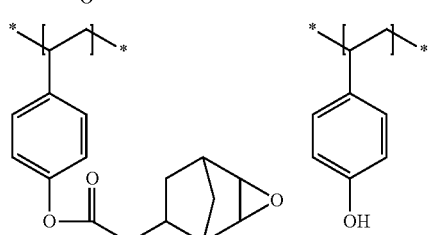
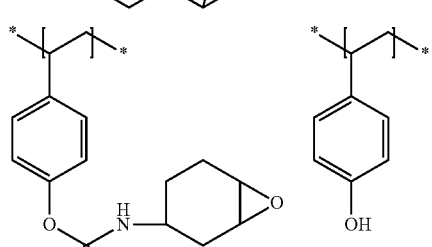
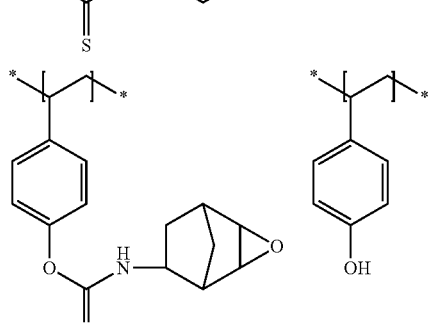
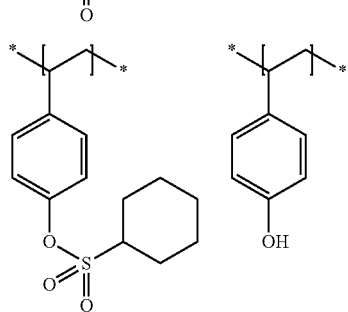
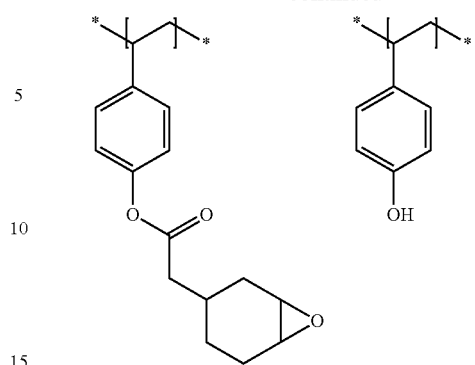
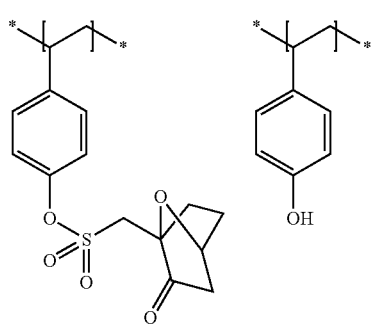
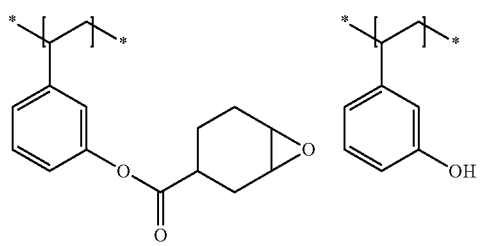
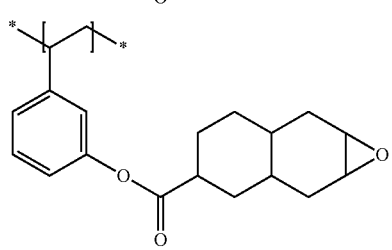
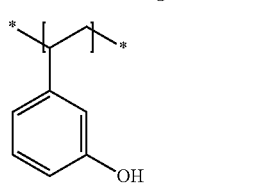
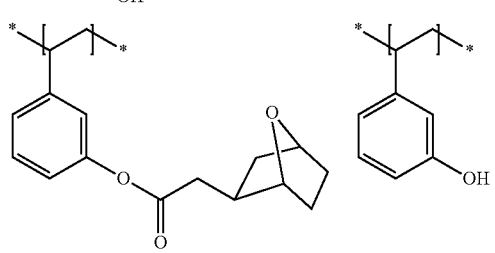

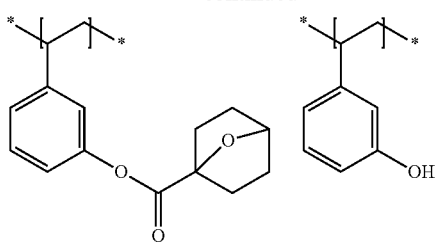
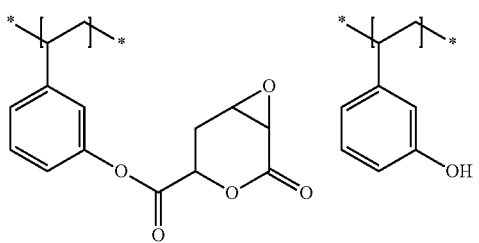
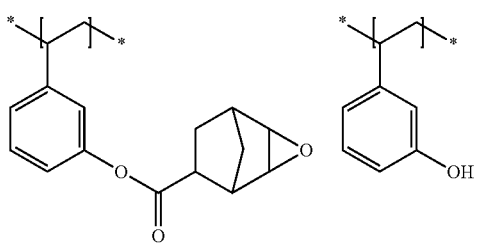
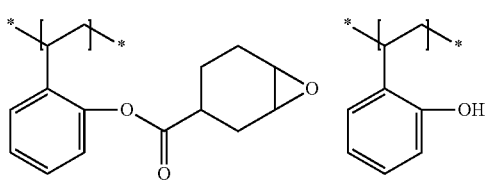
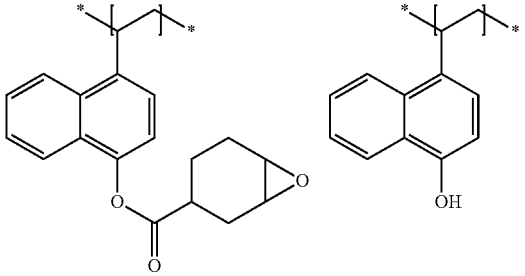
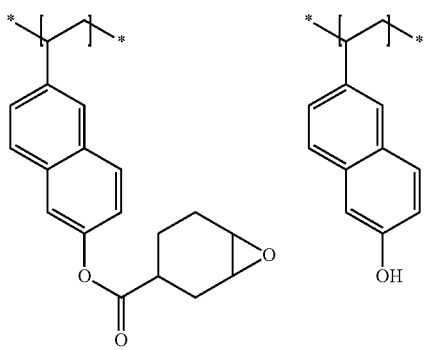
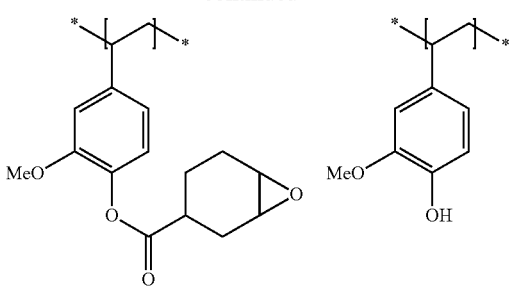
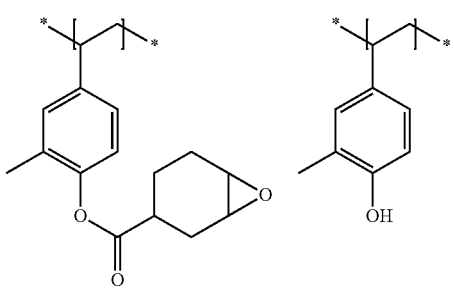
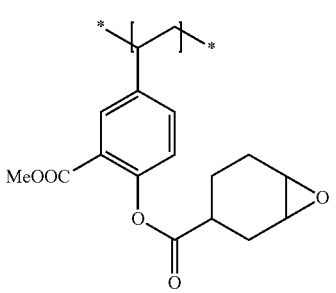
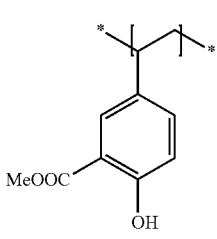
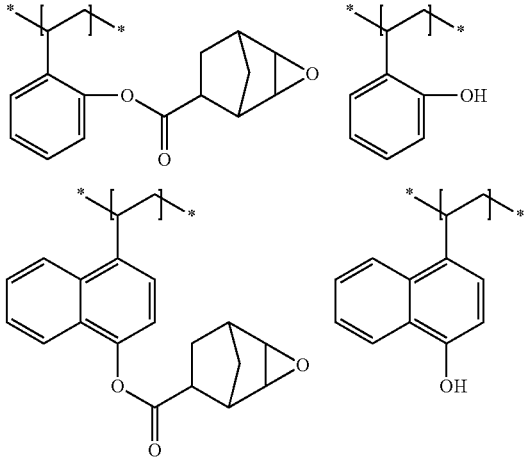

71 72
-continued -continued
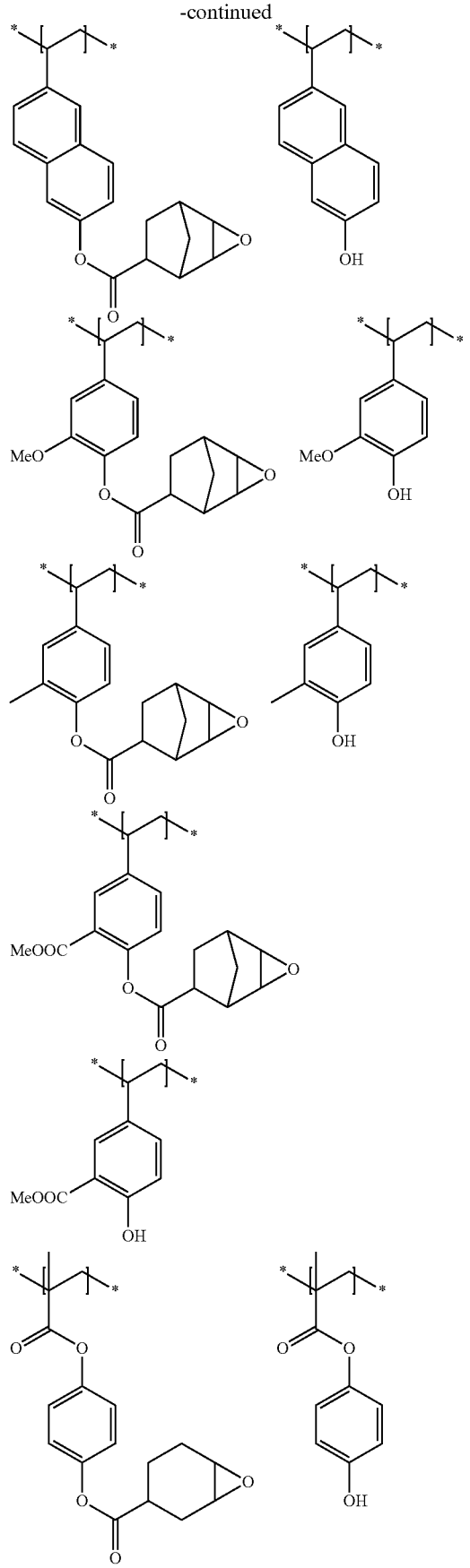
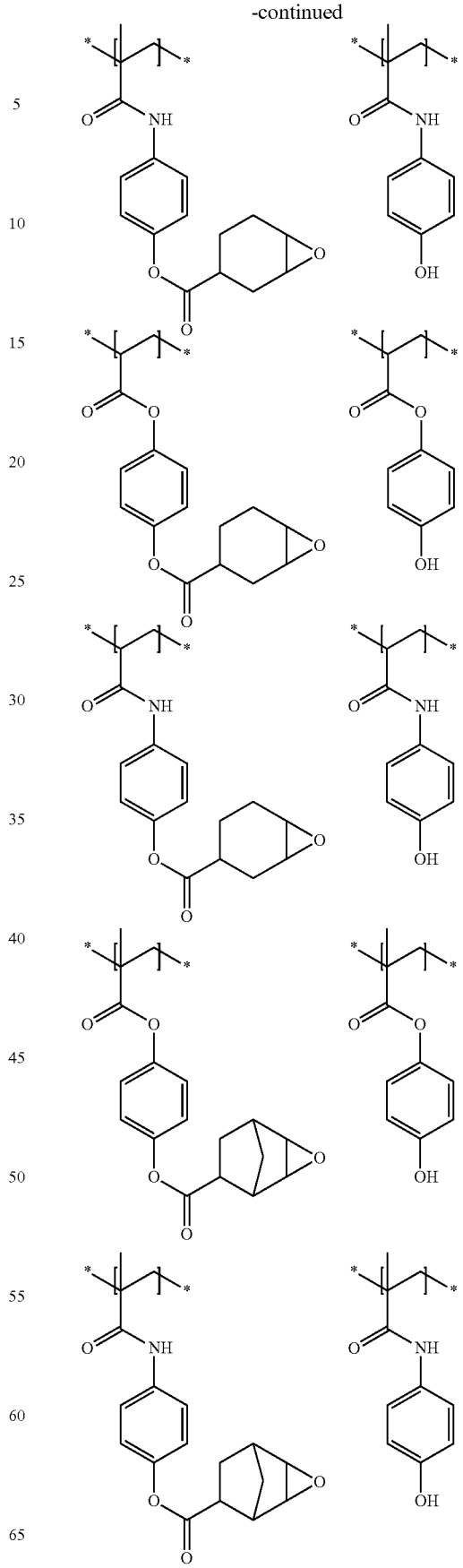

73
-continued
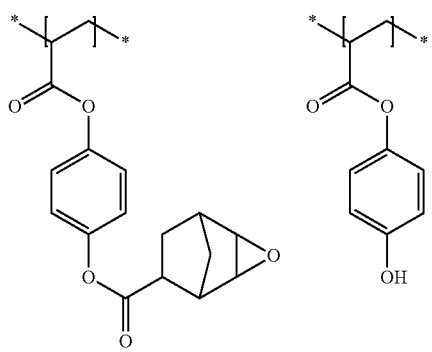
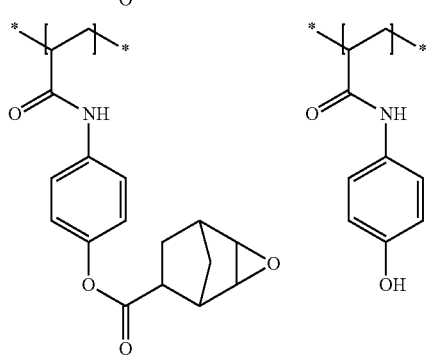
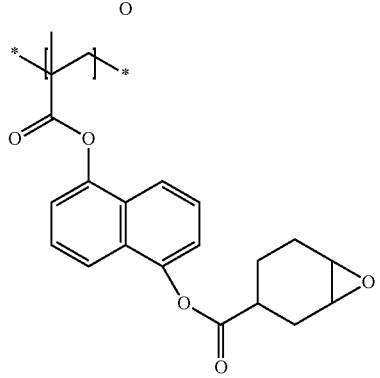
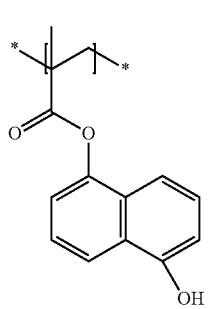
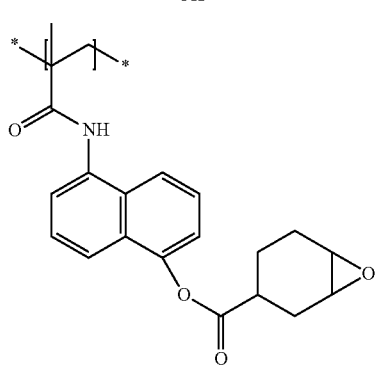
74
-continued
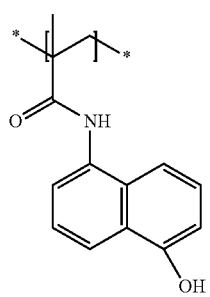
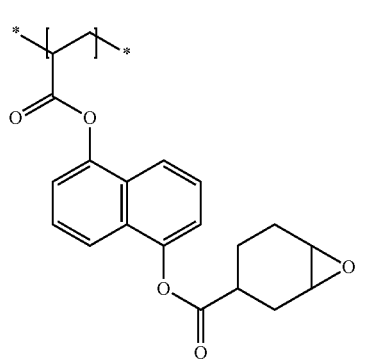
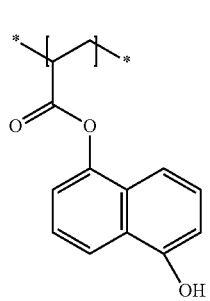
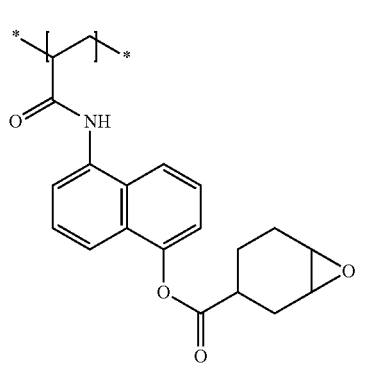
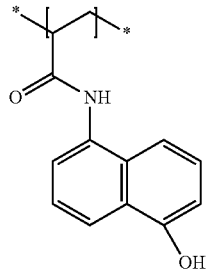

75
-continued
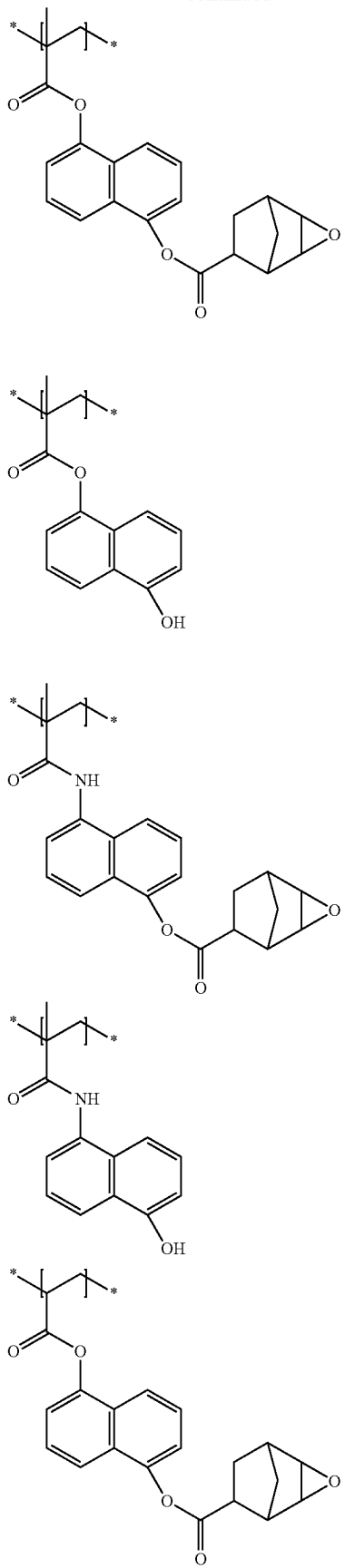
76
-continued
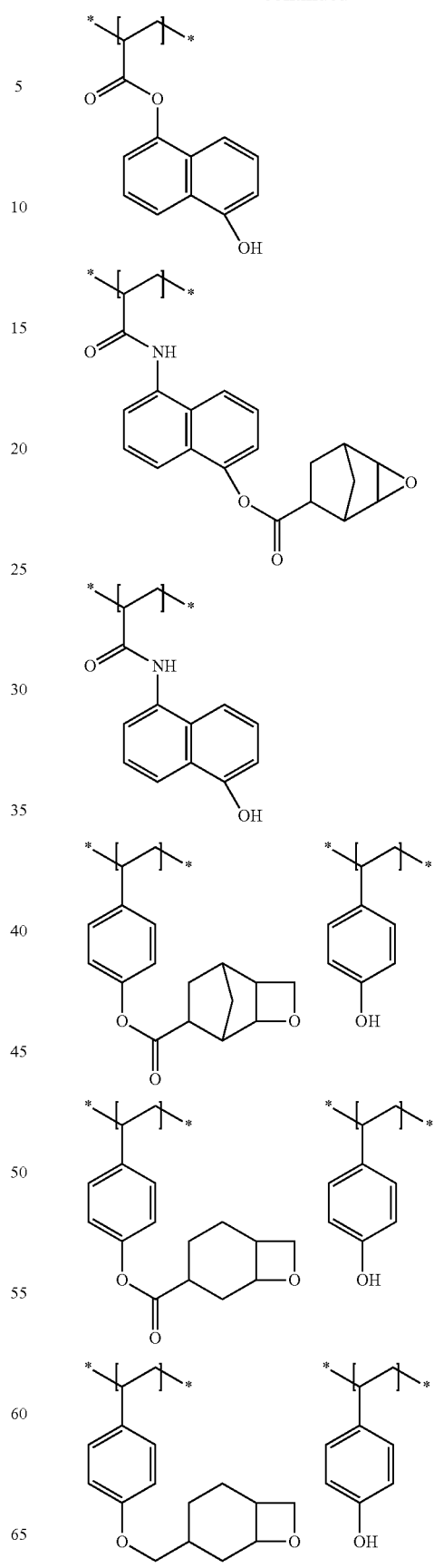

77
-continued
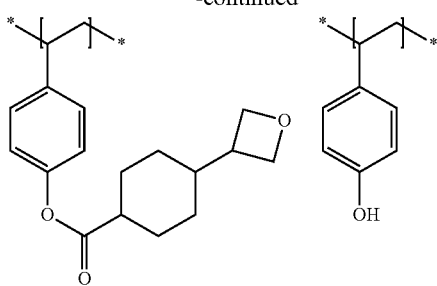
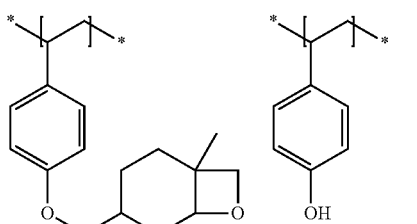
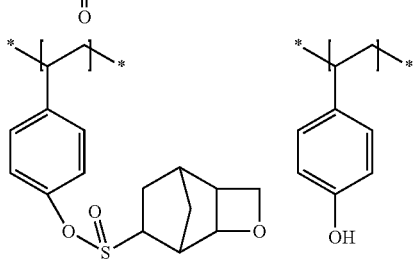
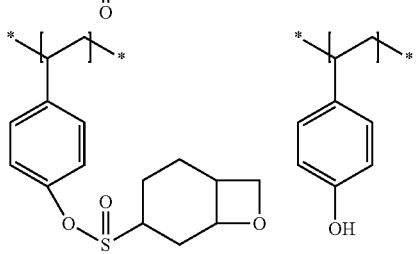
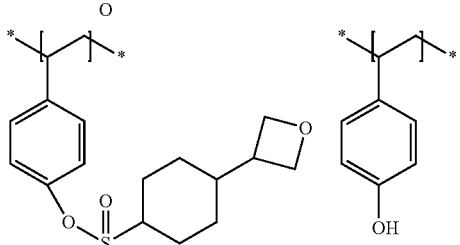
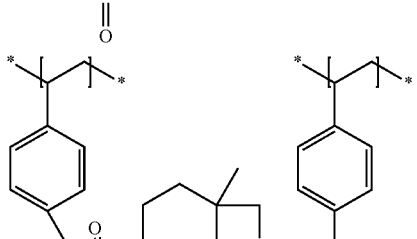
78
-continued
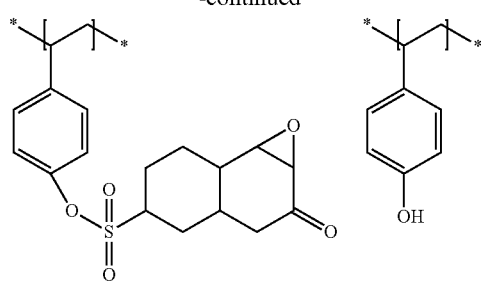
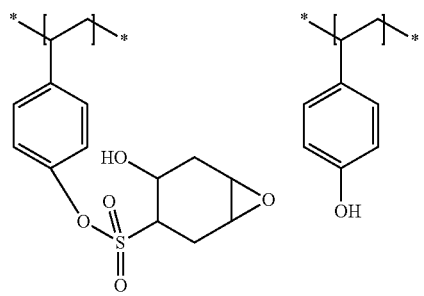
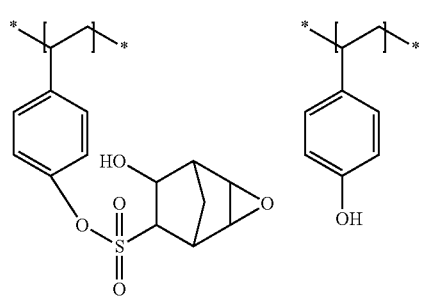
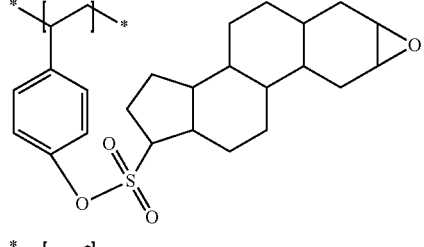
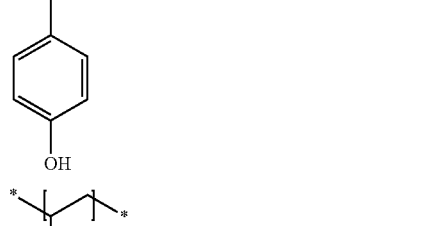
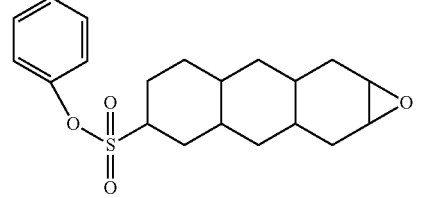

79
-continued
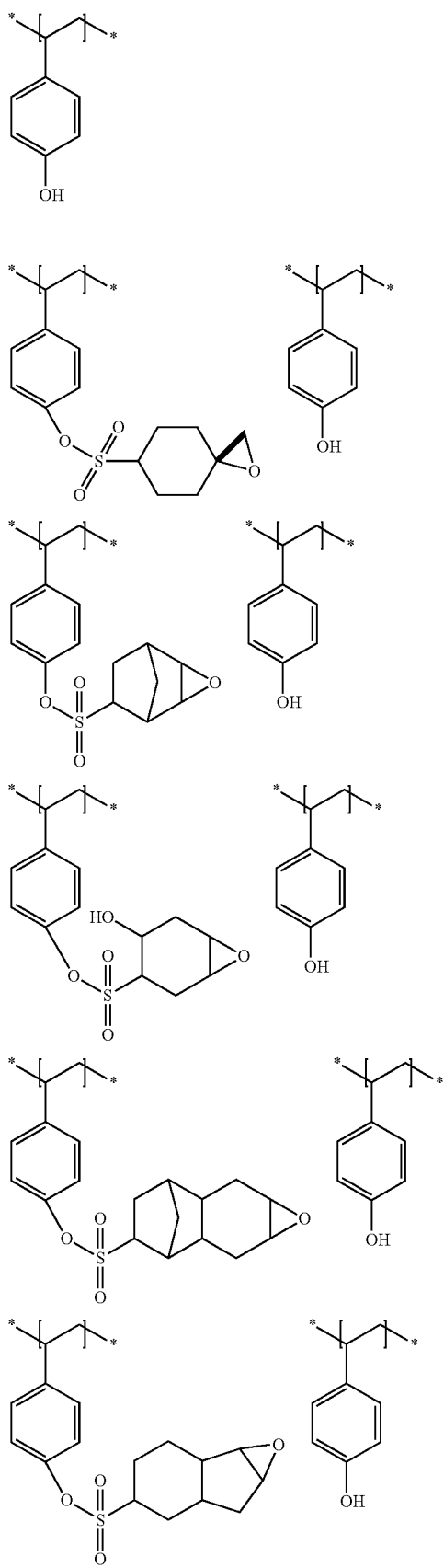
80
-continued
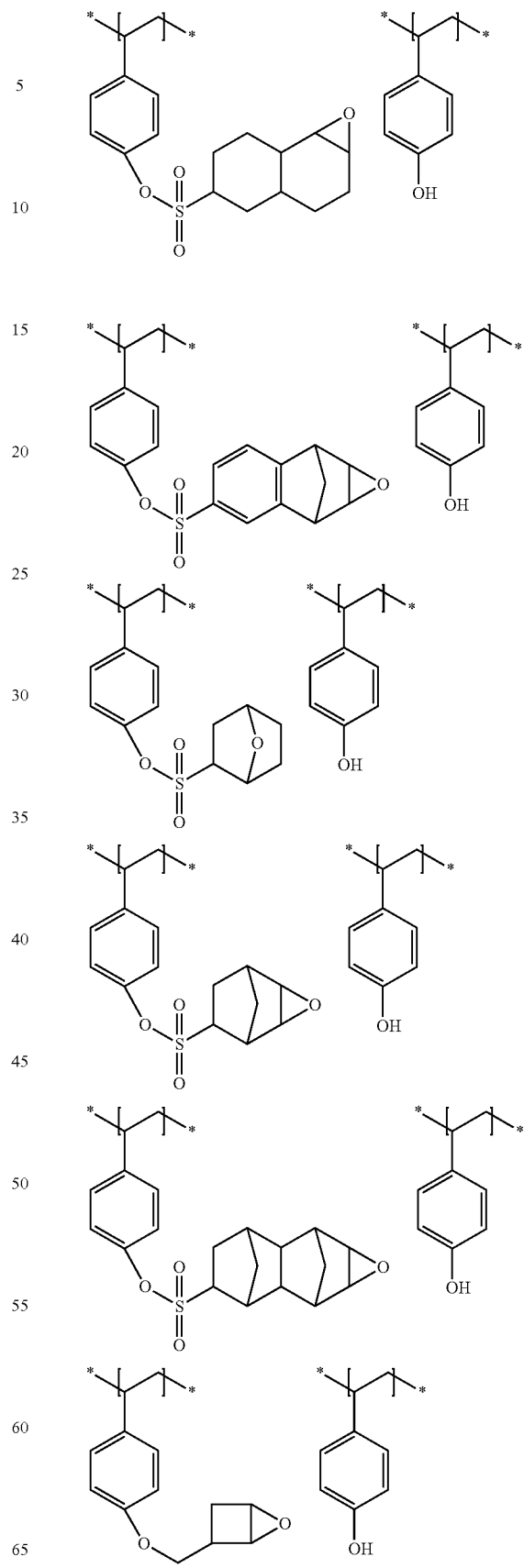

81
-continued
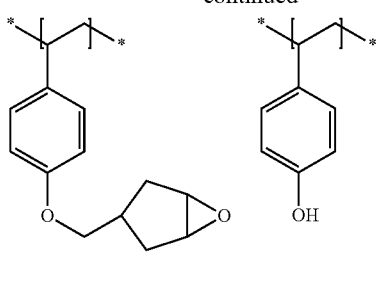
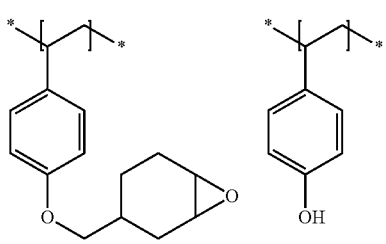
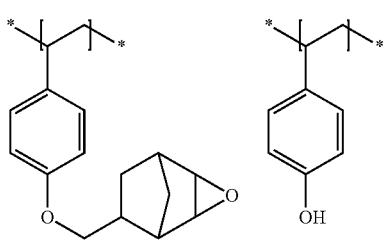
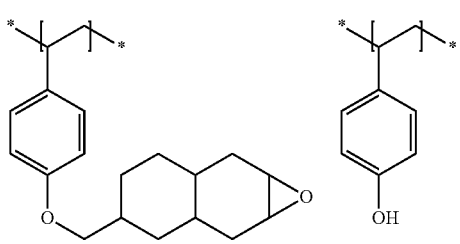
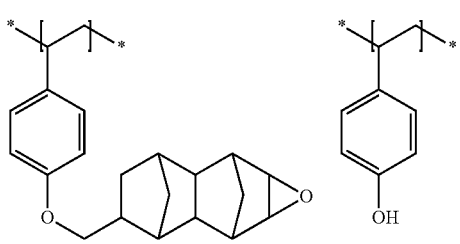
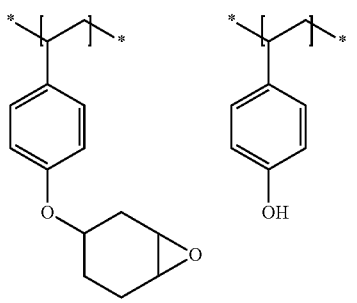
82
-continued
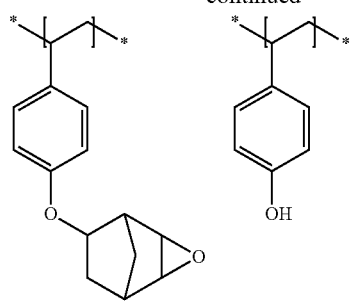
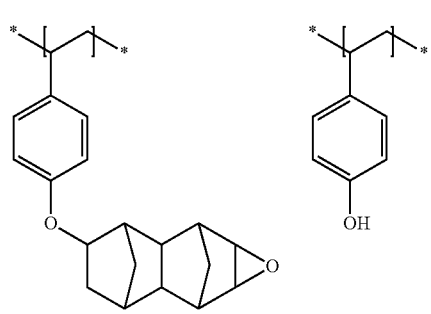
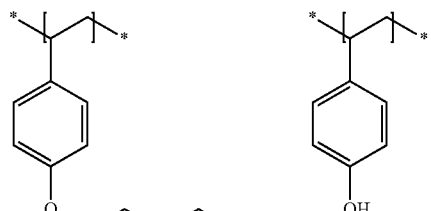
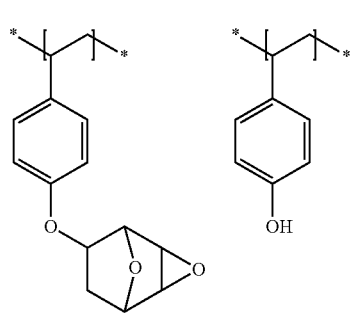
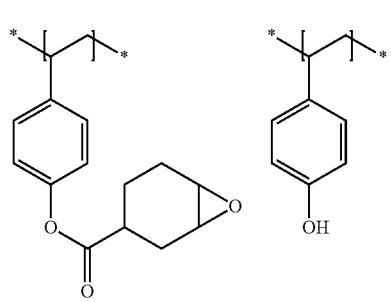

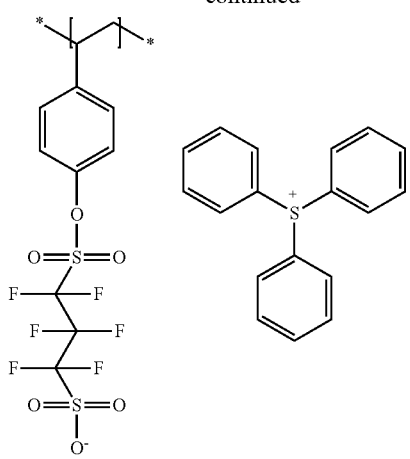
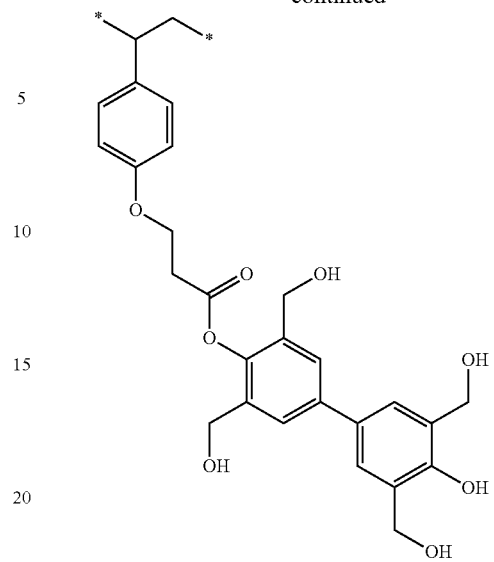
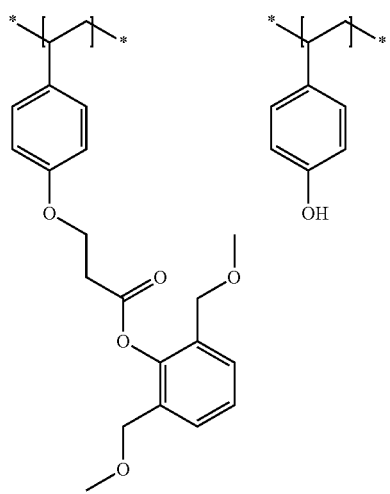
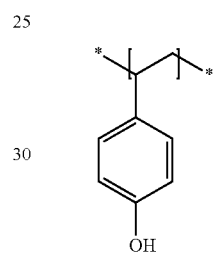
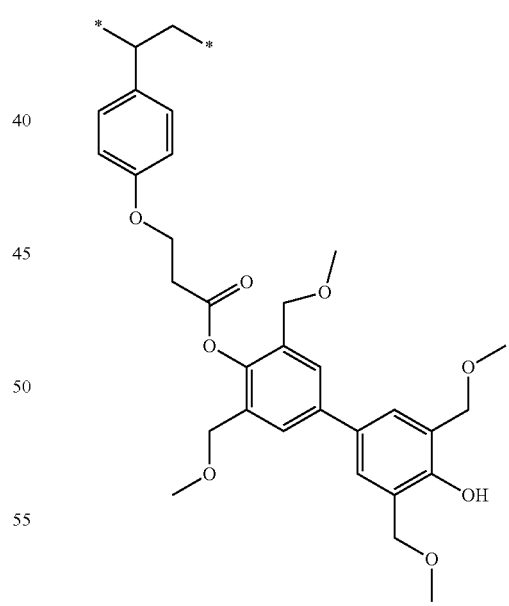
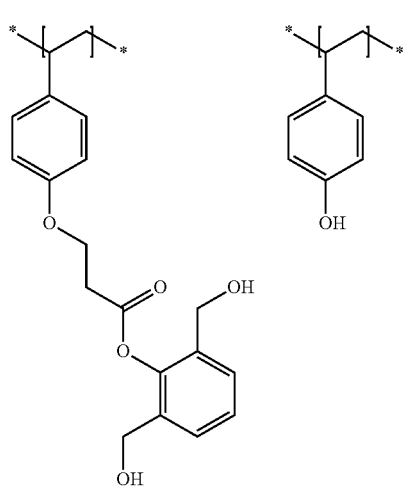
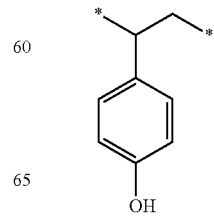

85
-continued
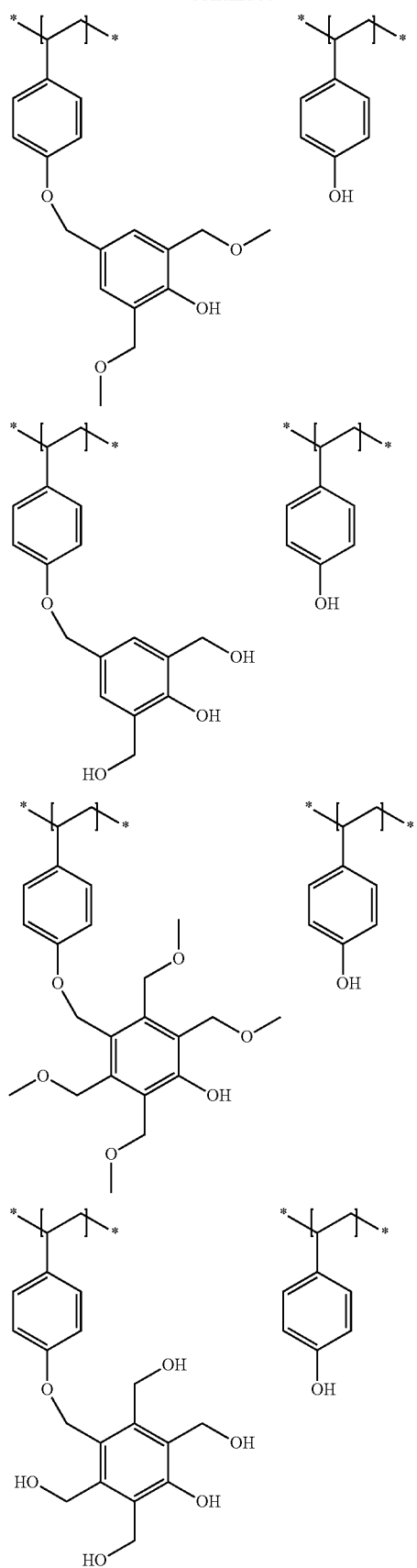
86
-continued
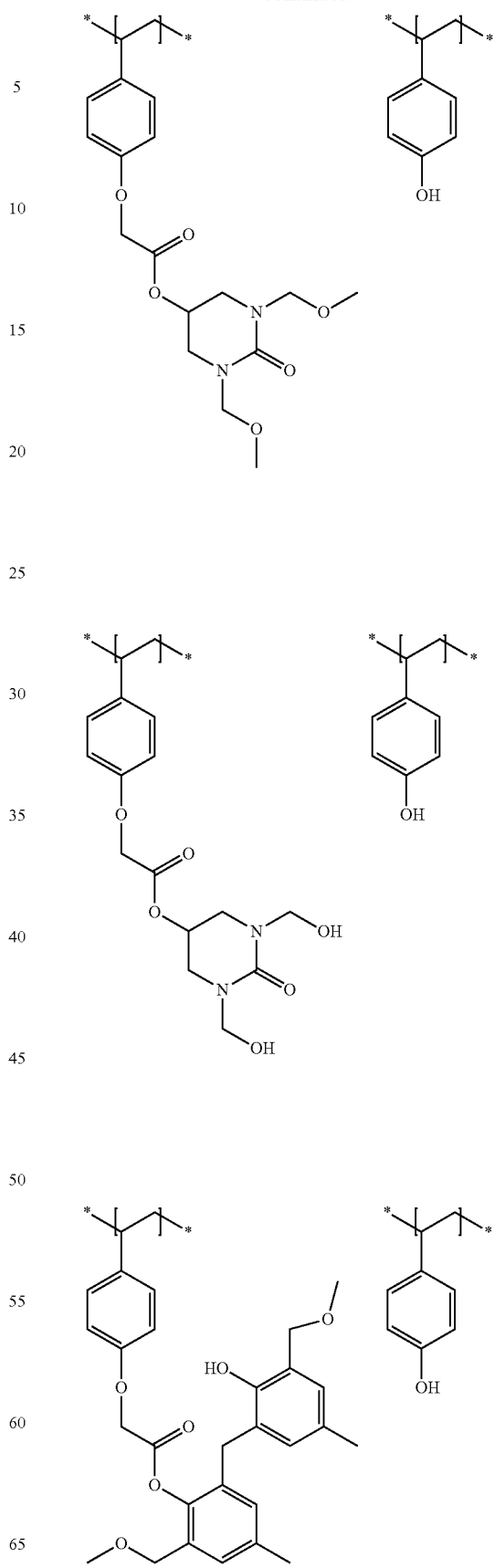

87
-continued
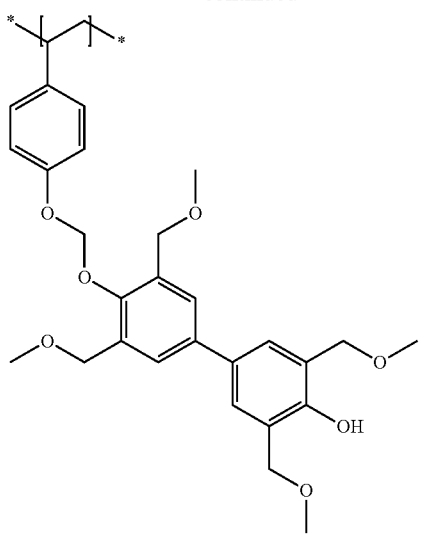
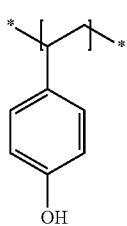
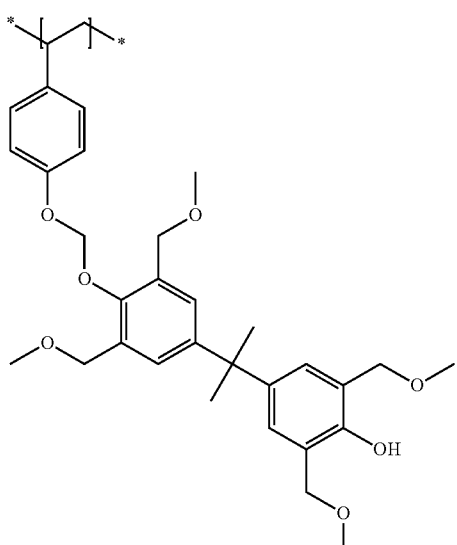
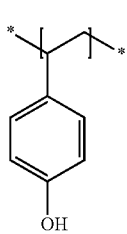
88
-continued
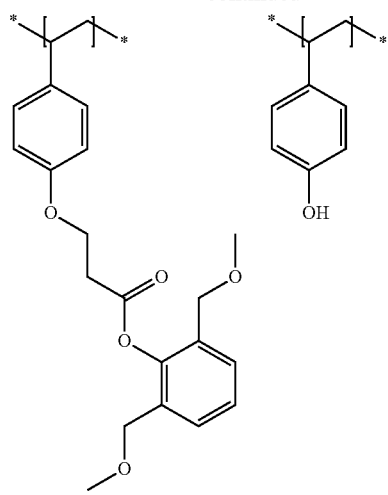
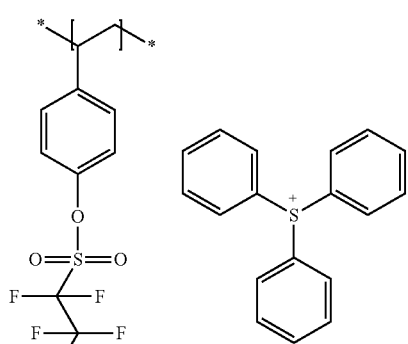
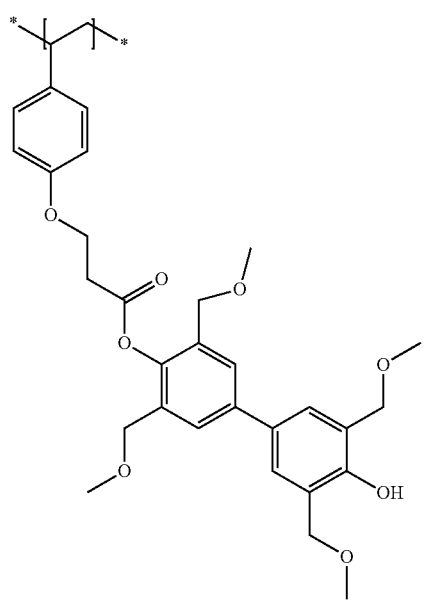

89
-continued
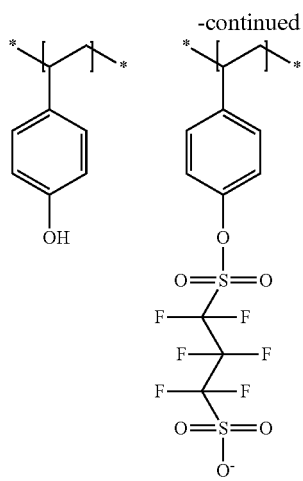
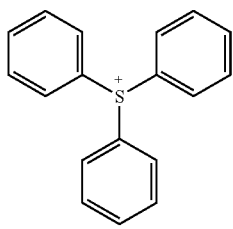
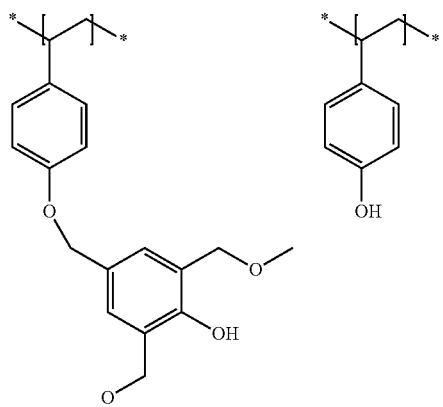
90
-continued
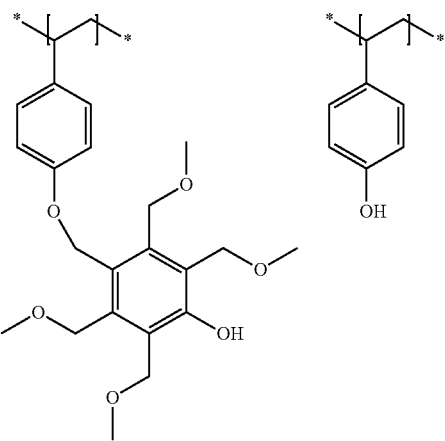
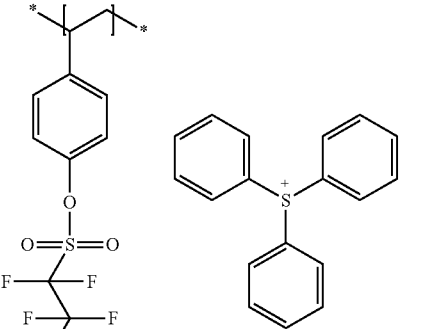

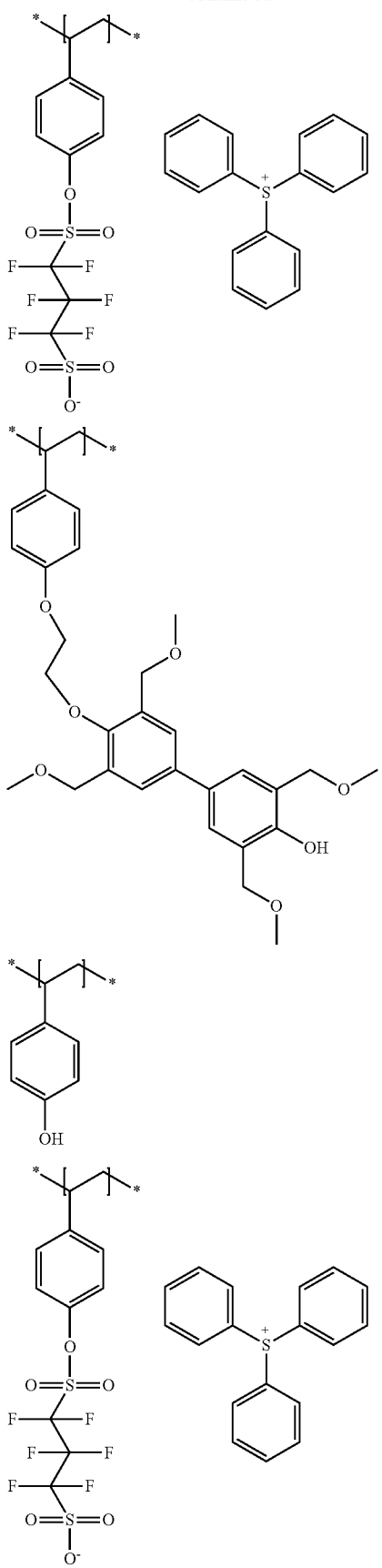
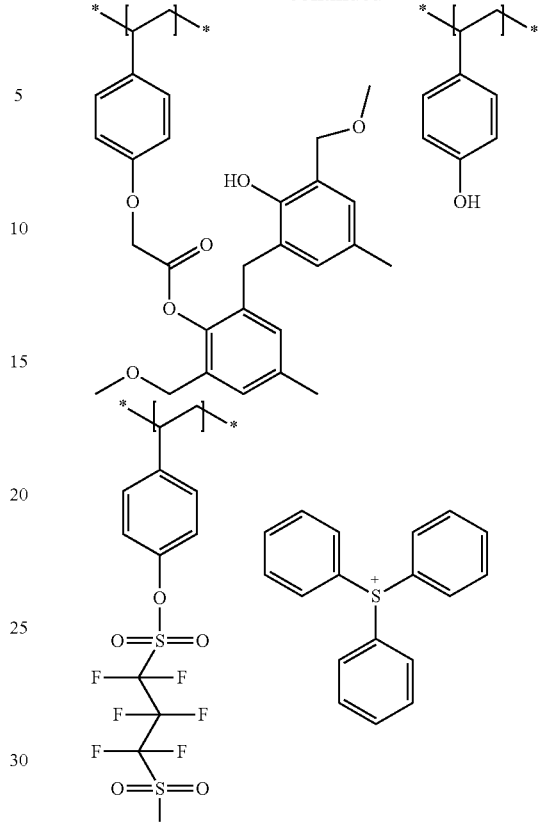

[Compound (B)]

The composition of the present invention in its one form comprises a compound (hereinafter referred to as "compound (B)" or "acid generator") that when exposed to actinic rays or radiation, generates an acid.

As a preferred form of the acid generator, there can be mentioned an onium salt compound. As the onium salt compound, there can be mentioned, for example, a sulfonium salt, an iodonium salt, a phosphonium salt or the like.

Further, as another preferred form of the acid generator, there can be mentioned a compound that when exposed to actinic rays or radiation, generates a sulfonic acid, an imidic acid or a methide acid. As the acid generator in this form, there can be mentioned, for example, a sulfonium salt, an iodonium salt, a phosphonium salt, an oxime sulfonate, an imide sulfonate or the like.

The acid generator that can be used in the present invention is not limited to low-molecular compounds. Use can be made of a polymeric compound in which a group that when exposed to actinic rays or radiation, generates an acid is introduced in the principal chain or a side chain of the compound. When a group that when exposed to actinic rays or radiation, generates an acid is present in a repeating unit as a comonomer component of the polymeric compound (A) for use in the present invention, as mentioned above, it is not necessary to incorporate the acid generator (B) as a molecule other than the polymeric compound (A) according to the present invention.

It is preferred for the acid generator to be a compound that when exposed to electron beams or extreme ultraviolet, generates an acid.

As onium salt compounds preferred in the present invention, there can be mentioned sulfonium compounds of general formula (7) below and iodonium compounds of general formula (8) below.

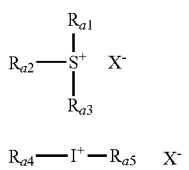

(7)

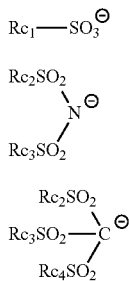

(8)

$R_{a4}-I^+-R_{a5}$  $X^-$

In general formula (7) and general formula (8), each of $R_{a1}$, $R_{a2}$, $R_{a3}$, $R_{a4}$ and $R_{a5}$ independently represents an organic group.

$X^-$ represents an organic anion.

Sulfonium compounds of general formula (7) and iodonium compounds of general formula (8) will be described in detail below.

Each of $R_{a1}$, $R_{a2}$ and $R_{a3}$ of general formula (7) and $R_{a4}$ and $R_{a5}$ of general formula (8), as mentioned above, independently represents an organic group. Preferably, at least one of $R_{a1}$, $R_{a2}$ and $R_{a3}$, and at least either $R_{a4}$ or $R_{a5}$ is an aryl group. The aryl group is preferably a phenyl group or a naphthyl group, more preferably a phenyl group.

As the organic anion represented by $X^-$ in general formulae (7) and (8), there can be mentioned, for example, a sulfonate anion, a carboxylate anion, a bis(alkylsulfonyl)amide anion, a tris(alkylsulfonyl)methide anion or the like. The organic anion is preferably any of those of general formulae (9), (10) and (11) below, more preferably any of those of general formula (9) below.

$Rc_1-SO_3^\ominus$   (9)

$\begin{matrix} Rc_2SO_2 \\ \phantom{Rc_2SO_2}\diagdown \\ \phantom{Rc_2SO_2}\phantom{aa}N^\ominus \\ \phantom{Rc_2SO_2}\diagup \\ Rc_3SO_2 \end{matrix}$   (10)

$\begin{matrix} Rc_2SO_2 \\ \phantom{Rc_2SO_2}\diagdown \\ Rc_3SO_2-C^\ominus \\ \phantom{Rc_2SO_2}\diagup \\ Rc_4SO_2 \end{matrix}$   (11)

In general formulae (9), (10) and (11), each of $R_{c1}$, $R_{c2}$, $R_{c3}$ and $R_{c4}$ independently represents an organic group.

The above organic anions represented by $X^-$ correspond to a sulfonic acid, an imidic acid, a methide acid and the like that are acids generated upon exposure to actinic rays or radiation, such as electron beams or extreme ultraviolet.

As the organic groups represented by $R_{c1}$, $R_{c2}$, $R_{c3}$ and $R_{c4}$ above, there can be mentioned, for example, an alkyl group, an aryl group and a group comprised of a plurality of these connected to each other. Among these organic groups, an alkyl group substituted at its 1-position with a fluorine atom or a fluoroalkyl group and a phenyl group substituted with a fluorine atom or a fluoroalkyl group are preferred. The incorporation of a fluorine atom or a fluoroalkyl group increases the acidity of an acid generated upon exposure to light, thereby realizing a sensitivity enhancement. However, it is preferred for the end groups to contain no fluorine atom as a substituent.

In the present invention, from the viewpoint of inhibiting the diffusion of an acid after exposure into nonexposed areas to thereby attain resolution and pattern shape enhancements, the compound (B) is preferably a compound capable of generating an acid (more preferably sulfonic acid) whose volume is 130 Å$^3$ or greater; more preferably a compound capable of generating an acid (more preferably sulfonic acid) whose volume is 190 Å$^3$ or greater; further more preferably a compound capable of generating an acid (more preferably sulfonic acid) whose volume is 270 Å$^3$ or greater; and most preferably a compound capable of generating an acid (more preferably sulfonic acid) whose volume is 400 Å$^3$ or greater. However, from the viewpoint of sensitivity and coating solvent solubility, the above volume is preferably up to 2000 Å$^3$, more preferably up to 1500 Å$^3$. The value of each of these volumes was determined by means of the software "WinMOPAC" compiled by Fujitsu Limited. Namely, first, the chemical structure of the acid generated by each of the compounds was inputted. Subsequently, while regarding this structure as an initial structure, the most stable conformation of the acid was determined by a molecular force field calculation using an MM3 method. Thereafter, a molecular orbital calculation using a PM3 method was carried out with respect to the most stable conformation. Thus, the "accessible volume" of each of the acids was calculated.

Acid generators especially preferred in the present invention are shown below. Calculated volume values (unit Å$^3$) are noted in some of acid generator examples. Each of the calculated values means the value of the volume of an acid comprised of an anion moiety and proton bonded to each other.

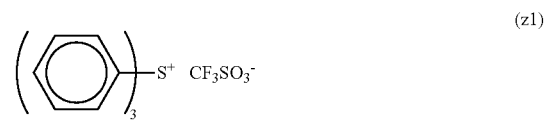

(z1)

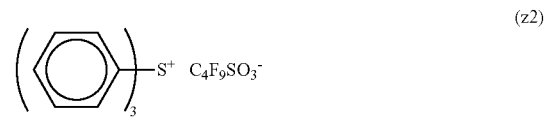

113 Å$^3$ (z2)

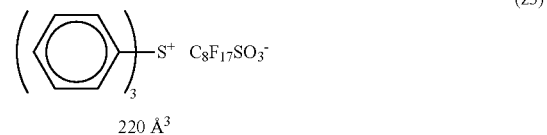

220 Å$^3$ (z3)

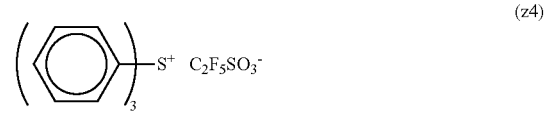

(z4)

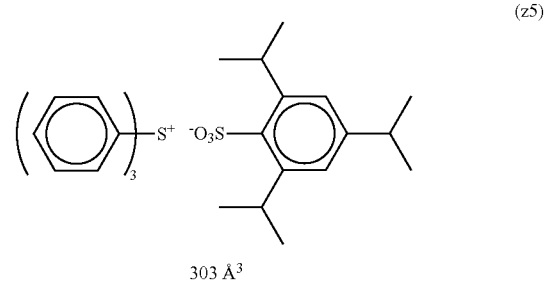

303 Å$^3$ (z5)

(z6)
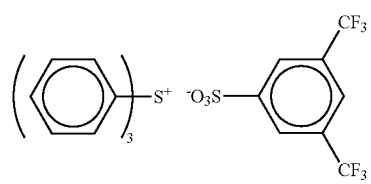
(z7)
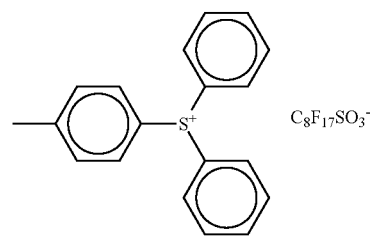
(z8)
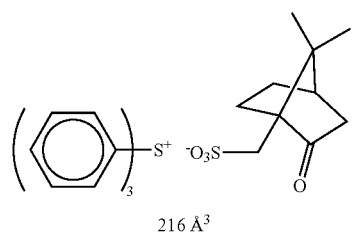
216 Å³
(z9)
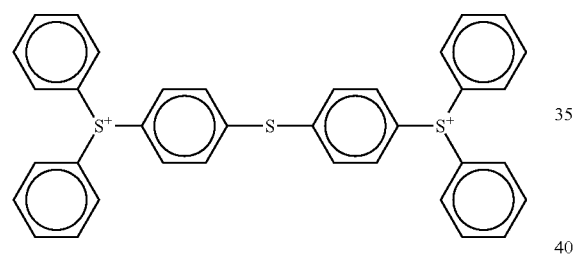
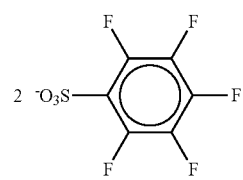
127 Å³
(z10)
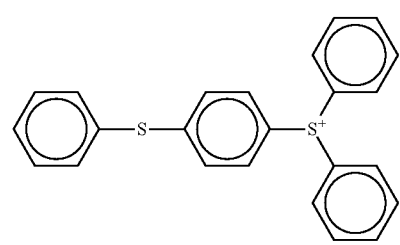
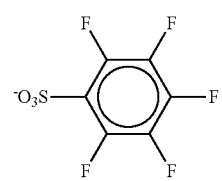
127 Å³
(z11)
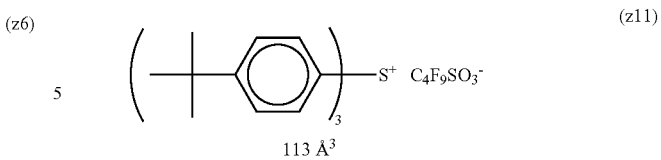
113 Å³
(z12)
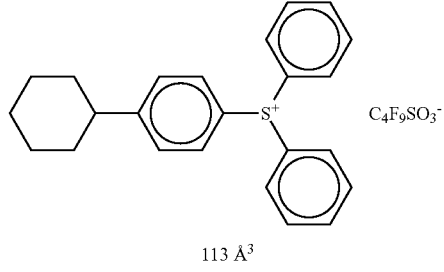
113 Å³
(z13)
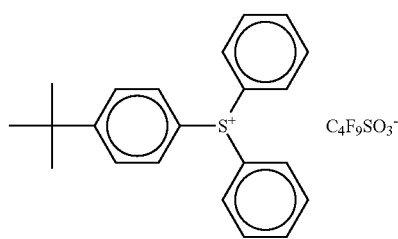
113 Å³
(z14)
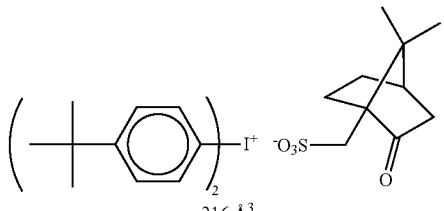
216 Å³
(z15)
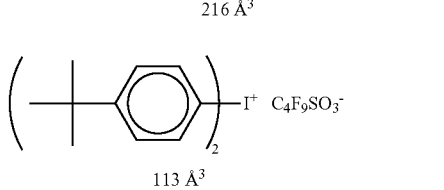
113 Å³
(z16)
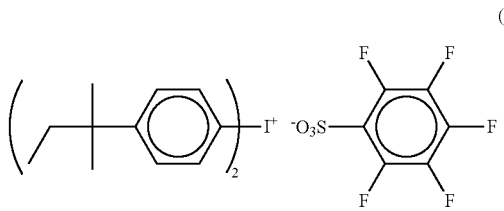
127 Å³
(z17)
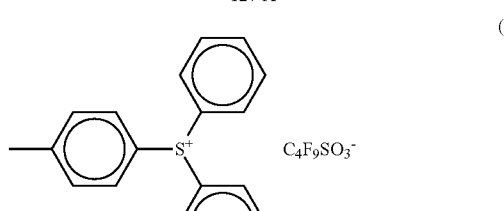
113 Å³

-continued
(z18)
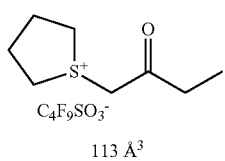
113 Å³
(z19)
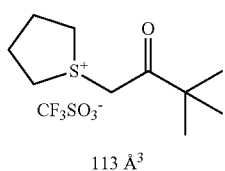
113 Å³
(z20)
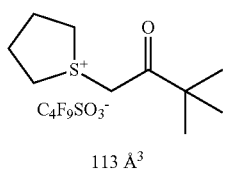
113 Å³
(z21)
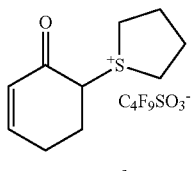
113 Å³
(z22)
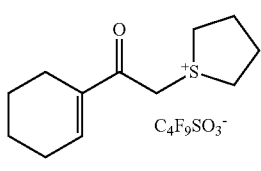
113 Å³
(z23)
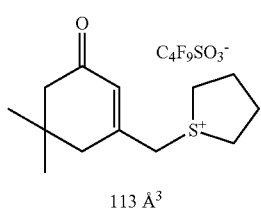
113 Å³
(z24)
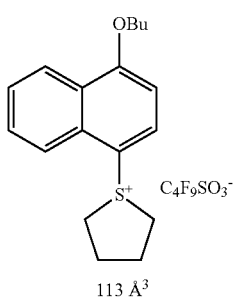
113 Å³
-continued
(z25)
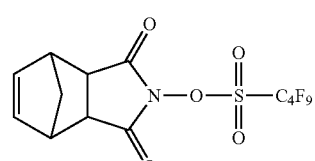
113 Å³
(z26)
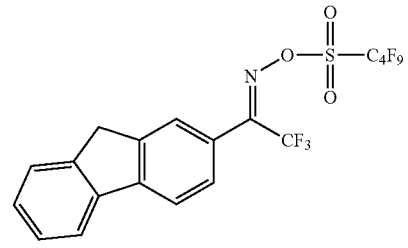
113 Å³
(z27)
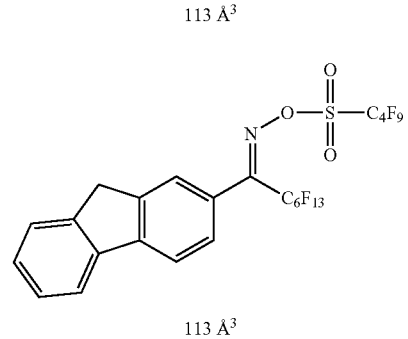
113 Å³
(z28)
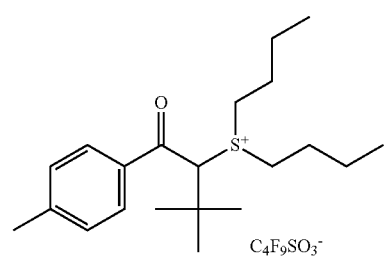
113 Å³
(z29)
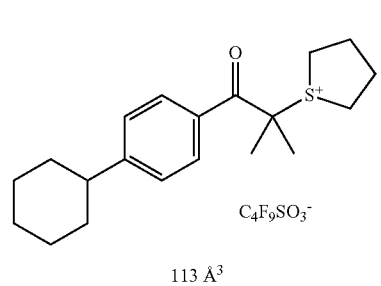
113 Å³
(z30)
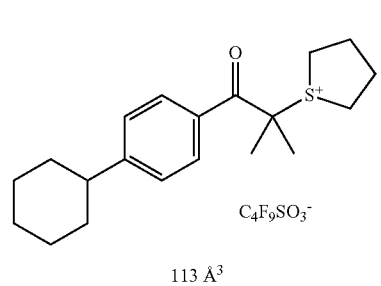
113 Å³

-continued
(z31)
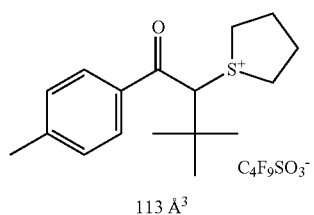
C4F9SO3-
113 Å³
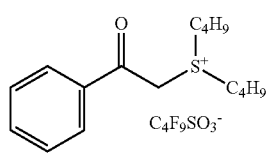
C4F9SO3-
113 Å³
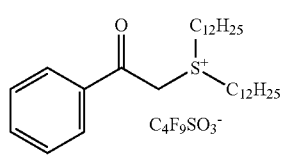
C4F9SO3-
113 Å³
(z32)
(z33)
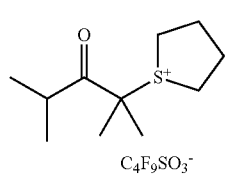
C4F9SO3-
113 Å³
(z34)
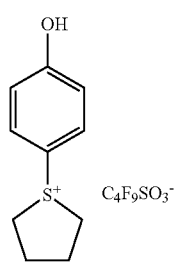
C4F9SO3-
113 Å³
(z35)
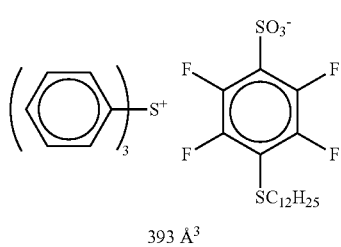
393 Å³
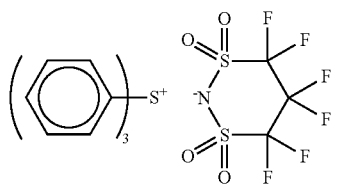
136 Å³
-continued
(z38)
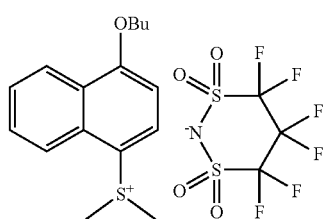
136 Å³
(z39)
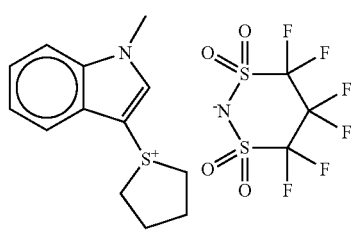
136 Å³
(z40)
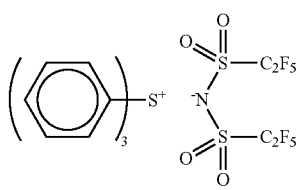
173 Å³
(z41)
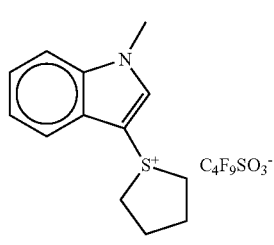
C4F9SO3-
113 Å³
(z42)
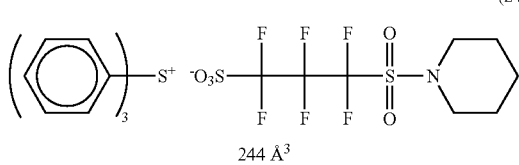
244 Å³
(z43)
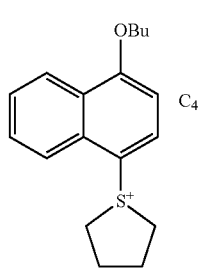
C4F9SO3-
113 Å³

-continued
(z44)
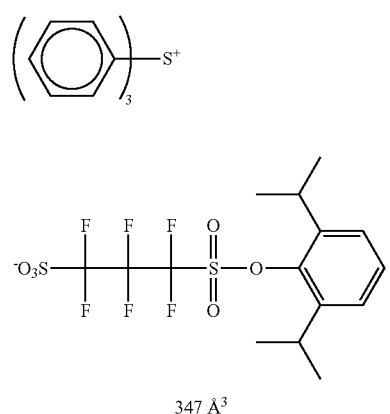
347 Å³
(z45)
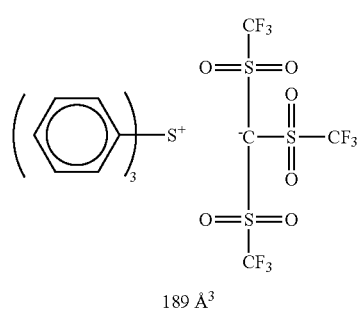
189 Å³
(z46)
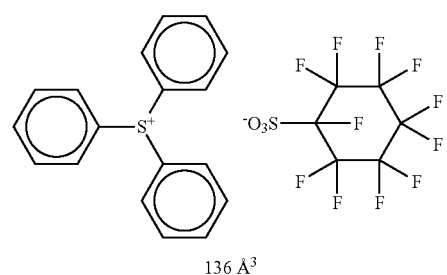
136 Å³
(z47)
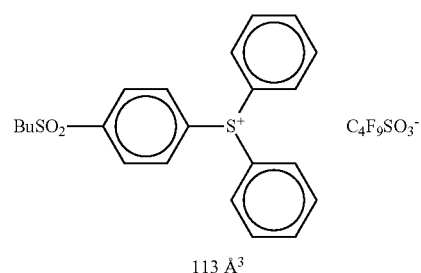
113 Å³
(z48)
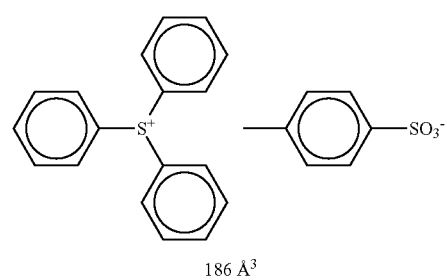
186 Å³
-continued
(z49)
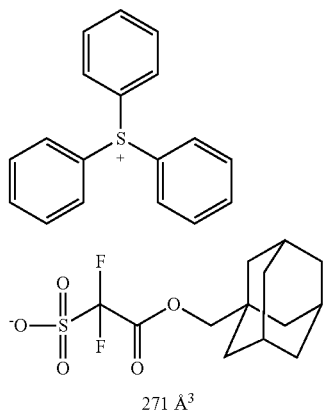
271 Å³
(z50)
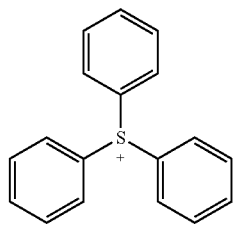
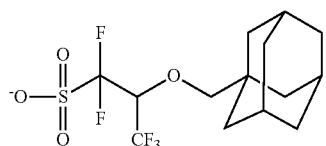
291 Å³
(z51)
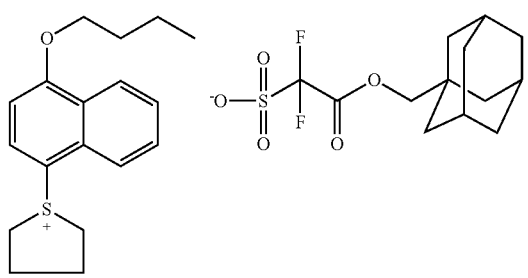
271 Å³
(z52)
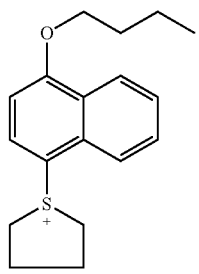
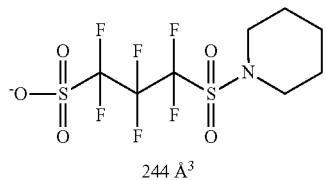
244 Å³

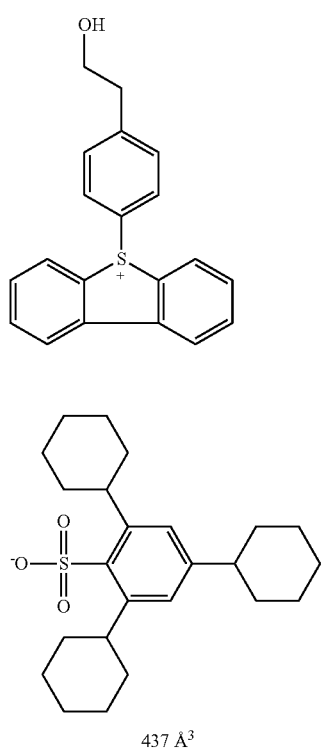
(z53)
437 Å³
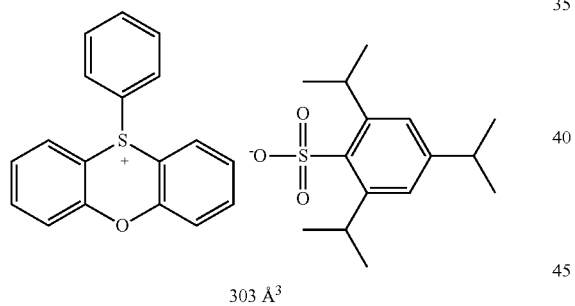
(z54)
303 Å³
(z55)
303 Å³
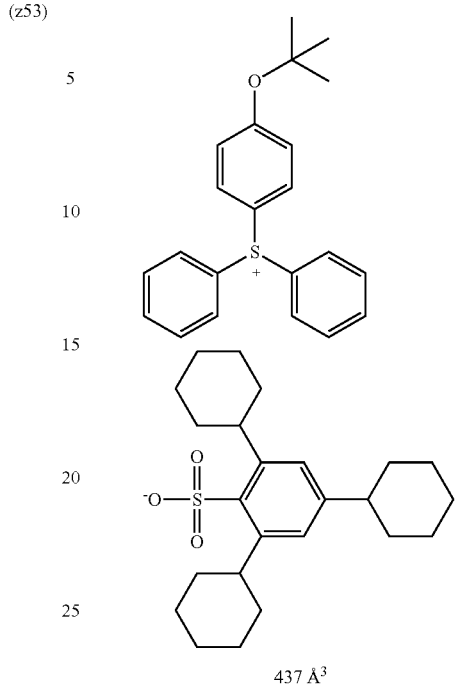
(z56)
437 Å³
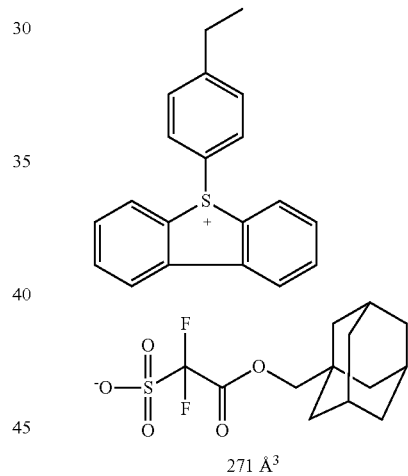
(z57)
271 Å³
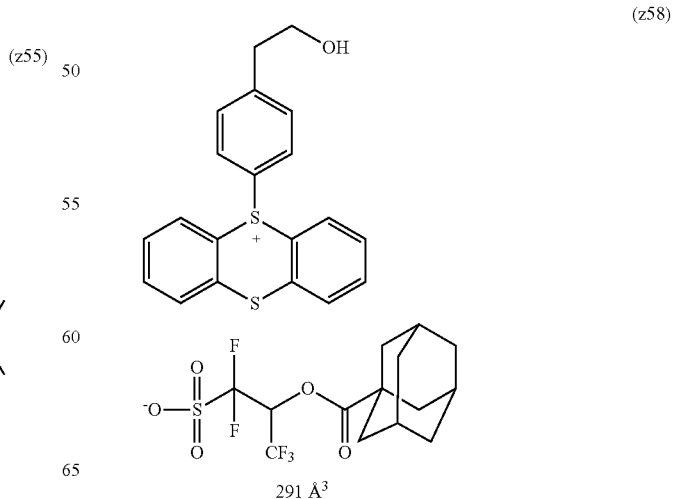
(z58)
291 Å³

-continued
(z59)
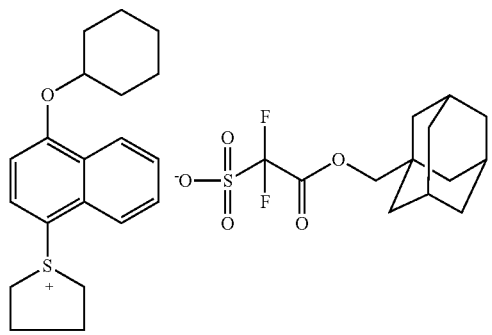
271 Å³
(z60)
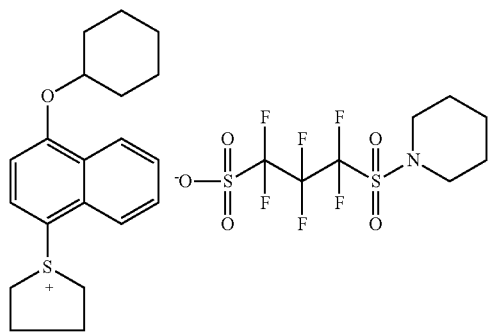
244 Å³
(z61)
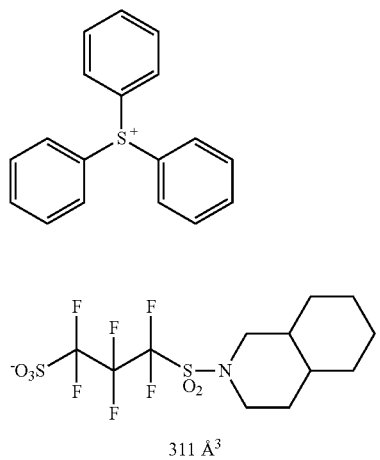
311 Å³
(z62)
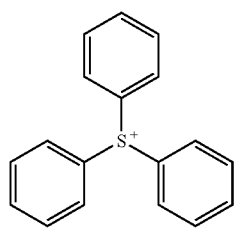
-continued
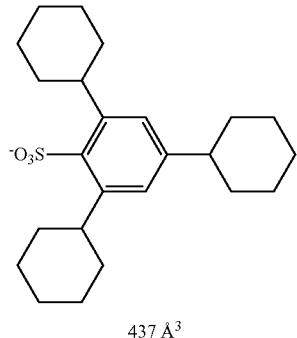
437 Å³
(z63)
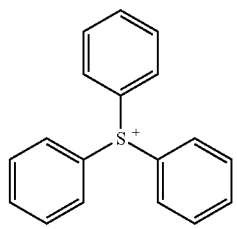
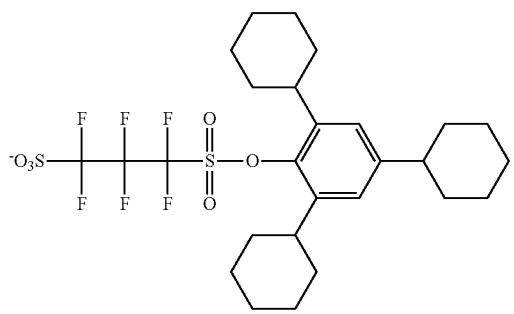
535 Å³
(z64)
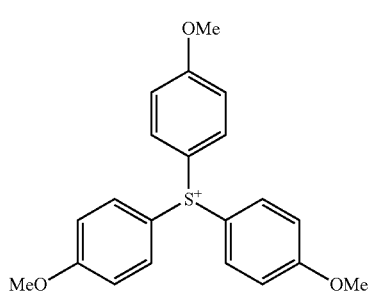
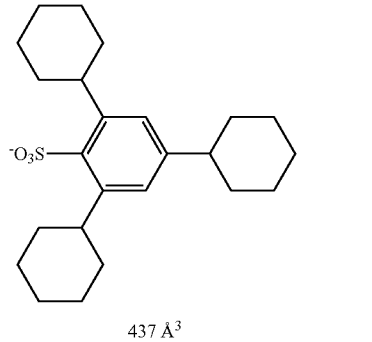
437 Å³

-continued

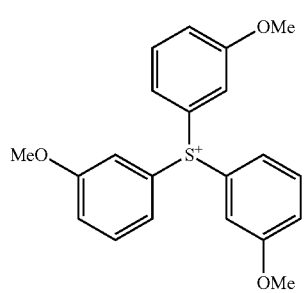
(z65)

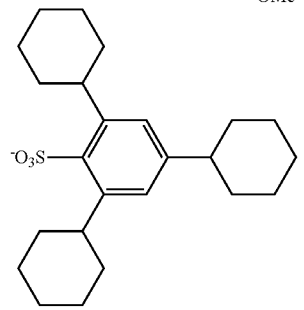
437 Å³

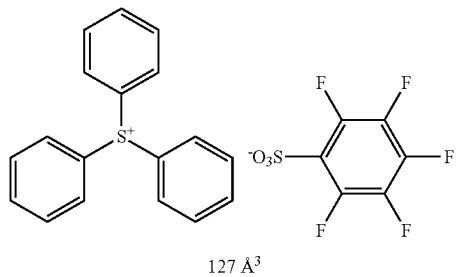
127 Å³
(z66)

As the acid generator (preferably an onium compound) for use in the present invention, use can be made of a polymeric acid generator in which a group (photoacid generating group) that when exposed to actinic rays or radiation, generates an acid is introduced in the principal chain or a side chain of the polymeric compound. The polymeric acid generator was described as a repeating unit containing a photoacid generating group in the above description regarding the polymeric compound (A).

The content of acid generator in the composition, based on the total solids of the composition, is preferably in the range of 0.1 to 25 mass %, more preferably 0.5 to 20 mass % and further more preferably 1 to 18 mass %.

One type of acid generator may be used alone, or two or more types thereof may be used in combination.

[Compound Containing Two or More Hydroxymethyl Groups or Alkoxymethyl Groups in its Molecule]

When the composition of the present invention is used in the formation of a negative pattern, it is preferred for the composition of the present invention to contain a compound (hereinafter referred to as "compound (C)" or "crosslinking agent") containing two or more hydroxymethyl groups or alkoxymethyl groups in its molecule as a crosslinking agent.

As preferred crosslinking agents, there can be mentioned a hydroxymethylated or alkoxymethylated phenol compound, an alkoxymethylated melamine compound, an alkoxymethylglycoluril compound and an alkoxymethylated urea compound. The compound (C) most preferred as a crosslinking agent is an alkoxymethylglycoluril derivative or phenol derivative of 1200 or less molecular weight containing 3 to 5 benzene rings in each molecule and further containing two or more hydroxymethyl or alkoxymethyl groups in total.

It is preferred for the alkoxymethyl group to be a methoxymethyl group or an ethoxymethyl group.

Among these crosslinking agents, a phenol derivative containing a hydroxymethyl group can be obtained by reacting a corresponding phenol derivative containing no hydroxymethyl group with formaldehyde in the presence of a base catalyst. Further, a phenol derivative containing an alkoxymethyl group can be obtained by reacting a corresponding phenol derivative containing a hydroxymethyl group with an alcohol in the presence of an acid catalyst.

As other preferred examples of crosslinking agents, there can be mentioned compounds each containing an N-hydroxymethyl group or an N-alkoxymethyl group, such as an alkoxymethylated melamine compound, an alkoxymethylglycoluril compound and an alkoxymethylated urea compound.

These compounds include hexamethoxymethylmelamine, hexaethoxymethylmelamine, tetramethoxymethylglycoluril, 1,3-bismethoxymethyl-4,5-bismethoxyethyleneurea, bismethoxymethylurea and the like. These are disclosed in EP 0133216 A, West German Patent Nos. 3634671 and 3711264 and EP 0212482 A.

Among these crosslinking agents, those particularly preferred are shown below.

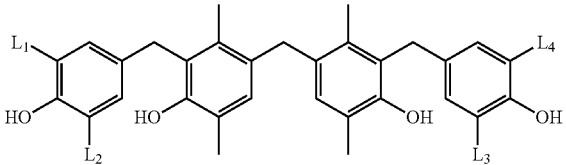

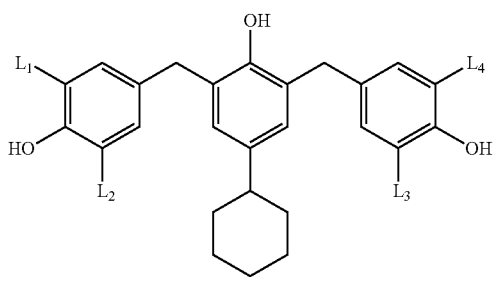

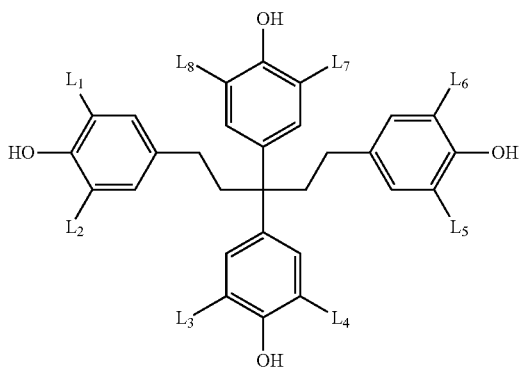

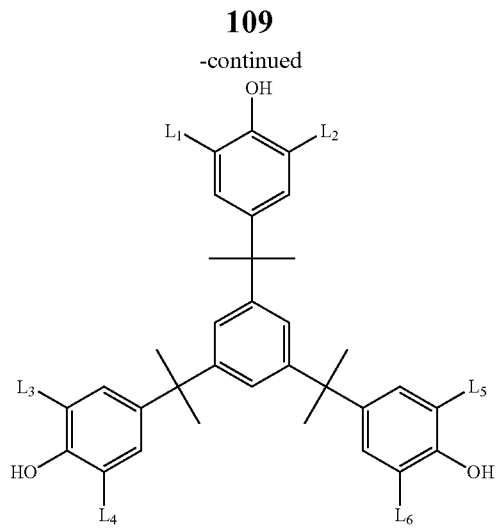

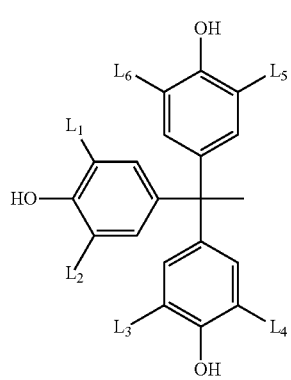

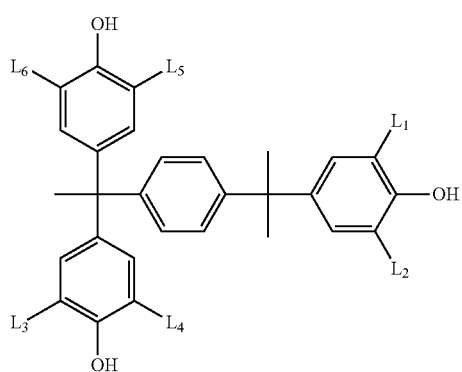

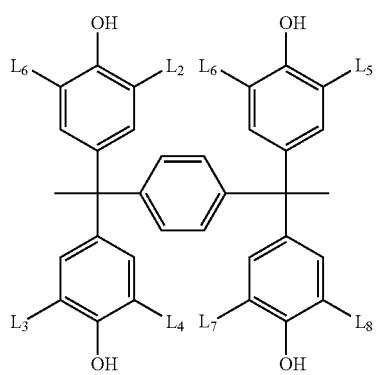

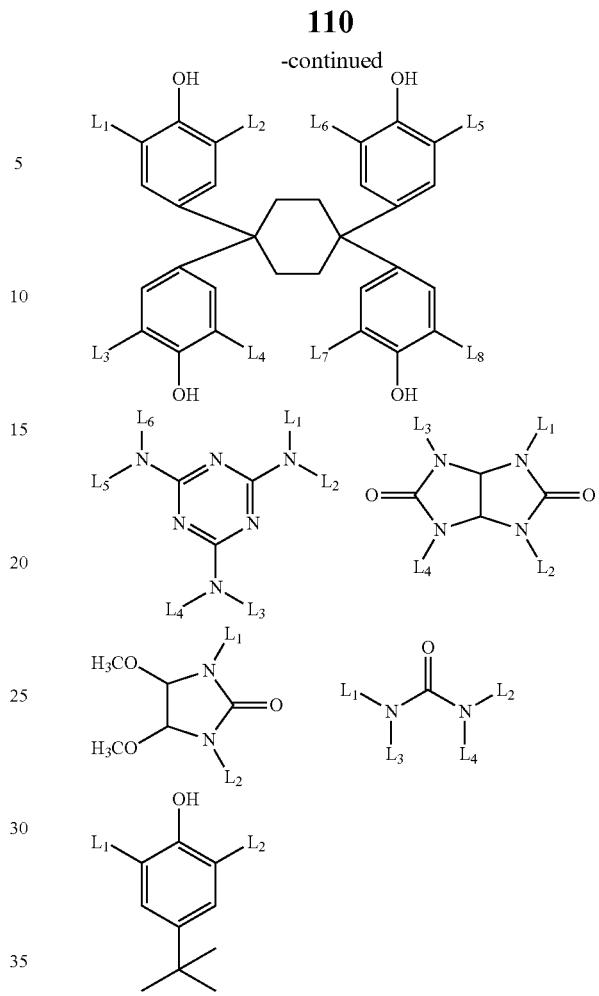

In the formulae, each of $L_1$ to $L_8$ independently represents a hydrogen atom, a hydroxymethyl group, a methoxymethyl group, an ethoxymethyl group or an alkyl group having 1 to 6 carbon atoms.

In the present invention, the content of crosslinking agent, based on the total solids of the composition for negative patterning, is preferably in the range of 3 to 65 mass %, more preferably 5 to 50 mass %. When the content of crosslinking agent falls within the range of 3 to 65 mass %, not only can any deteriorations of remaining film ratio and resolving power be prevented but also the storage stability of the composition of the present invention can be favorably maintained.

In the present invention, one type of crosslinking agent may be used alone, or two or more types thereof may be used in combination. Using two or more types thereof in combination is preferred from the viewpoint of favorable pattern shape.

For example, when the above phenol derivative is used in combination with another crosslinking agent, e.g., the above compound containing an N-alkoxymethyl group, the ratio of phenol derivative/other crosslinking agent in terms of molar ratio is generally in the range of 90/10 to 20/80, preferably 85/15 to 40/60 and more preferably 80/20 to 50/50.

[Basic Compound]

It is preferred for the composition of the present invention to comprise a basic compound as an acid trapping agent in addition to the foregoing components. The incorporation of a basic compound lessens any performance change over time from exposure to light to postbake. It is preferred for the basic compound to be an organic basic compound. In particular, as such, there can be mentioned aliphatic amines, aromatic amines, heterocyclic amines, a nitrogen-containing compound in which a carboxyl group is introduced, a nitrogen-containing compound in which a sulfonyl group is introduced, a nitrogen-containing compound in which a hydroxyl group is introduced, a nitrogen-containing compound in which a hydroxyphenyl group is introduced, an alcoholic nitrogen-containing compound, amide derivatives, imide derivatives and the like. Further, an amine oxide compound (described in JP-A-2008-102383) and an ammonium salt (preferably a hydroxide or a carboxylate, in particular, a tetraalkylammonium hydroxide, typically tetrabutylammonium hydroxide, is preferred from the viewpoint of LER) can be appropriately used.

Moreover, a compound whose basicity is increased by the action of an acid can be used as one type of basic compound.

Particular examples of the amines include tri-n-butylamine, tri-n-pentylamine, tri-n-octylamine, tri-n-decylamine, triisodecylamine, dicyclohexylmethylamine, tetradecylamine, pentadecylamine, hexadecylamine, octadecylamine, didecylamine, methyloctadecylamine, dimethylundecylamine, N,N-dimethyldodecylamine, methyldioctadecylamine, N,N-dibutylaniline, N,N-dihexylaniline, 2,6-diisopropylaniline, 2,4,6-tri(t-butyl)aniline, triethanolamine, N,N-dihydroxyethylaniline, tris(methoxyethoxyethyl)amine, compounds set forth as examples in column 3, line 60 et seq. of U.S. Pat. No. 6,040,112, 2-[2-{2-(2,2-dimethoxyphenoxyethoxy)ethyl}-bis(2-methoxyethyl)]amine, compounds (C1-1) to (C3-3) set forth as examples in Section [0066] of U.S. Patent Application Publication No. 2007/0224539 A1, and the like. As compounds with a nitrogen-containing heterocyclic structure, there can be mentioned 2-phenylbenzimidazole, 2,4,5-triphenylimidazole, N-hydroxyethylpiperidine, bis(1,2,2,6,6-pentamethyl-4-piperidyl) sebacate, 4-dimethylaminopyridine, antipyrine, hydroxyantipyrine, 1,5-diazabicyclo[4.3.0]non-5-ene, 1,8-diazabicyclo[5.4.0]undec-7-ene, tetrabutylammonium hydroxide and the like.

Furthermore, appropriate use can be made of a photolytic basic compound (compound that initially exhibits basicity since a basic nitrogen atom acts as a base but when exposed to actinic rays or radiation, is decomposed to thereby generate an amphoteric ion compound containing a basic nitrogen atom and an organic acid moiety, which induce an intramolecular neutralization, so that the basicity is reduced or lost, for example, any of onium salts described in Japanese Patent 3577743, JP-A-2001-215689, JP-A-2001-166476 and JP-A-2008-102383) and a photobasicity generator (for example, a compound described in JP-A-2010-243773).

Among these basic compounds, an ammonium salt is preferred from the viewpoint of resolution enhancement.

In the present invention, the content of basic compound, based on the total solids of the composition, is preferably in the range of 0.01 to 10 mass %, more preferably 0.03 to 5 mass % and most preferably 0.05 to 3 mass %.

[Surfactant]

The composition of the present invention may further comprise a surfactant in order to enhance its coatability. The surfactants are not particularly limited. As examples thereof, there can be mentioned nonionic surfactants, such as a polyoxyethylene alkyl ether, a polyoxyethylene alkylallyl ether, a polyoxyethylene-polyoxypropylene block copolymer, a sorbitan fatty acid ester and a polyoxyethylene sorbitan fatty acid ester; fluorinated surfactants, such as Megafac F171 (produced by DIC Corporation), Florad FC430 (produced by Sumitomo 3M Ltd.), Surfinol E1004 (produced by Asahi Glass Co., Ltd.) and PF656 and PF6320 (produced by OMNOVA SOLUTIONS, INC.); and organosiloxane polymers.

When a surfactant is contained in the composition of the present invention, the content thereof, based on the whole amount (excluding the solvent) of the composition, is preferably in the range of 0.0001 to 2 mass %, more preferably 0.0005 to 1 mass %.

[Organic Carboxylic Acid]

It is preferred for the composition of the present invention to comprise an organic carboxylic acid in addition to the foregoing components. As organic carboxylic acid compounds, there can be mentioned an aliphatic carboxylic acid, an alicyclic carboxylic acid, an unsaturated aliphatic carboxylic acid, an oxycarboxylic acid, an alkoxycarboxylic acid, a ketocarboxylic acid, a benzoic acid derivative, phthalic acid, terephthalic acid, isophthalic acid, 2-naphthoic acid, 1-hydroxy-2-naphthoic acid, 2-hydroxy-3-naphthoic acid and the like. When electron beam exposure is carried out in vacuum, there is the danger that vaporization from the surface of the resist film occurs to thereby stain the inside of the lithography chamber. From this viewpoint, aromatic organic carboxylic acids are preferred. Among them, for example, benzoic acid, 1-hydroxy-2-naphthoic acid and 2-hydroxy-3-naphthoic acid can be appropriately used.

The ratio of organic carboxylic acid added is preferably in the range of 0.01 to 10 parts by mass, more preferably 0.01 to 5 parts by mass and further more preferably 0.01 to 3 parts by mass, per 100 parts by mass of polymeric compound (A).

According to necessity, the composition of the present invention may further be loaded with a dye, a plasticizer, an acid amplifier (described in, for example, International Publication Nos. 95/29968 and 98/24000, JP-A's H8-305262, H9-34106 and H8-248561, Jpn. PCT National Publication No. H8-503082, U.S. Pat. No. 5,445,917, Jpn. PCT National Publication No. H8-503081, U.S. Pat. Nos. 5,534,393, 5,395,736, 5,741,630, 5,334,489, 5,582,956, 5,578,424, 5,453,345 and 5,445,917, European Patent Nos. 665,960, 757,628 and 665,961, U.S. Pat. No. 5,667,943 and JP-A's H10-1508, H10-282642, H9-512498, 2000-62337, 2005-17730 and 2008-209889), etc. With respect to all of these compounds, there can be mentioned those described in JP-A-2008-268935.

[Carboxylic Acid Onium Salt]

The composition of the present invention may contain a carboxylic acid onium salt. As the carboxylic acid onium salt, there can be mentioned a carboxylic acid sulfonium salt, a carboxylic acid iodonium salt, a carboxylic acid ammonium salt or the like. Especially preferred carboxylic acid onium salts are a carboxylic acid sulfonium salt and a carboxylic acid iodonium salt. In the present invention, it is preferred for the carboxylate residue in the carboxylic acid onium salt to contain neither an aromatic group nor a carbon-carbon double bond. An especially preferred anion moiety thereof is a linear or branched, monocyclic or polycyclic alkyl carboxylate anion having 1 to 30 carbon atoms. A more preferred anion moiety is a carboxylate anion wherein the alkyl group is partially or wholly fluorinated. The alkyl in its chain may contain an oxygen atom. Accordingly, the transparency to light of wavelength 220 nm or shorter can be ensured; the sensitivity and resolving power can be enhanced; and the iso/dense bias and exposure margin can be improved.

[Solvent]

The composition of the present invention may contain a solvent. Preferred solvents are ethylene glycol monoethyl ether acetate, cyclohexanone, 2-heptanone, propylene glycol monomethyl ether (PGME, also known as 1-methoxy-2-propanol), propylene glycol monomethyl ether acetate (PG- MEA, also known as 1-methoxy-2-acetoxypropane), propylene glycol monomethyl ether propionate, propylene glycol monoethyl ether acetate, methyl 3-methoxypropionate, ethyl 3-ethoxypropionate, methyl β-methoxyisobutyrate, ethyl butyrate, propyl butyrate, methyl isobutyl ketone, ethyl acetate, isoamyl acetate, ethyl lactate, toluene, xylene, cyclohexyl acetate, diacetone alcohol, N-methylpyrrolidone, N,N-dimethylformamide, γ-butyrolactone, N,N-dimethylacetamide, propylene carbonate, ethylene carbonate and the like. These solvents may be used individually or in combination.

Solids contained in the composition of the present invention are preferably regulated so that the same is soluble in these solvents and that the solid content ranges from 1 to 40 mass %. The solid content is preferably in the range of 1 to 30 mass %, more preferably 3 to 20 mass %.

The present invention also relates to an actinic-ray- or radiation-sensitive film formed from the composition of the present invention. For example, this film is formed by coating a support, such as a substrate, with the composition of the present invention. The thickness of the film is preferably in the range of 0.02 to 0.1 μm. The coating of the substrate can be performed by appropriate coating methods, such as spin coating, roll coating, flow coating, dip coating, spray coating and doctor coating. Among these, spin coating is preferred. The rotating speed at spin coating is preferably in the range of 1000 to 3000 rpm. After coating, a thin film is formed by prebaking at 60 to 150° C. for 1 to 20 minutes, preferably 80 to 120° C. for 1 to 10 minutes.

As the material constituting the substrate to be wrought and the topmost surface layer thereof, in the instance of, for example, a semiconductor wafer, use can be made of a silicon wafer. Examples of the materials constituting the topmost surface layer include Si, $SiO_2$, SiN, SiON, TiN, WSi, BPSG, SOG, an antireflection film and the like.

Furthermore, the present invention relates to a mask blank provided with the actinic-ray- or radiation-sensitive film obtained in the above manner. When a pattern is formed on a photomask blank for photomask fabrication in order to obtain the mask blank provided with the actinic-ray- or radiation-sensitive film, a transparent substrate of quartz, calcium fluoride or the like can be mentioned as a useful transparent substrate. Generally, the substrate is laminated with necessary films selected from among functional films, such as a light shielding film, an antireflection film and a phase shift film and, additionally, an etching stopper film and an etching mask film. As a material of each of the functional films, use is made of silicon or a transition metal, such as chromium, molybdenum, zirconium, tantalum, tungsten, titanium or niobium. A film containing such a material is used in the form of a laminate. As a material for use in the topmost surface layer, there can be mentioned, for example, one whose main constituent material is silicon or a material comprised of silicon and, contained therein, oxygen and/or nitrogen, a silicon compound material whose main constituent material is a material comprised of the same and, contained therein, a transition metal, or a transition metal compound material whose main constituent material is a transition metal, especially at least one member selected from among chromium, molybdenum, zirconium, tantalum, tungsten, titanium, niobium and the like, or a material comprised of the same and, contained therein, at least one element selected from among oxygen, nitrogen and carbon.

The light shielding film, although may be in the form of a monolayer, is preferably in the form of a multilayer structure comprised of a plurality of materials superimposed one upon another by coating. In the multilayer structure, the thickness of each layer, although not particularly limited, is preferably in the range of 5 to 100 nm, more preferably 10 to 80 nm. The thickness of the whole of the light shielding film, although not particularly limited, is preferably in the range of 5 to 200 nm, more preferably 10 to 150 nm.

When a pattern formation is performed using the composition of the present invention on a photomask blank whose topmost surface layer contains a material comprised of chromium and, contained therein, oxygen or nitrogen among the above-mentioned materials, generally, it is likely to experience the occurrence of a constricted shape near the substrate, known as an undercut shape. This undercut problem can be alleviated by the use of the photomask blank of the present invention as compared with the prior art.

The actinic-ray- or radiation-sensitive film after exposure to actinic rays or radiation (electron beams, etc.) and preferably bake (usually 80 to 150° C., preferably 90 to 130° C.) is developed with water. Thus, a desirable pattern can be obtained. Using this pattern as a mask, appropriate etching treatment, ion injection, etc. are carried out, thereby obtaining a semiconductor nanocircuit, an imprint mold structure, etc.

With respect to the process for manufacturing an imprint mold by use of the composition of the present invention, reference can be made to descriptions made in, for example, Japanese Patent No. 4109085, JP-A-2008-162101 and "Fundamentals of nanoimprint and its technology development/application deployment—technology of nanoimprint substrate and its latest technology deployment" edited by Yoshihiko Hirai, published by Frontier Publishing.

One mode of using the actinic-ray- or radiation-sensitive resin composition of the present invention and a pattern forming method therefrom are summarized below.

The present invention also relates to a pattern forming method comprising exposing to light the above actinic-ray- or radiation-sensitive film or mask blank laminated with the film and developing the exposed actinic-ray- or radiation-sensitive film or the mask blank laminated with the exposed film. In the present invention, the exposure is preferably performed using electron beams or extreme ultraviolet.

With respect to the exposure to light (pattern forming operation) of the actinic-ray- or radiation-sensitive film in, for example, the manufacturing of a precision integrated circuit device, first, it is preferred to perform patternwise exposure of the actinic-ray- or radiation-sensitive film of the present invention to electron beams or extreme ultraviolet (EUV). The exposure is performed in an exposure amount of, in the use of electron beams, about 0.1 to 20 $\mu C/cm^2$, preferably about 3 to 10 $\mu C/cm^2$, and, in the use of extreme ultraviolet, about 0.1 to 20 $mJ/cm^2$, preferably about 3 to 15 $mJ/cm^2$. Subsequently, post-exposure bake is performed on a hot plate at 60 to 150° C. for 1 to 20 minutes, preferably 80 to 120° C. for 1 to 10 minutes. Thereafter, development, rinse and drying are performed to thereby obtain a pattern. The development is performed with a developer comprised of a 0.1 to 5 mass %, preferably 2 to 3 mass %, aqueous alkali solution containing, for example, tetramethylammonium hydroxide (TMAH) or tetrabutylammonium hydroxide (TBAH) for 0.1 to 3 minutes, preferably 0.5 to 2 minutes by conventional methods, such as a dip method, a puddle method and a spray method. The alkali developer may be loaded with an appropriate amount of an alcohol and/or a surfactant. Consequently, when the composition of the present invention is a negative composition for use in the formation of a negative pattern, the film in unexposed areas is dissolved while the film in exposed areas is highly insoluble in the developer since the compound (A) is crosslinked in the exposed areas. On the other hand, when the composition of the present invention is a positive composition for use in the formation of a positive pattern, the film in exposed areas is dissolved while the film in unexposed areas is highly insoluble in the developer. Thus, a desired pattern is formed on the substrate.

EXAMPLES

The present invention will be described in greater detail below by way of its examples. However, the gist of the present invention is in no way limited to these examples.

Synthetic Example 1

Synthesis of Polymeric Compound (A1)

Poly(p-hydroxystyrene) (VP-2500) produced by Nippon Soda Co., Ltd. amounting to 10 g was dissolved in 100 ml of tetrahydrofuran (THF). Thereafter, 2.34 g of cyclohex-3-enecarbonyl chloride and 1.77 g of triethylamine were added to the solution and agitated at 50° C. for 4 hours. The reaction liquid was cooled to room temperature, and 100 ml of ethyl acetate and 100 ml of distilled water were added thereto. While agitating the reaction liquid in ice water, a 1N aqueous HCl solution was added little by little thereto, thereby neutralizing the reaction liquid. The resultant reaction liquid was transferred into a separatory funnel, and the water phase was removed. The thus obtained organic phase was washed with 200 ml of distilled water five times, and the washed organic phase was concentrated and dropped into 2 lit. of hexane. The thus obtained powder was separated by filtration, isolated and dried in vacuum. Thus, 14.7 g of polymeric compound (X1) comprising the following repeating units was obtained. The $^1$H-NMR chart of obtained compound (X1) measured in $d^6$-DMSO as a solvent is shown in FIG. 1.

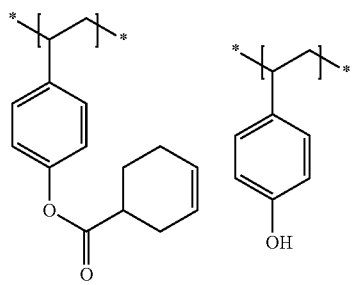

X1

Figure 2:
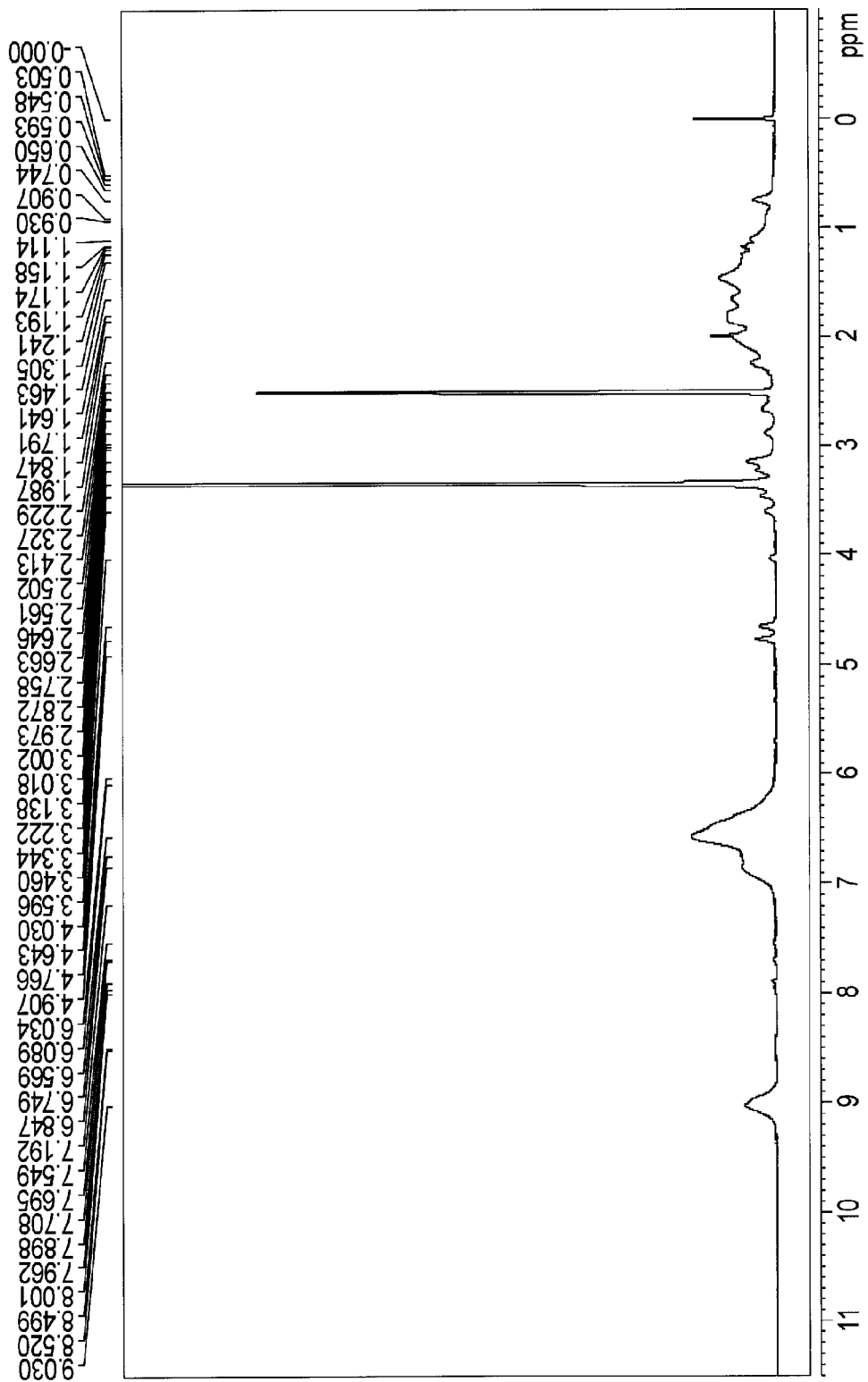
FIG. 2 is a chart showing a $^1$H-NMR spectrum of polymeric compound (A1) obtained in Synthetic Example 1.

Polymeric compound (X1) amounting to 14.7 g was dissolved in 100 ml of ethyl acetate, and 8.4 g of mCPBA (70 wt % aqueous solution) was added to the solution and agitated at room temperature for 3 days. Thereafter, 100 ml of saturated aqueous sodium hydrogen carbonate solution and 100 ml of ethyl acetate were added to the reaction liquid. The resultant reaction liquid was transferred into a separatory funnel, and the water phase was removed. A 1N aqueous HCl solution was added little by little to the organic phase, thereby neutralizing the same. The resultant organic phase was washed with 200 ml of distilled water five times, and the washed organic phase was concentrated and dropped into 2 lit. of hexane. The thus obtained powder was separated by filtration, isolated and dried in vacuum. Thus, 11.7 g of polymeric compound (A1) defined in Table 1 to be given hereinafter was obtained. The $^1$H-NMR chart of obtained polymeric compound (A1) measured in $d^6$-DMSO as a solvent is shown in FIG. 2.

Synthetic Example 2

Synthesis of Polymeric Compound (A3)

Figure 3:
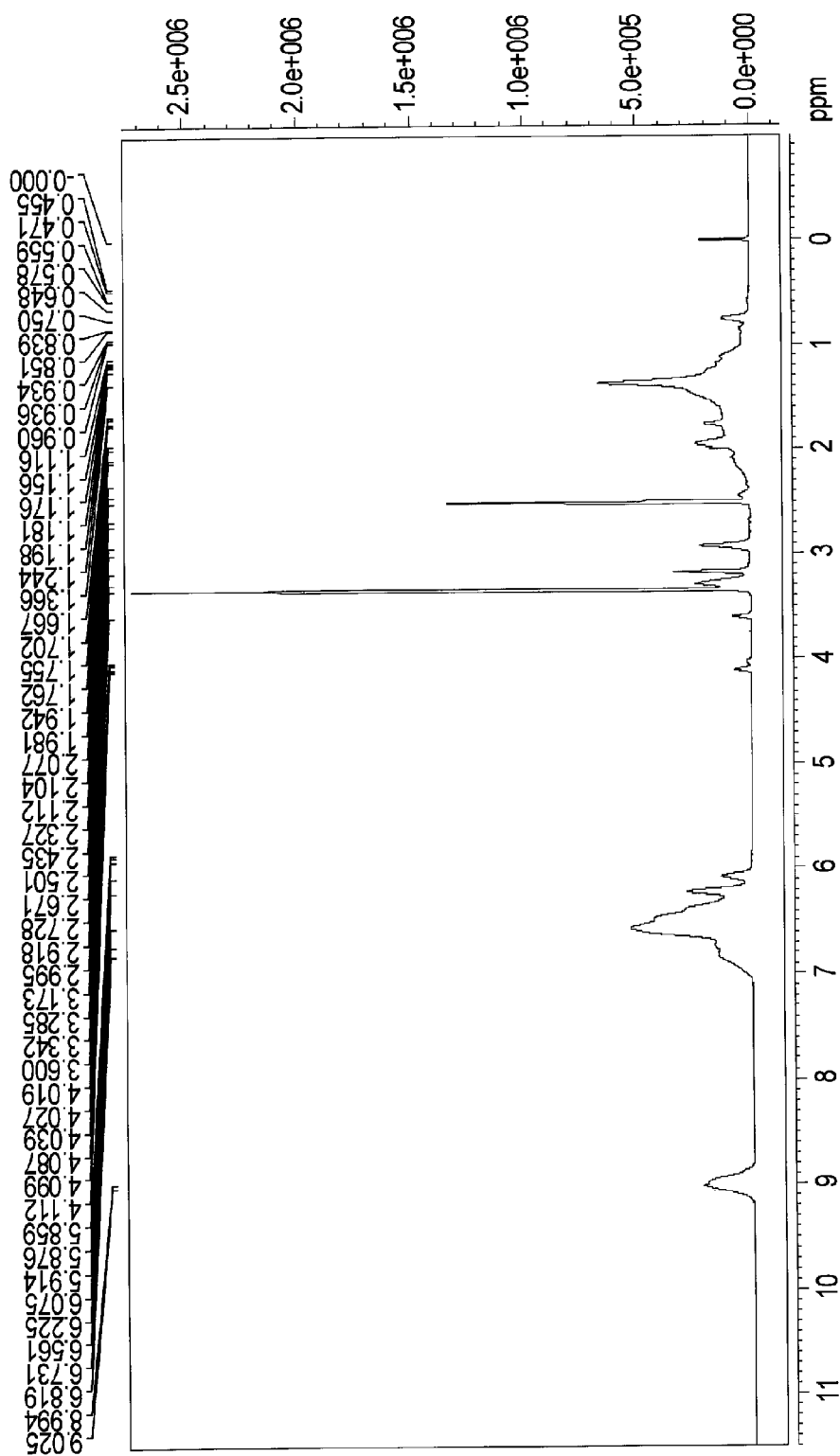
FIG. 3 is a chart showing a $^1$H-NMR spectrum of polymeric compound (X3) obtained in Synthetic Example 2.

Poly(p-hydroxystyrene) (VP-2500) produced by Nippon Soda Co., Ltd. amounting to 15 g was dissolved in 100 ml of tetrahydrofuran (THF). Thereafter, 4.89 g of bicyclo[2.2.1] hept-5-ene-2-carbonyl chloride and 3.79 g of triethylamine were added to the solution and agitated at 50° C. for 4 hours. The reaction liquid was cooled to room temperature, and 100 ml of ethyl acetate and 100 ml of distilled water were added thereto. While agitating the reaction liquid in ice water, a 1N aqueous HCl solution was added little by little thereto, thereby neutralizing the reaction liquid. The resultant reaction liquid was transferred into a separatory funnel, and the water phase was removed. The thus obtained organic phase was washed with 200 ml of distilled water five times, and the washed organic phase was concentrated and dropped into 2 lit. of hexane. The thus obtained powder was separated by filtration, isolated and dried in vacuum. Thus, 17.7 g of polymeric compound (X3) comprising the following repeating units was obtained. The $^1$H-NMR chart of obtained polymeric compound (X3) measured in $d^6$-DMSO as a solvent is shown in FIG. 3.

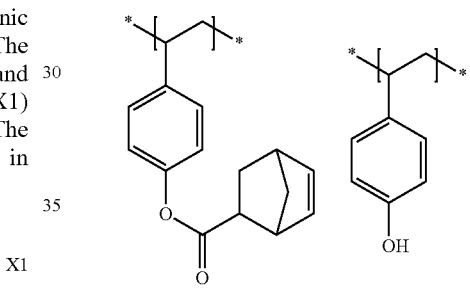

X3

Figure 4:
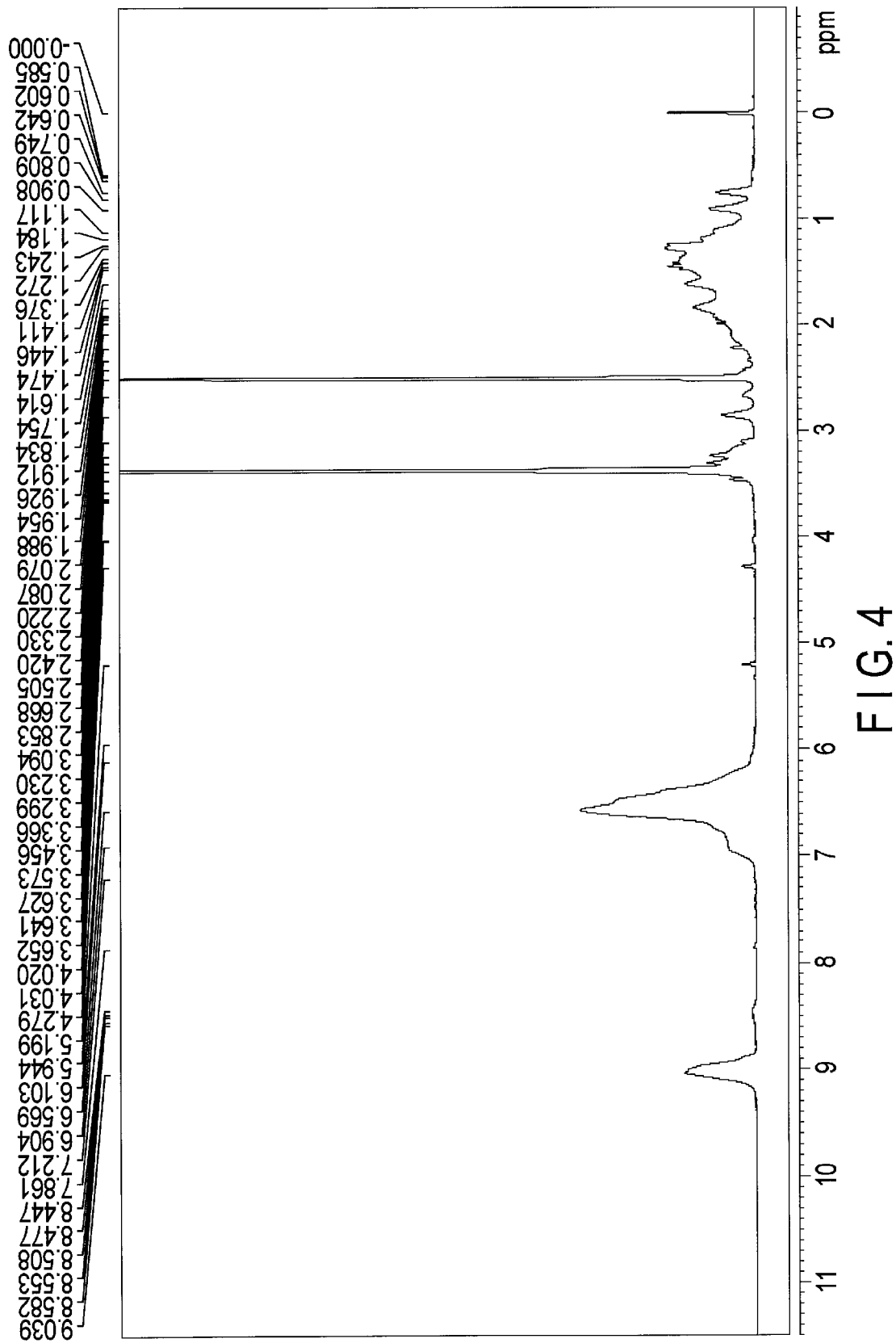
FIG. 4 is a chart showing a $^1$H-NMR spectrum of polymeric compound (A3) obtained in Synthetic Example 2.

Polymeric compound (X3) amounting to 7.0 g was dissolved in 100 ml of ethyl acetate, and 2.5 g of mCPBA (70 wt % aqueous solution) was added to the solution and agitated at room temperature for 3 days. Thereafter, 100 ml of saturated aqueous sodium hydrogen carbonate solution and 100 ml of ethyl acetate were added to the reaction liquid. The resultant reaction liquid was transferred into a separatory funnel, and the water phase was removed. A 1N aqueous HCl solution was added little by little to the organic phase, thereby neutralizing the same. The resultant organic phase was washed with 200 ml of distilled water five times, and the washed organic phase was concentrated and dropped into 2 lit. of hexane. The thus obtained powder was separated by filtration, isolated and dried in vacuum. Thus, 6.7 g of polymeric compound (A3) defined in Table 1 to be given hereinafter was obtained. The $^1$H-NMR chart of obtained polymeric compound (A3) measured in $d^6$-DMSO as a solvent is shown in FIG. 4.

Compounds A2, A4 to A10 and A18 were also synthesized in the same manner as in Synthetic Example 1 or 2.

Synthetic Example 3

Synthesis of Polymeric Compound (A11)

First, 32.4 g of 2,6-bis(methoxymethyl)-4-methylphenol was dissolved in 200 ml of tetrahydrofuran. Subsequently, 23.4 g of triethylamine was added to the solution and agitated at 0° C. Thereafter, 22.4 g of 2-chloroacetyl chloride was added to the mixture and agitated at room temperature for 4 hours. The reaction liquid was loaded with 100 ml of ethyl acetate and 100 ml of distilled water, and transferred into a separatory funnel. The water phase was removed, and the organic phase was washed with 200 ml of distilled water thrice, and concentrated. The concentrate was purified by silica gel column chromatography, and the solvent was distilled off in vacuum. The product was dried in vacuum, thereby obtaining 30.8 g of compound (Y).

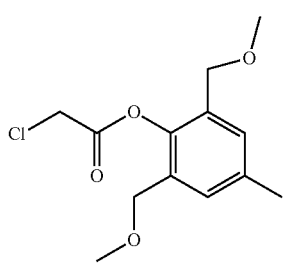

Y $^1$H-NMR (DMSO-d6: ppm) δ: 2.32 (3H, s), 3.24 (6H, s), 4.29 (4H, s), 4.73 (2H, s), 7.20 (2H, s).

Poly(p-hydroxystyrene) (VP-2500) produced by Nippon Soda Co., Ltd. amounting to 10 g was dissolved in 100 ml of dimethyl sulfoxide. Thereafter, 5.8 g of potassium carbonate, 100 mg of sodium iodide and 4.5 g of compound (Y) were added to the solution and agitated at 60° C. for 4 hours. The reaction liquid was cooled to room temperature, and 100 ml of ethyl acetate and 100 ml of distilled water were added thereto. While agitating the reaction liquid in ice water, a 1N aqueous HCl solution was added little by little thereto, thereby neutralizing the reaction liquid. The resultant reaction liquid was transferred into a separatory funnel, and the water phase was removed. The thus obtained organic phase was washed with 200 ml of distilled water five times, and the washed organic phase was concentrated and dropped into 2 lit. of hexane. The thus obtained powder was separated by filtration, isolated and dried in vacuum. Thus, 9.7 g of polymeric compound (A11) comprising the following repeating units was obtained.

Synthetic Example 4

Synthesis of Polymeric Compound (A12)

First, 20 g of 2-(2,6-bis(methoxymethyl)-4-methylphenoxy)ethanol (Y0) was dissolved in 200 ml of tetrahydrofuran. Subsequently, 13.8 g of triethylamine and 9.53 g of methanesulfonyl chloride were added to the solution and agitated at room temperature for 4 hours. The reaction liquid was loaded with 100 ml of ethyl acetate and 100 ml of distilled water, and transferred into a separatory funnel. The water phase was removed, and the organic phase was washed with 200 ml of distilled water thrice. The solvent was distilled off in vacuum from the organic phase. The product was dried in vacuum, thereby obtaining 22.7 g of compound (Y1).

$^1$H-NMR (CDCl$_3$: ppm) δ: 2.32 (3H, s), 3.11 (3H, s), 3.42 (6H, s), 4.19-4.16 (2H, m), 4.45 (4H, s), 4.56-4.54 (2H, s), 7.12 (2H, s).

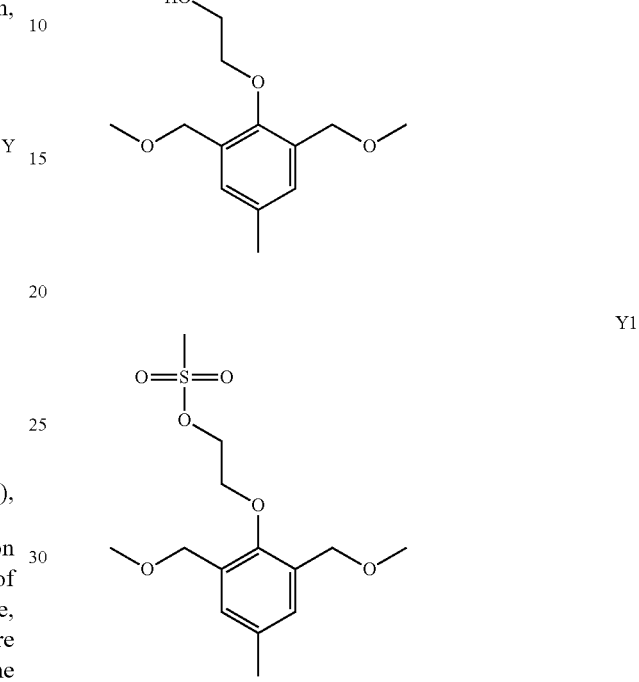

Poly(p-hydroxystyrene) (VP-2500) produced by Nippon Soda Co., Ltd. amounting to 10 g was dissolved in 120 g of dimethyl sulfoxide (DMSO). Thereafter, 3.45 g of potassium carbonate and 3.97 g of compound (Y1) were added to the solution and agitated at 50° C. for 5 hours. The reaction liquid was transferred into a separatory funnel loaded with 300 ml of ethyl acetate, and the organic phase was washed with 300 ml of water five times. The washed organic phase was concentrated by means of an evaporator, while partially removing the solvent.

Figure 5:
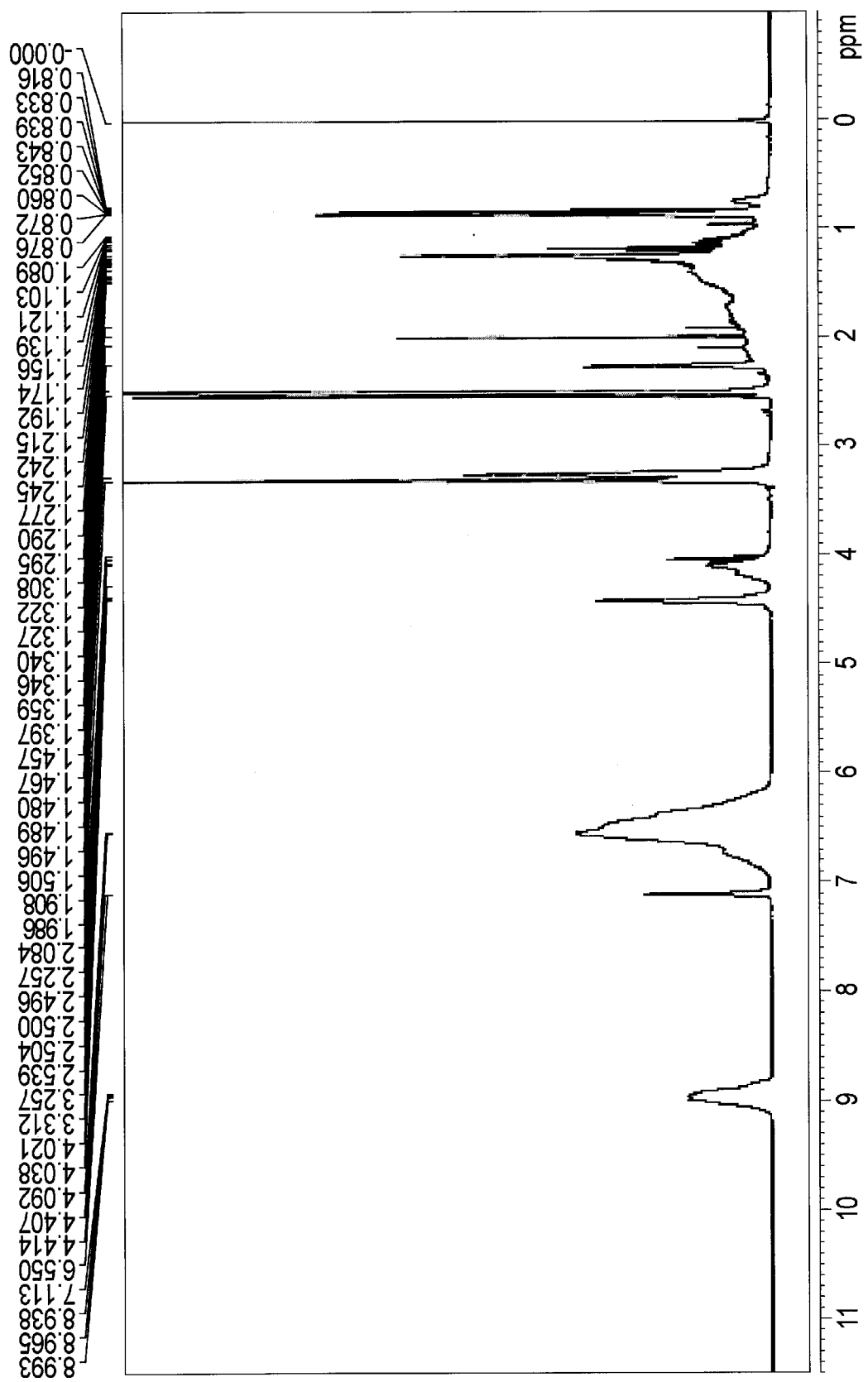
FIG. 5 is a chart showing a $^1$H-NMR spectrum of polymeric compound (A12) obtained in Synthetic Example 4.

The resultant solution was dropped into 1 lit. of hexane. The supernatant was removed, and the thus obtained precipitate was dried in vacuum, thereby obtaining 11.5 g of polymeric compound (A12) according to the present invention. The $^1$H-NMR chart of obtained polymeric compound (A12) measured in d$^6$-DMSO as a solvent is shown in FIG. 5.

Synthetic Example 5

Synthesis of Polymeric Compound (A13)

First, 16 g of 2,4,6-tris(methoxymethyl)phenol (Y2) was dissolved in 200 ml of dimethyl sulfoxide. Subsequently, 39.09 g of potassium carbonate and 53.13 g of dibromoethane were added to the solution and agitated at 40° C. for 4 hours. The reaction liquid was loaded with 100 ml of ethyl acetate and 100 ml of distilled water, and transferred into a separatory funnel. The water phase was removed, and the organic phase was washed with 200 ml of distilled water thrice. The solvent was distilled off in vacuum from the organic phase, and the product was purified by silica gel column chromatography. Thus, 17.7 g of compound (Y3) was obtained.

$^1$H-NMR (d6-DMSO: ppm) δ: 3.28 (3H, s), 3.33 (6H, s), 3.83-3.80 (2H, m), 4.15-4.12 (2H, m), 4.59 (2H, s), 4.68 (4H, s), 7.27 (2H, s).

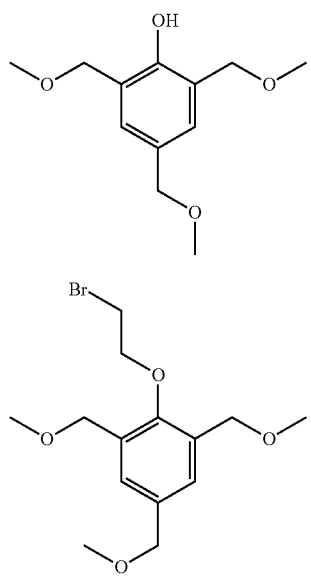

Poly(p-hydroxystyrene) (VP-2500) produced by Nippon Soda Co., Ltd. amounting to 10 g was dissolved in 120 g of dimethyl sulfoxide (DMSO). Thereafter, 2.30 g of potassium carbonate and 2.70 g of compound (Y3) were added to the solution and agitated at 50° C. for 5 hours. The reaction liquid was transferred into a separatory funnel loaded with 300 ml of ethyl acetate, and the organic phase was washed with 300 ml of water five times. The washed organic phase was concentrated by means of an evaporator, while partially removing the solvent.

The resultant solution was dropped into 1 lit. of hexane. The supernatant was removed, and the thus obtained precipitate was dried in vacuum, thereby obtaining 11.6 g of polymeric compound (A13) according to the present invention.

Compounds A14 to A19 were also synthesized in the same manner as in Synthetic Example 3.

With respect to each of the obtained polymeric compounds, the component ratio (molar ratio) was calculated from $^1$H-NMR measurements. Further, with respect to each of the obtained polymeric compounds, the weight average molecular weight (Mw: polystyrene-equivalent), number average molecular weight (Mn: polystyrene-equivalent) and polydispersity index (PDI: Mw/Mn) were calculated from GPC (solvent: THF) measurements. These results together with the chemical formulae are given in the following tables.

Moreover, polymeric compounds (R1) to (R4) were synthesized for comparative purposes. With respect to each of these compounds, the chemical formula, component ratio, weight average molecular weight and polydispersity index are given in the following tables.

TABLE 1

| Compd. (A) | Chemical formula | Composition ratio (molar ratio) | Mw | PDI |
|---|---|---|---|---|
| Compd. (A1) | | 30/70 | 3800 | 1.12 |
| Compd. (A2) | | 30/70 | 4200 | 1.13 |

TABLE 1-continued
| Compd. (A) | Chemical formula | Composition ratio (molar ratio) | Mw | PDI |
|---|---|---|---|---|
| Compd. (A3) | 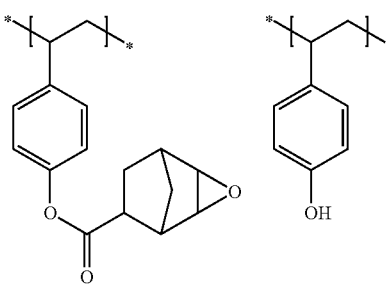 | 19/81 | 3900 | 1.13 |
| Compd. (A4) | 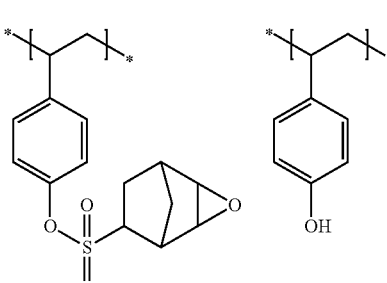 | 25/75 | 5400 | 1.12 |
| Compd. (A5) | 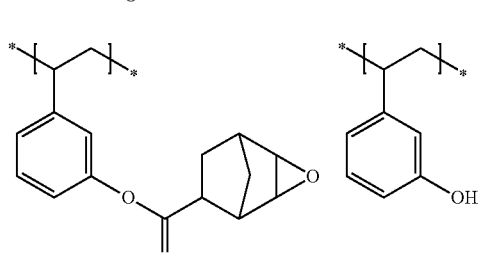 | 20/80 | 5500 | 1.12 |
| Compd. (A6) | 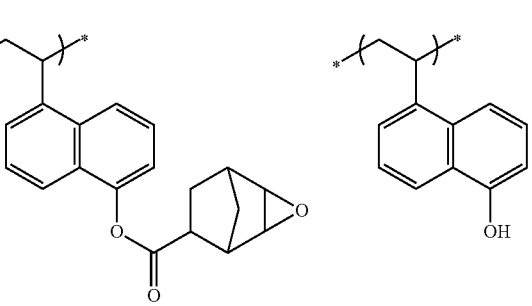 | 15/85 | 5500 | 1.11 |
| Compd. (A7) | 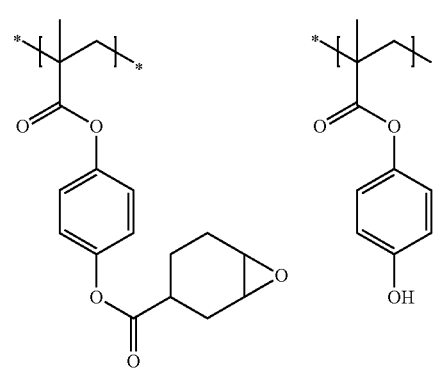 | 25/75 | 6500 | 1.32 |

TABLE 1-continued
| Compd. (A) | Chemical formula | Composition ratio (molar ratio) | Mw | PDI |
|---|---|---|---|---|
| Compd. (A8) | 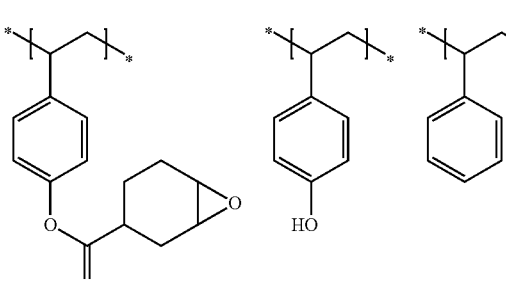 | 20/75/5 | 6500 | 1.45 |
| Compd. (A9) | 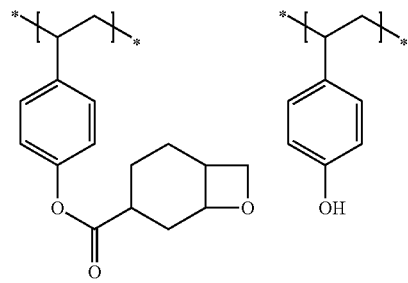 | 30/70 | 3900 | 1.14 |
| Compd. (A10) | 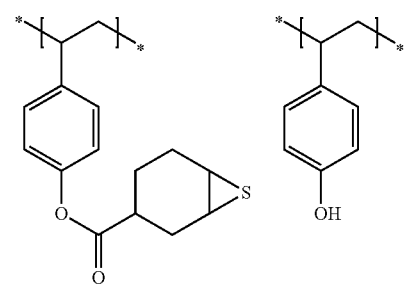 | 30/70 | 3800 | 1.14 |
| Compd. (A11) | 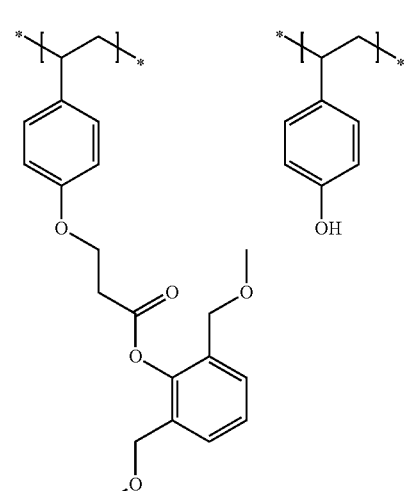 | 20/80 | 3800 | 1.14 |

TABLE 1-continued
| Compd. (A) | Chemical formula | Composition ratio (molar ratio) | Mw | PDI |
|---|---|---|---|---|
| Compd. (A12) | 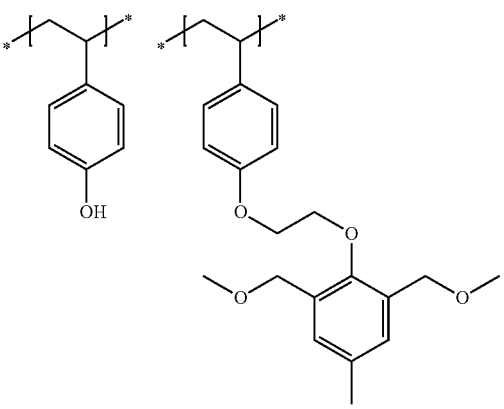 | 70/30 | 3800 | 1.14 |
| Compd. (A13) | 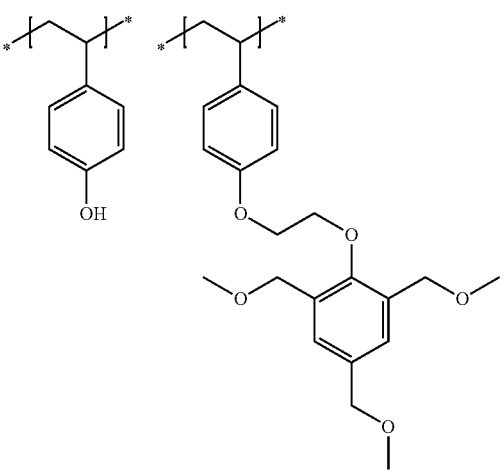 | 90/10 | 3800 | 1.14 |
| Compd. (A14) | 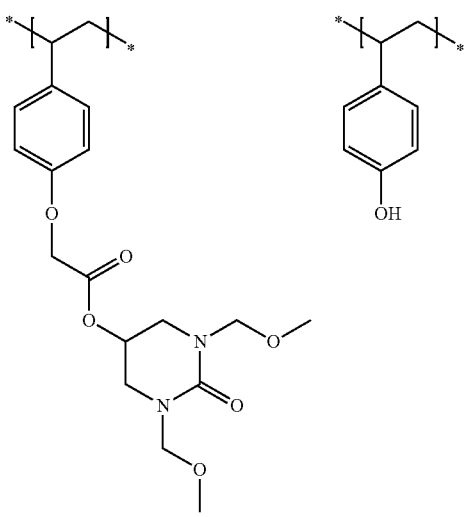 | 20/80 | 3800 | 1.14 |

TABLE 1-continued
| Compd. (A) | Chemical formula | Composition ratio (molar ratio) | Mw | PDI |
|---|---|---|---|---|
| Compd. (A15) | 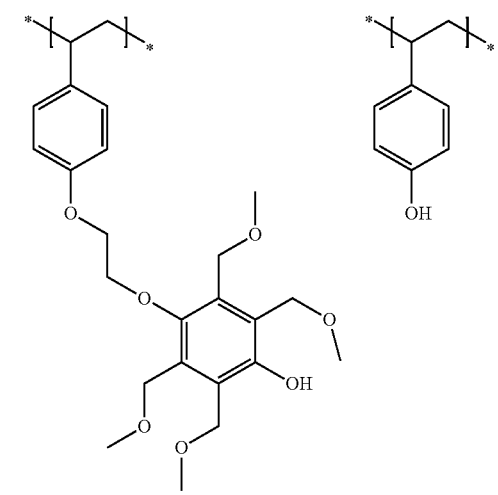 | 20/80 | 3900 | 1.14 |
| Compd. (A16) | 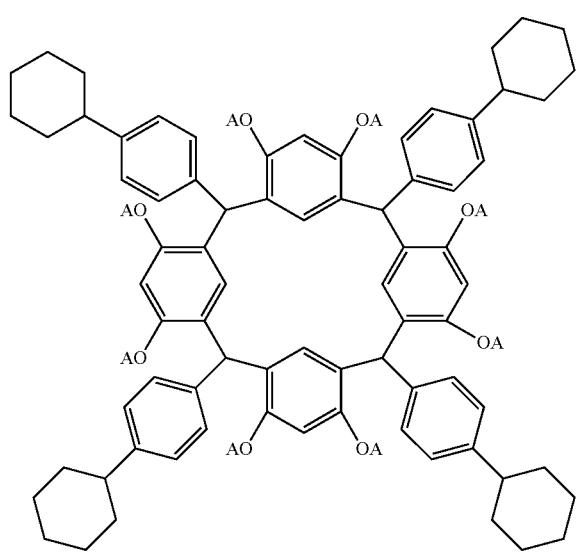 | | | |
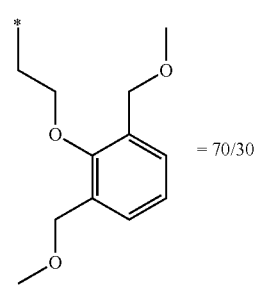

TABLE 1-continued
| Compd. (A) | Chemical formula | Composition ratio (molar ratio) | Mw | PDI |
|---|---|---|---|---|
| Compd. (A17) | 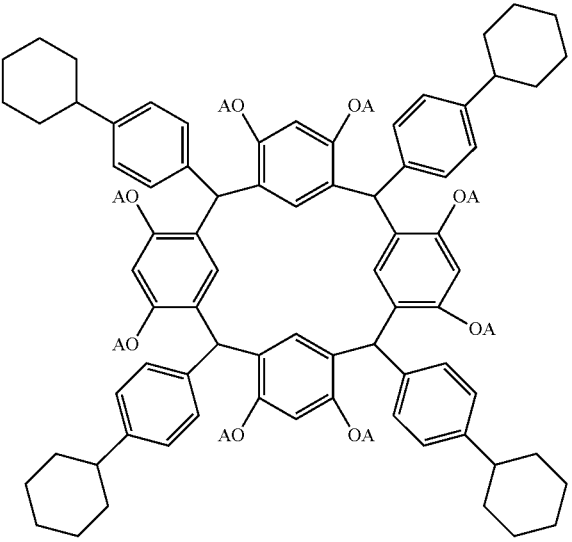 A (molar ratio) = H/ 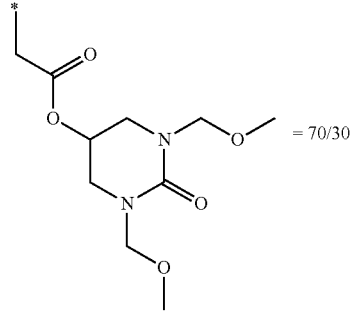 = 70/30 | — | — | — |
| Compd. (A18) | 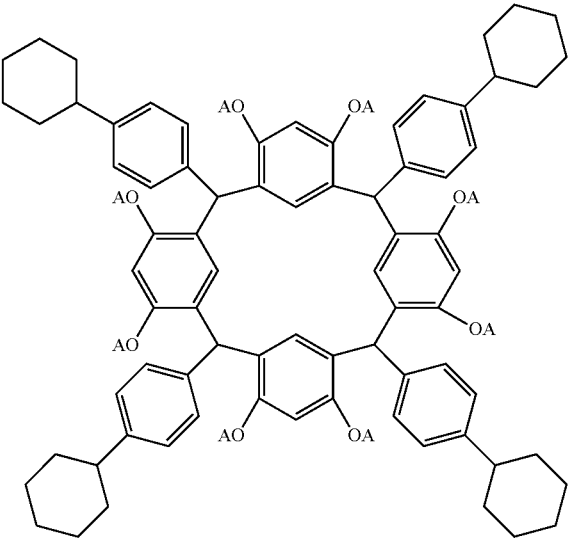 A (molar ratio) = H/ 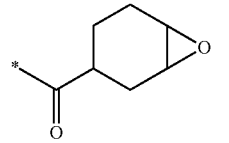 = 70/30 | — | — | — |

TABLE 1-continued
| Compd. (A) | Chemical formula | Composition ratio (molar ratio) | Mw | PDI |
|---|---|---|---|---|
| Compd. (A19) | 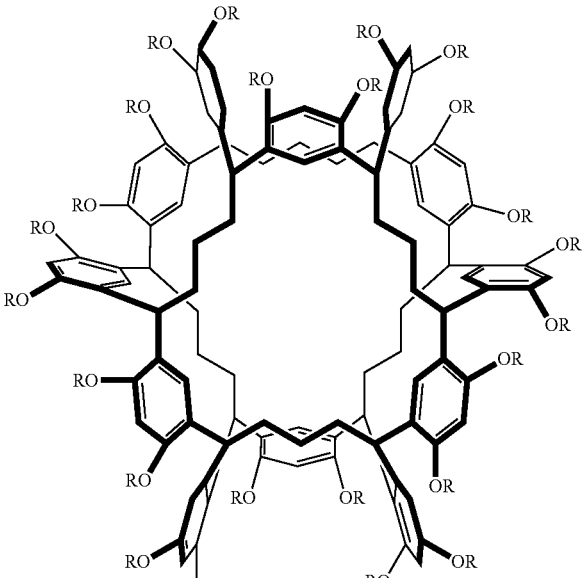<br>R (molar ratio) = H/ 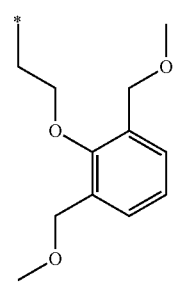 = 70/30 | — | — | — |
| Comp. polymer compd. (R1) | 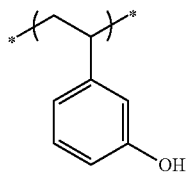 | 100 | 4500 | 1.13 |
| Comp. polymer compd. (R2) | 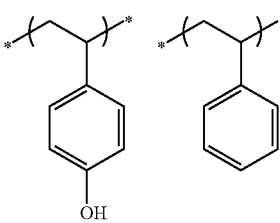 | 90/10 | 8000 | 1.51 |

TABLE 1-continued

| Compd. (A) | Chemical formula | Composition ratio (molar ratio) | Mw | PDI |
|---|---|---|---|---|
| Comp. polymer compd. (R3) | 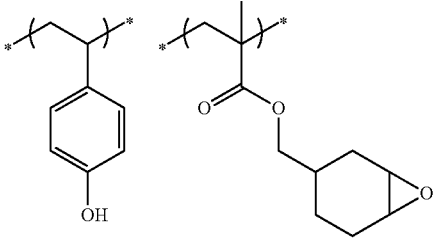 | 85/15 | 7000 | 1.45 |
| Comp. polymer compd. (R4) | 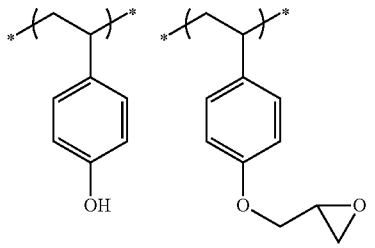 | 80/20 | 4500 | 1.12 |
| Comp. polymer compd. (R5) | 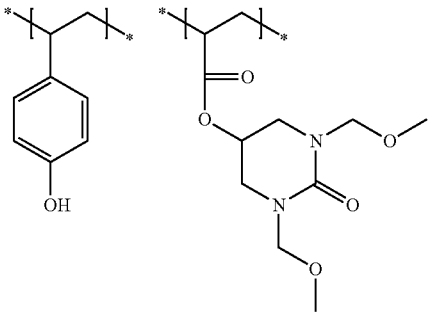 | 80/20 | 4500 | 1.51 |

Examples 1A to 41A and Comparative Examples 1A to 5A

Exposed to Electron Beams; Negative Type; Developed with Alkali

Example 1A (1) Provision of Support

A 6-inch wafer coated with Cr oxide by vapor deposition (common one having undergone a shielding film treatment for use in photomask blanks) was provided.

(2) Provision of Resist Coating Liquid (Coating Liquid Formulation of Negative Resist Composition N1)

| | |
|---|---|
| Compound (A1) | 0.72 g |
| Acid generator (z61) (formula shown below) | 0.12 g |
| Crosslinking agent CL-1 (formula shown below) | 0.08 g |
| Crosslinking agent CL-4 (formula shown below) | 0.04 g |
| Tetrabutylammonium hydroxide (basic compound) | 0.002 g |
| 2-Hydroxy-3-naphthoic acid (organic carboxylic acid) | 0.012 g |
| Surfactant PF6320 (produced by OMNOVA) | 0.001 g |
| Propylene glycol monomethyl ether acetate (solvent) | 4.0 g |
| Propylene glycol monomethyl ether (solvent) | 5.0 g |

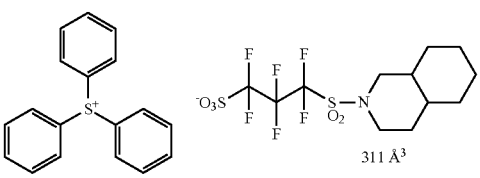

311 Å$^3$ (z61)

-continued

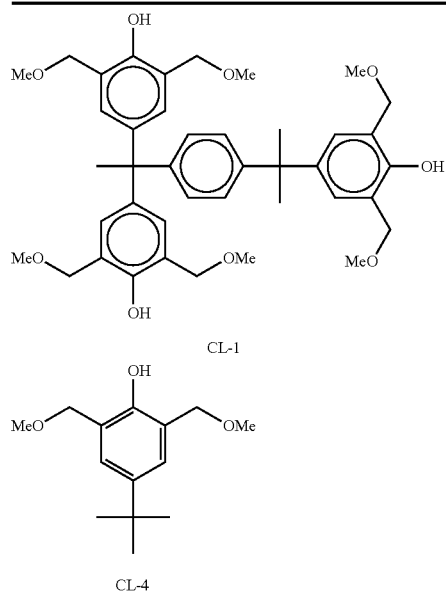

CL-1

CL-4

The above composition in solution form was precision filtered through a membrane filter of 0.04 μm pore diameter, thereby obtaining a resist coating solution (composition N1).

(3) Formation of Resist Film

The obtained resist coating solution was applied onto the above 6-inch wafer by means of a spin coater Mark 8 manufactured by Tokyo Electron Limited, and dried on a hot plate at 110° C. for 90 seconds, thereby obtaining a 100 nm-thick resist film. Namely, a mask blank with the resist film was obtained.

(4) Formation of Negative Resist Pattern

This resist film was patternwise exposed to electron beams by means of an electron beam lithography system (model ELS-7500 manufactured by Elionix Inc., acceleration voltage 50 KeV). After the exposure, the film was baked on a hot plate at 120° C. for 90 seconds, dipped in a 2.38 mass % aqueous tetramethylammonium hydroxide (TMAH) solution for 60 seconds, rinsed with water for 30 seconds and dried.

(5) Evaluation of Resist Pattern

The obtained patterns were evaluated by the following methods with respect to the sensitivity, resolving power, pattern shape, line edge roughness (LER), scum and dry etching resistance. The results are listed in Table 3 below.
[Sensitivity]
The shape of a cross section of each of the obtained patterns was observed by means of a scanning electron microscope (model S-4300, manufactured by Hitachi, Ltd.). The sensitivity was defined as the exposure amount (amount of electron beam exposure) in which a resist pattern of 100 nm line width (line:space=1:1) was resolved. The smaller the value of this exposure amount, the higher the sensitivity.
[LS Resolving Power]
The LS resolving power (nm) was defined as the limiting resolving power (minimum line width permitting the separation and resolution of a line and a space (line:space=1:1)) in the exposure amount (amount of electron beam exposure) exhibiting the above sensitivity.
[IS Resolving Power]
The IS resolving power (nm) was defined as the limiting resolving power (minimum line width permitting the separation and resolution of a space and a line) in the minimum exposure amount realizing the resolution of an isolated space pattern of 100 nm line width (space:line=1:>100).
[Pattern Shape]
The shape of cross section of each line pattern of 100 nm line width (L/S=1:1) in the exposure amount (amount of electron beam exposure) exhibiting the above sensitivity was observed by means of a scanning electron microscope (model S-4300, manufactured by Hitachi, Ltd.). The shape of cross section of each line pattern when the ratio of [line width of line pattern at top portion (surface portion)/line width of line pattern at middle portion (position at half of the height of the line pattern)] was 1.5 or greater was graded into "inverted taper"; that when the ratio was in the range of 1.2 to less than 1.5 was graded into "slightly inverted taper"; and that when the ratio was less than 1.2 was graded into "rectangle."
[Evaluation of Scum]
A line pattern was formed in the same manner as mentioned above in the [pattern shape]. With respect to the line pattern, a cross-section micrograph was taken using SEM 54800 (manufactured by Hitachi High-Technologies Corporation). The presence of any residue in space portions was checked, and the following evaluation was made.
C: scum was observed, and there was partial inter-pattern bridging.
B: scum was observed, but there was no inter-pattern bridging.
A: no scum was observed at all.
[Dry Etching Resistance]
Dry etching by means of HITACHI U-621 using an Ar/$C_4F_6$/$O_2$ gas (volume ratio 100/4/2 mixed gas) for 30 seconds was performed on each resist film provided with a resist pattern of 100 nm line width (line:space=1:1) in the exposure amount (amount of electron beam exposure) exhibiting the above sensitivity. Thereafter, the ratio of remaining resist film was measured as an index of the dry etching resistance.
Very good: remaining film ratio 95% or more,
good: 90% to less than 95%, and
poor: less than 90%.
[Line Edge Roughness (LER)]
A line pattern of 100 nm line width (L/S=1/1) was formed in the exposure amount (amount of electron beam exposure) exhibiting the above sensitivity. At arbitrary 30 points within 50 μm in the longitudinal direction of the line pattern, the distance between actual edge and a reference line on which edges were to be present was measured by means of a scanning electron microscope (model S-9220, manufactured by Hitachi, Ltd.). The standard deviation of measured distances was determined, and 3σ was computed therefrom. The smaller the value thereof, the more favorable the performance exhibited.

Examples 2A to 41A and Comparative Examples 1A to 5A

The negative resist compositions N2 to N40 and comparative compositions N'1 to N'5 specified in Table 2 below were prepared in the same manner as mentioned above for the composition N1, and negative patterns were also formed therefrom in the same manner. Further, evaluation was also made in the same manner. The results are listed in Table 3 below.

TABLA 2

| Composition | Compd.(A) | Acid generator | Basic compd. | Crosslinking agent | Organic carboxylic acid | Surfactant | Solvent |
|---|---|---|---|---|---|---|---|
| N1 | A1 (0.72 g) | z61 (0.12 g) | B1 (0.002 g) | CL-1/CL-4 (0.08 g/0.04 g) | D1 (0.012 g) | W-1 (0.001 g) | S2/S1 (5.0 g/4.0 g) |
| N2 | A2 (0.72 g) | z61 (0.12 g) | B1 (0.002 g) | CL-1/CL-4 (0.08 g/0.04 g) | D1 (0.012 g) | W-1 (0.001 g) | S1/S3 (5.0 g/4.0 g) |
| N3 | A3 (0.72 g) | z61 (0.12 g) | B1 (0.002 g) | CL-1/CL-4 (0.08 g/0.04 g) | D1 (0.012 g) | W-1 (0.001 g) | S2/S3 (5.0 g/4.0 g) |
| N4 | A4 (0.72 g) | z61 (0.12 g) | B1 (0.002 g) | CL-1/CL-4 (0.08 g/0.04 g) | D1 (0.012 g) | W-1 (0.001 g) | S2/S7 (5.0 g/4.0 g) |
| N5 | A5 (0.72 g) | z61 (0.12 g) | B1 (0.002 g) | CL-1/CL-4 (0.08 g/0.04 g) | D1 (0.012 g) | W-1 (0.001 g) | S2/S1 (5.0 g/4.0 g) |
| N6 | A6 (0.72 g) | z61 (0.12 g) | B1 (0.002 g) | CL-1/CL-4 (0.08 g/0.04 g) | D1 (0.012 g) | W-1 (0.001 g) | S2/S1 (5.0 g/4.0 g) |
| N7 | A7 (0.72 g) | z61 (0.12 g) | B1 (0.002 g) | CL-1/CL-4 (0.08 g/0.04 g) | D1 (0.012 g) | W-1 (0.001 g) | S1/S2/S6 (4.0 g/4.0 g/1.0 g) |
| N8 | A1/A2 (0.42 g/0.3 g) | z61 (0.12 g) | B1 (0.002 g) | CL-1/CL-4 (0.08 g/0.04 g) | D1 (0.012 g) | W-1 (0.001 g) | S1/S2/S5 (4.0 g/4.0 g/1.0 g) |
| N9 | A1 (0.84 g) | z61 (0.12 g) | B1 (0.002 g) | None | D1 (0.012 g) | W-1 (0.001 g) | S1/S2/S4 (4.0 g/4.0 g/1.0 g) |
| N10 | A2 (0.84 g) | z61 (0.12 g) | B1 (0.002 g) | None | D3 (0.012 g) | W-3 (0.001 g) | S2/S1 (5.0 g/4.0 g) |
| N11 | A3 (0.84 g) | z67 (0.12 g) | B1 (0.002 g) | None | D2 (0.012 g) | W-1 (0.001 g) | S2/S1 (5.0 g/4.0 g) |
| N12 | A4 (0.84 g) | z68 (0.12 g) | B1 (0.002 g) | None | D2 (0.012 g) | W-2 (0.001 g) | S2/S1 (5.0 g/4.0 g) |
| N13 | A5 (0.84 g) | z66 (0.12 g) | B1/B6 (0.001 g/0.001 g) | None | D1 (0.012 g) | W-3 (0.001 g) | S2/S1 (5.0 g/4.0 g) |
| N14 | A6 (0.84 g) | z37 (0.12 g) | B1 (0.002 g) | None | D1 (0.012 g) | W-1 (0.001 g) | S2/S1 (5.0 g/4.0 g) |
| N15 | A7 (0.84 g) | z5 (0.12 g) | B4 (0.002 g) | None | D2 (0.012 g) | W-2 (0.001 g) | S2/S1 (5.0 g/4.0 g) |
| N16 | A1 (0.72 g) | z2 (0.12 g) | B3 (0.002 g) | None | D1 (0.012 g) | W-1 (0.001 g) | S2/S1 (5.0 g/4.0 g) |
| N17 | A1 (0.72 g) | z49 (0.12 g) | B2 (0.002 g) | CL-1 (0.12 g) | D1 (0.012 g) | W-1 (0.001 g) | S2/S1 (5.0 g/4.0 g) |
| N18 | A2 (0.72 g) | z5/z48 (0.06 g/0.06 g) | B1/B6 (0.001 g/0.001 g) | CL-2 (0.12 g) | D1 (0.012 g) | W-1 (0.001 g) | S2/S1 (5.0 g/4.0 g) |
| N19 | A2 (0.72 g) | z37 (0.12 g) | B5 (0.002 g) | CL-1/CL-4 (0.04 g/0.08 g) | D1 (0.012 g) | W-1 (0.001 g) | S2/S1 (5.0 g/4.0 g) |
| N20 | A2 (0.72 g) | z8 (0.12 g) | B1 (0.002 g) | CL-1/CL-4 (0.06 g/0.06 g) | D1 (0.012 g) | W-1 (0.001 g) | S2/S1 (5.0 g/4.0 g) |
| N21 | A2 (0.72 g) | z65 (0.12 g) | B1 (0.002 g) | CL-1/CL-4 (0.08 g/0.04 g) | D2 (0.012 g) | W-2 (0.001 g) | S2/S1 (5.0 g/4.0 g) |
| N22 | A2 (0.72 g) | z63 (0.12 g) | B1 (0.002 g) | CL-1/CL-4 (0.08 g/0.04g) | D3 (0.012 g) | W-2 (0.001 g) | S2/S1 (5.0 g/4.0 g) |
| N23 | A2 (0.72 g) | z42 (0.12 g) | B1 (0.002 g) | CL-1/CL-4 (0.08 g/0.04 g) | D2 (0.012 g) | W-2 (0.001 g) | S2/S1 (5.0 g/4.0 g) |
| N24 | A8 (0.72 g) | z61 (0.12 g) | B1 (0.002 g) | CL-1/CL-4 (0.08 g/0.04 g) | D2 (0.012 g) | W-1 (0.001 g) | S2/S1 (5.0 g/4.0 g) |
| N25 | A9 (0.72 g) | z61 (0.12 g) | B1 (0.002 g) | CL-1/CL-4 (0.08 g/0.04 g) | D1 (0.012 g) | W-1 (0.001 g) | S2/S1 (5.0 g/4.0 g) |
| N26 | A10 (0.72 g) | z61 (0.12 g) | B1 (0.002 g) | CL-1/CL-4 (0.08 g/0.04 g) | D1 (0.012 g) | W-1 (0.001 g) | S2/S1 (5.0 g/4.0 g) |
| N27 | A11 (0.72 g) | z61 (0.12 g) | B1 (0.002 g) | CL-1/CL-4 (0.08 g/0.04 g) | D1 (0.012 g) | None | S2/S1 (5.0 g/4.0 g) |
| N28 | A12 (0.72 g) | z61 (0.12 g) | B1 (0.002 g) | CL-1/CL-4 (0.08 g/0.04 g) | D1 (0.012 g) | W-1 (0.001 g) | S2/S1 (5.0 g/4.0 g) |
| N29 | A13 (0.72 g) | z61 (0.12 g) | B1 (0.002 g) | CL-1/CL-4 (0.08 g/0.04 g) | D1 (0.012 g) | W-1 (0.001 g) | S2/S1 (5.0 g/4.0 g) |
| N30 | A14 (0.72 g) | z61 (0.12 g) | B1 (0.002 g) | CL-1/CL-4 (0.08 g/0.04 g) | D1 (0.012 g) | W-1 (0.001 g) | S2/S1 (5.0 g/4.0 g) |
| N31 | A15 (0.72 g) | z61 (0.12 g) | B1 (0.002 g) | CL-1/CL-4 (0.08 g/0.04 g) | D1 (0.012 g) | W-1 (0.001 g) | S2/S1 (5.0 g/4.0 g) |
| N32 | A16 (0.72 g) | z61 (0.12 g) | B1 (0.002 g) | CL-1/CL-4 (0.08 g/0.04 g) | D1 (0.012 g) | W-1 (0.001 g) | S2/S1 (5.0 g/4.0 g) |
| N33 | A17 (0.72 g) | z61 (0.12 g) | B1 (0.002 g) | CL-1/CL-4 (0.08 g/0.04 g) | D1 (0.012 g) | W-1 (0.001 g) | S2/S1 (5.0 g/4.0 g) |
| N34 | A18 (0.72 g) | z61 (0.12 g) | B1 (0.002 g) | CL-1/CL-4 (0.08 g/0.04 g) | D1 (0.012 g) | W-1 (0.001 g) | S2/S1 (5.0 g/4.0 g) |

TABLA 2-continued

| | | | | | | |
|---|---|---|---|---|---|---|
| N35 | A11 (0.72 g) | z61 (0.12 g) | B1 (0.002 g) | CL-1 (0.12 g) | D1 (0.012 g) | None | S2/S1 (5.0 g/4.0 g) |
| N36 | A14 (0.72 g) | z61 (0.12 g) | B1 (0.002 g) | CL-1 (0.12 g) | D1 (0.012 g) | W-1 (0.001 g) | S2/S1 (5.0 g/4.0 g) |
| N37 | A12 (0.84 g) | z61 (0.12 g) | B1 (0.002 g) | None | D1 (0.012 g) | W-1 (0.001 g) | S2/S1 (5.0 g/4.0 g) |
| N38 | A13 (0.84 g) | z61 (0.12 g) | B1 (0.002 g) | None | D1 (0.012 g) | W-1 (0.001 g) | S2/S1 (5.0 g/4.0 g) |
| N39 | A14 (0.84 g) | z61 (0.12 g) | B1 (0.002 g) | None | D1 (0.012 g) | W-1 (0.001 g) | S2/S1 (5.0 g/4.0 g) |
| N40 | A16 (0.84 g) | z61 (0.12 g) | B1 (0.002 g) | None | D1 (0.012 g) | None | S2/S1 (5.0 g/4.0 g) |
| N41 | A19 (0.84 g) | z61 (0.12 g) | B1 (0.002 g) | None | D1 (0.012 g) | None | S2/S1 (5.0 g/4.0 g) |

| Comp. composition | Polymer compd. | Acid generator | Basic compd. | Crosslinking agent | Organic carboxylic acid | Surfactant | Solvent |
|---|---|---|---|---|---|---|---|
| N' 1 | R1 (0.72 g) | z48 (0.12 g) | B2 (0.002 g) | CL-3 (0.12 g) | D1 (0.012 g) | W-1 (0.001 g) | S2/S1 (5.0 g/4.0 g) |
| N' 2 | R2 (0.72 g) | z48 (0.12 g) | B2 (0.002 g) | CL-3 (0.12 g) | D1 (0.012 g) | W-1 (0.001 g) | S2/S1 (5.0 g/4.0 g) |
| N' 3 | R3 (0.72 g) | z48 (0.12 g) | B2 (0.002 g) | CL-3 (0.12 g) | D1 (0.012 g) | W-1 (0.001 g) | S2/S1 (5.0 g/4.0 g) |
| N' 4 | R4 (0.72 g) | z48 (0.12 g) | B2 (0.002 g) | CL-3 (0.12 g) | D1 (0.012 g) | W-1 (0.001 g) | S2/S1 (5.0 g/4.0 g) |
| N' 5 | R5 (0.84 g) | z48 (0.12 g) | B2 (0.002 g) | None | D1 (0.012 g) | W-1 (0.001 g) | S2/S1 (5.0 g/4.0 g) |

The designations appearing in Table 2 above (except for compounds (A)) are as follows.

[Acid Generator (Compound B)]

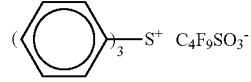

113 Å$^3$ (z2)

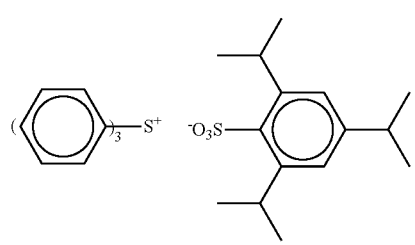

303 Å$^3$ (z5)

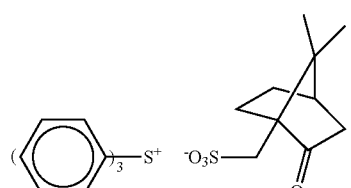

216 Å$^3$ (z8)

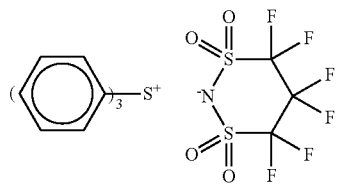

136 Å$^3$ (z37)

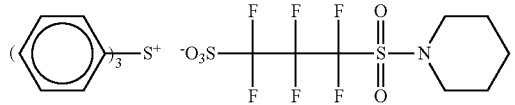

244 Å$^3$ (x42)

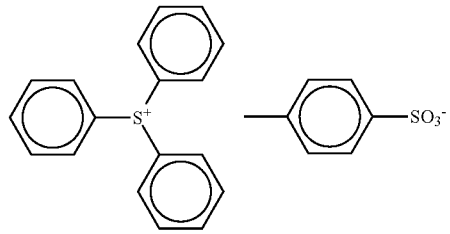

186 Å$^3$ (z48)

(z49)
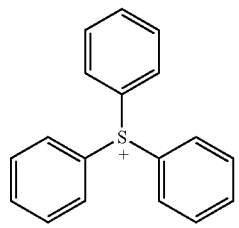
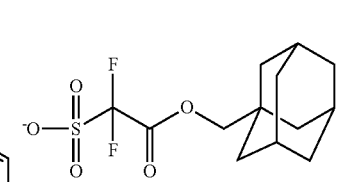
271 Å³
(z61)
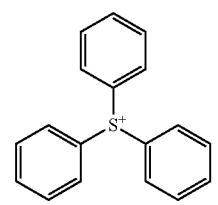
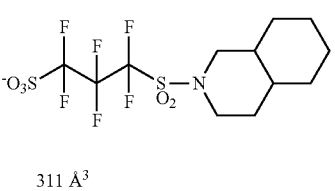
311 Å³
(z63)
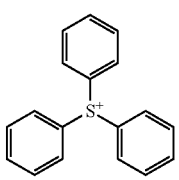
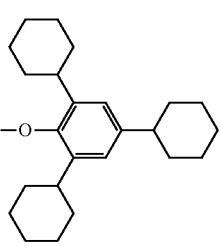
535 Å³
(z65)
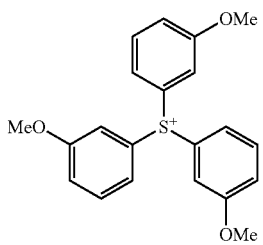
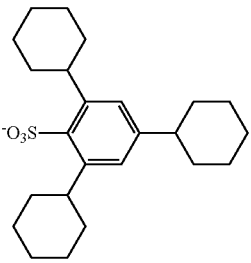
437 Å³
(z66)
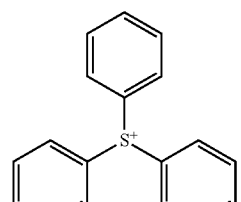
127 Å³
(z67)
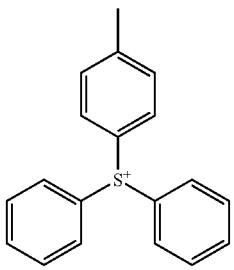
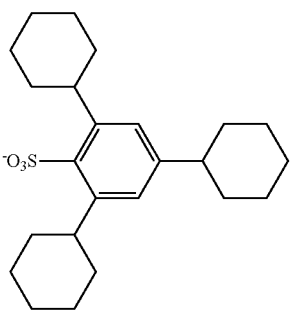
437 Å³
(z68)
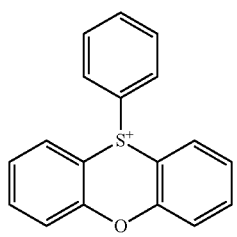
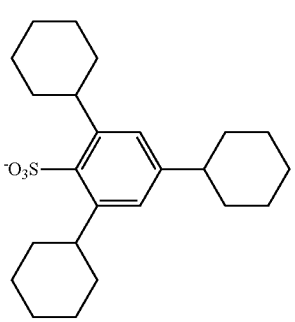
437 Å³
[Crosslinking Agent (Compound (C))]
CL-1
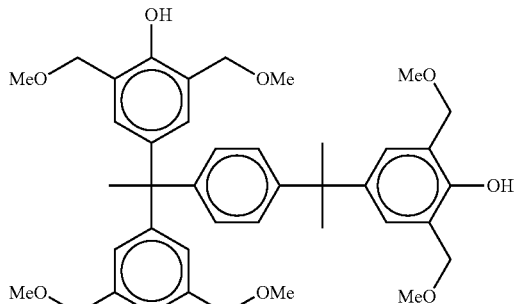
CL-2
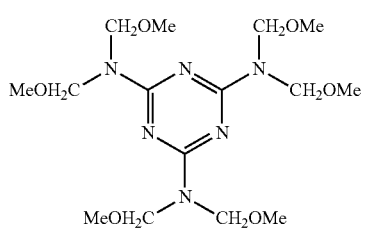

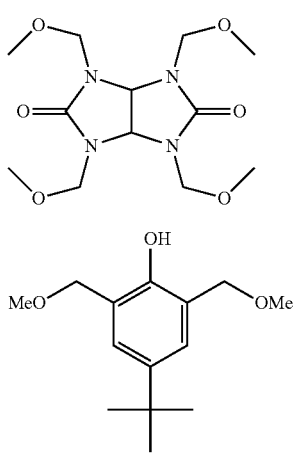

[Basic Compound]
B1: tetrabutylammonium hydroxide,
B2: tri(n-octyl)amine, and
B3: 2,4,5-triphenylimidazole.

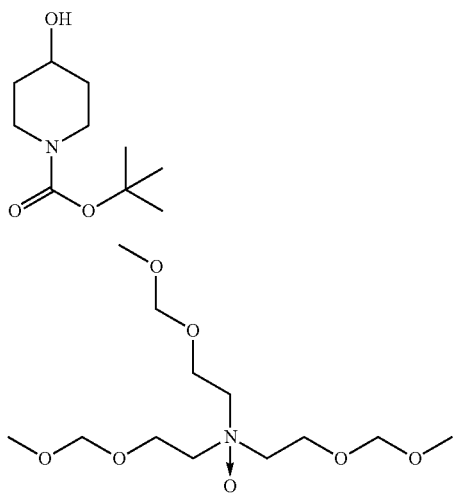

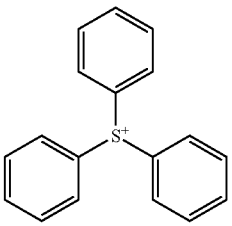

CL-3

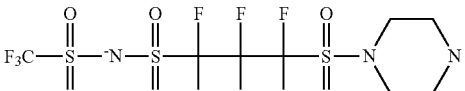

CL-4

[Organic Carboxylic Acid]
D1: 2-hydroxy-3-naphthoic acid,
D2: 2-naphthoic acid, and
D3: benzoic acid.

[Surfactant]
W-1: PF6320 (produced by OMNOVA SOLUTIONS, INC.),
W-2: Megafac F176 (produced by DIC Corporation, fluorinated), and
W-3: polysiloxane polymer KP-341 (produced by Shin-Etsu Chemical Co., Ltd., siliconized).

[Solvent]
S1: propylene glycol monomethyl ether acetate (1-methoxy-2-acetoxypropane),
S2: propylene glycol monomethyl ether (1-methoxy-2-propanol),
S3: 2-heptanone,
S4: ethyl lactate,
S5: cyclohexanone,
S6: γ-butyrolactone, and
S7: propylene carbonate.

The evaluation results are listed in Table 3.

TABLE 3

(EB exposure; negative; alkali development)

| Ex. | Composition | Sensitivity ($\mu C/cm^2$) | LS resolving power (nm) | IS resolving power (nm) | Pattern shape | Scum | LER (nm) | Dry etching resistance |
|---|---|---|---|---|---|---|---|---|
| 1A | N1 | 9.2 | 40 | 40 | Rectangle | B | 4.5 | Very good |
| 2A | N2 | 9.1 | 45 | 45 | Rectangle | B | 4.5 | Very good |
| 3A | N3 | 9.3 | 40 | 40 | Rectangle | B | 4.5 | Very good |
| 4A | N4 | 9.2 | 45 | 45 | Rectangle | B | 4.5 | Very good |
| 5A | N5 | 9.2 | 45 | 45 | Rectangle | B | 4.5 | Very good |
| 6A | N6 | 9.2 | 40 | 40 | Rectangle | B | 4.5 | Very good |
| 7A | N7 | 10.4 | 45 | 45 | Rectangle | B | 4.5 | Very good |
| 8A | N8 | 9.2 | 40 | 40 | Rectangle | B | 4.5 | Very good |
| 9A | N9 | 9.2 | 40 | 40 | Rectangle | A | 4.5 | Very good |
| 10A | N10 | 9.2 | 45 | 45 | Rectangle | A | 4.5 | Very good |
| 11A | N11 | 9.2 | 40 | 40 | Rectangle | A | 4.5 | Very good |
| 12A | N12 | 9.1 | 45 | 45 | Rectangle | A | 4.5 | Very good |
| 13A | N13 | 9.3 | 45 | 50 | Rectangle | A | 4.5 | Very good |
| 14A | N14 | 9.2 | 45 | 50 | Rectangle | A | 4.5 | Very good |

TABLE 3-continued (EB exposure; negative; alkali development)

| Ex. | Composition | Sensitivity ($\mu C/cm^2$) | LS resolving power (nm) | IS resolving power (nm) | Pattern shape | Scum | LER (nm) | Dry etching resistance |
|---|---|---|---|---|---|---|---|---|
| 15A | N15 | 10.4 | 45 | 45 | Rectangle | A | 5 | Very good |
| 16A | N16 | 9.2 | 45 | 50 | Rectangle | A | 5 | Very good |
| 17A | N17 | 9.1 | 45 | 45 | Slightly inverted taper | B | 5 | Very good |
| 18A | N18 | 11.6 | 45 | 45 | Slightly inverted taper | B | 4.5 | Very good |
| 19A | N19 | 9.1 | 45 | 50 | Rectangle | B | 5 | Very good |
| 20A | N20 | 9.3 | 45 | 50 | Rectangle | B | 4.5 | Very good |
| 21A | N21 | 9.2 | 45 | 45 | Rectangle | B | 4.5 | Very good |
| 22A | N22 | 9.2 | 45 | 45 | Rectangle | B | 4.5 | Very good |
| 23A | N23 | 9.2 | 45 | 45 | Rectangle | B | 4.5 | Very good |
| 24A | N24 | 9.2 | 45 | 45 | Rectangle | B | 4.5 | Very good |
| 25A | N25 | 11.6 | 45 | 45 | Rectangle | B | 4.5 | Very good |
| 26A | N26 | 11.7 | 45 | 45 | Rectangle | B | 4.5 | Very good |
| 27A | N27 | 8.5 | 35 | 35 | Rectangle | B | 4.5 | Very good |
| 28A | N28 | 8.6 | 35 | 35 | Rectangle | B | 4.5 | Very good |
| 29A | N29 | 8.5 | 35 | 35 | Rectangle | B | 4.5 | Very good |
| 30A | N30 | 9.6 | 40 | 40 | Rectangle | B | 4.5 | Very good |
| 31A | N31 | 8.5 | 35 | 35 | Rectangle | B | 4.5 | Very good |
| 32A | N32 | 9.5 | 35 | 35 | Rectangle | B | 4.5 | Very good |
| 33A | N33 | 10.5 | 40 | 40 | Rectangle | B | 4.5 | Very good |
| 34A | N34 | 9.5 | 40 | 40 | Rectangle | B | 4.5 | Very good |
| 35A | N35 | 8.6 | 35 | 35 | Rectangle | B | 4.5 | Very good |
| 36A | N36 | 9.6 | 40 | 40 | Rectangle | B | 4.5 | Very good |
| 37A | N37 | 8.6 | 35 | 35 | Rectangle | A | 4.5 | Very good |
| 38A | N38 | 8.6 | 35 | 35 | Rectangle | A | 4.5 | Very good |
| 39A | N39 | 9.6 | 40 | 40 | Rectangle | A | 4.5 | Very good |
| 40A | N40 | 8.6 | 35 | 35 | Rectangle | A | 4.5 | Very good |
| 41A | N41 | 8.6 | 35 | 35 | Rectangle | A | 4.5 | Very good |
| Comp. Ex 1A | N'1 | 13.7 | 55 | 60 | Slightly inverted taper | B | 5.5 | Poor |
| Comp. Ex 2A | N'2 | 13.6 | 55 | 60 | Slightly inverted taper | B | 5.5 | Good |
| Comp. Ex 3A | N'3 | 13.6 | 55 | 60 | Slightly inverted taper | B | 5.5 | Poor |
| Comp. Ex 4A | N'4 | 13.6 | 55 | 60 | Slightly inverted taper | B | 5.5 | Poor |
| Comp. Ex 5A | N'5 | 12.6 | 50 | 50 | Slightly inverted taper | B | 5.5 | Good |

It is apparent from the results of Table 3 that the patterns formed from the compositions of the present invention excel in the sensitivity, resolving power, pattern shape, line edge roughness (LER) and dry etching resistance.

Examples 1B to 12B and Comparative Examples 1B and 2B

Exposed to EUV Light; Negative Type; Developed with Alkali (Preparation of Resist Solution)

The negative resist compositions indicated in Table 4 below were each passed through a polytetrafluoroethylene filter of 0.04 μm pore size, thereby obtaining negative resist solutions.

(Evaluation of Resist)

Each of the prepared negative resist solutions was uniformly applied onto a silicon substrate having undergone a hexamethyldisilazane treatment by means of a spin coater, and dried by heating on a hot plate at 100° C. for 60 seconds, thereby obtaining a 0.05 μm-thick resist film.

The obtained resist films were evaluated by the following methods with respect to the sensitivity, resolving power, pattern shape, line edge roughness (LER), scum and dry etching resistance.

[Sensitivity]

Each of the obtained resist films was exposed through a reflection mask of 100 nm line width 1:1 line and space pattern to EUV light (wavelength 13 nm) while changing the exposure amount by 0.1 mJ/cm² at a time within the range of 0 to 20.0 mJ/cm². The exposed film was baked at 110° C. for 90 seconds. Thereafter, the baked film was developed with a 2.38 mass % aqueous tetramethylammonium hydroxide (TMAH) solution.

The sensitivity was defined as the exposure amount in which a line and space (L/S=1/1) mask pattern of 100 nm line width was reproduced. The smaller the value of this exposure amount, the higher the sensitivity.

[Resolving Power (LS)]

The LS resolving power (nm) was defined as the limiting resolving power (minimum line width permitting the separation and resolution of a line and a space (line:space=1:1)) in the exposure amount exhibiting the above sensitivity.

[Pattern Shape]

The shape of cross section of each line pattern of 100 nm line width (L/S=1:1) in the exposure amount exhibiting the above sensitivity was observed by means of a scanning electron microscope (model S-4300, manufactured by Hitachi, Ltd.). The shape of cross section of each line pattern when the ratio of [line width of line pattern at top portion (surface portion)/line width of line pattern at middle portion (position at half of the height of the line pattern)] was 1.5 or greater was graded into "inverted taper"; that when the ratio was in the range of 1.2 to less than 1.5 was graded into "slightly inverted taper"; and that when the ratio was less than 1.2 was graded into "rectangle."

[Evaluation of Scum]

A line pattern was formed in the same manner as mentioned above in the [pattern shape]. With respect to the line pattern, a cross-section micrograph was taken using SEM 54800 (manufactured by Hitachi High-Technologies Corporation). The presence of any residue in space portions was checked, and the following evaluation was made.

C: scum was observed, and there was partial inter-pattern bridging.

B: scum was observed, but there was no inter-pattern bridging.

A: no scum was observed at all.

[Dry Etching Resistance]

Dry etching by means of HITACHI U-621 using an Ar/$C_4F_6$/$O_2$ gas (volume ratio 100/4/2 mixed gas) for 15 seconds was performed on each of the resist films formed through an entire-surface exposure in the exposure amount exhibiting the above sensitivity. Thereafter, the ratio of remaining resist film was measured as an index of the dry etching resistance.

Very good: remaining film ratio 95% or more,
good: 90% to less than 95%, and
poor: less than 90%.

[Line Edge Roughness (LER)]

A line pattern of 100 nm line width (L/S=1/1) was formed in the exposure amount exhibiting the above sensitivity. At arbitrary 30 points within 50 μm in the longitudinal direction of the line pattern, the distance between actual edge and a reference line on which edges were to be present was measured by means of a scanning electron microscope (model S-9220, manufactured by Hitachi, Ltd.). The standard deviation of measured distances was determined, and 3σ was computed therefrom. The smaller the value thereof, the more favorable the performance exhibited.

The evaluation results are listed in Table 4.

It is apparent from the results of Table 4 that the compositions of the present invention excel in the sensitivity, LS resolving power, pattern shape, scum, line edge roughness (LER) and dry etching resistance.

What is claimed is:

1. An actinic-ray- or radiation-sensitive resin composition comprising a compound (A) that contains a structure (P) containing at least one phenolic hydroxyl group and a structure (Q) containing at least one phenolic hydroxyl group whose hydrogen atom is replaced by a group (S) with a cyclic structure containing an acid crosslinking group, characterized in that the composition is to be exposed to electron beams or extreme ultraviolet and used to form a negative pattern, and in that the group (S) with a cyclic structure containing an acid crosslinking group is a group with a polycyclic structure or a group with a cyclic structure containing a hydroxymethyl group and/or an alkoxymethyl group.

2. The composition according to claim 1, characterized in that the cyclic structure containing an acid crosslinking group introduced in the group (S) is a cyclic structure containing a hydroxymethyl group and/or an alkoxymethyl group, expressed by general formula (0) below,

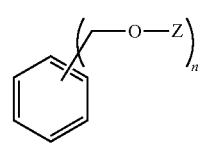

(0)

wherein n is an integer of 1 or greater, and Z represents a hydrogen atom or an alkyl group, provided that when n is 2 or greater, two or more Z's may be identical to or different from each other.

3. The composition according to claim 1, characterized in that the compound (A) is a polymeric compound containing any of repeating units (Q) of general formula (1) below as the structure (Q),

TABLE 4

| | | | | | | | |
|---|---|---|---|---|---|---|---|
| | | (EUV exposure; negative; alkali development) | | | | | |
| Ex. | Composition | Sensitivity (mJ/cm$^2$) | LS resolving power | Scum | Pattern shape | LER (nm) | Dry etching resistance |
| 1B | N1 | 12.5 | 40 | B | Rectangle | 4.5 | Very good |
| 2B | N2 | 12.6 | 45 | B | Rectangle | 4.5 | Very good |
| 3B | N3 | 12.3 | 40 | A | Rectangle | 4.5 | Very good |
| 4B | N7 | 15.5 | 45 | B | Rectangle | 4.5 | Very good |
| 5B | N9 | 13.5 | 40 | A | Rectangle | 4.5 | Very good |
| 6B | N11 | 13.5 | 40 | A | Rectangle | 4.5 | Very good |
| 7B | N15 | 15.4 | 45 | B | Rectangle | 4.5 | Very good |
| 8B | N28 | 11.5 | 35 | B | Rectangle | 4.5 | Very good |
| 9B | N37 | 11.5 | 35 | A | Rectangle | 4.5 | Very good |
| 10B | N38 | 11.5 | 35 | A | Rectangle | 4.5 | Very good |
| 11B | N39 | 12.5 | 40 | A | Rectangle | 4.5 | Very good |
| 12B | N40 | 12.5 | 35 | A | Rectangle | 4.5 | Very good |
| Comp. Ex. 1B | N' 1 | 15.8 | 55 | B | Slightly inverted taper | 5.5 | Poor |
| Comp. Ex. 2B | N' 2 | 15.8 | 55 | B | Slightly inverted taper | 5.5 | Good |

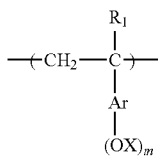

(1)

in which
R$_1$ represents a hydrogen atom or a methyl group;
X represents a group with a polycyclic structure containing an acid crosslinking group, or a group with a cyclic structure containing a hydroxymethyl group and/or an alkoxymethyl group;
Ar represents an aromatic ring; and
m is an integer of 1 to 5, provided that when m is 2 or greater, two or more X's may be identical to or different from each other.

4. The composition according to claim 3, characterized in that the repeating units (Q) of general formula (1) are repeating units of general formula (2) below, and the structure (P) is any of repeating units (P) of general formula (I) below,

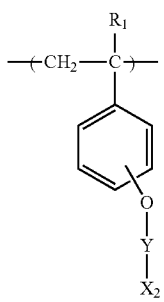

(2)

in which
R$_1$ represents a hydrogen atom or a methyl group;
Y represents a single bond or a bivalent connecting group; and
X$_2$ represents a group with a polycyclic structure containing an acid crosslinking group, or a group with a cyclic structure containing a hydroxymethyl group and/or an alkoxymethyl group,

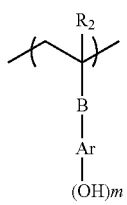

(I)

in which
R$_2$ represents a hydrogen atom, an optionally substituted methyl group or a halogen atom;
B represents a single bond or a bivalent organic group;
Ar represents an aromatic ring group; and
m is an integer of 1 or greater.

5. The composition according to claim 4, characterized in that in general formula (2), Y is a carbonyl group or an alkylene group.

6. The composition according to claim 3, characterized in that repeating units (Q) of general formula (1) are repeating units of general formula (3) below, and the structure (P) is any of repeating units (P) of general formula (I) below,

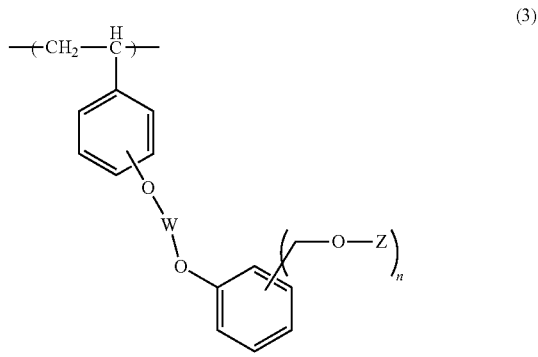

(3)

wherein n is an integer of 1 or greater, Z represents a hydrogen atom or an alkyl group provided that when n is 2 or greater, two or more Z's may be identical to or different from each other, and W represents a bivalent connecting group,

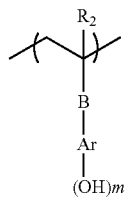

(I)

in which
R$_2$ represents a hydrogen atom, an optionally substituted methyl group or a halogen atom;
B represents a single bond or a bivalent organic group;
Ar represents an aromatic ring group; and
m is an integer of 1 or greater.

7. The composition according to claim 3, characterized in that the polymeric compound (A) exhibits a polydispersity index of 1.0 to 1.20.

8. The composition according to claim 1, further comprising a compound (B) that when exposed to actinic rays or radiation, generates an acid.

9. The composition according to claim 8, characterized in that the compound (B) is an onium compound.

10. The composition according to claim 8, characterized in that the acid generated by the compound (B) upon exposure to actinic rays or radiation has a volume of 130 Å$^3$ or greater.

11. The composition according to claim 1, further comprising a compound (C) containing a total of two or more hydroxymethyl groups and/or alkoxymethyl groups in its molecule.

12. An actinic-ray- or radiation-sensitive film formed from the composition according to claim 1.

13. A mask blank comprising the actinic-ray- or radiation-sensitive film according to claim 12.

14. A method of forming a resist pattern, comprising exposing the actinic-ray- or radiation-sensitive film according to claim 12 to electron beams or extreme ultraviolet and developing the exposed film.

15. A method of forming a resist pattern, comprising exposing the mask blank comprising an actinic-ray- or radiation-sensitive film according to claim 13 to electron beams or extreme ultraviolet and developing the exposed mask blank.

16. The composition according to claim 1, wherein the compound (A) is a polymeric compound containing any of repeating units (Q) of general formula (2) below as the structure (Q),

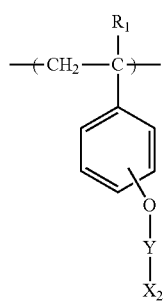

(2)

in which $R_1$ represents a hydrogen atom or a methyl group;

Y represents an alkylene group, a sulfonyl group, —CONH— or —CSNH—; and $X_2$ represents a group with a polycyclic structure containing an acid crosslinking group, or a group with a cyclic structure containing a hydroxymethyl group and/or an alkoxymethyl group.

17. The composition according to claim 16, wherein in general formula (2), Y is an alkylene group.

18. The composition according to claim 16, wherein the structure (P) is any of repeating units (P) of general formula (I) below,

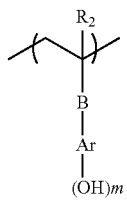

(I)

in which $R_2$ represents a hydrogen atom, an optionally substituted methyl group or a halogen atom;

B represents a single bond or a bivalent organic group;

Ar represents an aromatic ring group; and m is an integer of 1 or greater.

19. The composition according to claim 1, wherein the group (S) with a cyclic structure containing an acid crosslinking group is a group with a cyclic structure containing a hydroxymethyl group and/or an alkoxymethyl group.

20. The composition according to claim 1, further comprising a crosslinking agent containing 3 to 5 benzene rings in its molecule.

21. The composition according to claim 20, wherein the molecular weight of the crosslinking agent is 1200 or less.

22. The composition according to claim 1, further comprising a crosslinking agent containing two or more hydroxymethyl groups or alkoxymethyl groups in its molecule.

23. The composition according to claim 1, wherein the group with a polycyclic structure as the group (S) with a cyclic structure containing an acid crosslinking group is a group with a polycyclic structure containing at least one acid crosslinking group selected from the group consisting of an oxirane group, an oxetane group, a thioxirane group, and a thioxetane group.

* * * * *